(12) United States Patent
Schaumont et al.

(10) Patent No.: US 7,006,960 B2
(45) Date of Patent: Feb. 28, 2006

(54) DESIGN APPARATUS AND A METHOD FOR GENERATING AN IMPLEMENTABLE DESCRIPTION OF A DIGITAL SYSTEM

(75) Inventors: Patrick Schaumont, Wijgmaal (BE); Serge Vernalde, Heverlee (BE); Johan Cockx, Pellenberg (BE)

(73) Assignee: Interuniversitair Micro-Elektronica Centrum (IMEC VZW), Leuven (BE)

( * ) Notice: Subject to any disclaimer, the term of this patent is extended or adjusted under 35 U.S.C. 154(b) by 730 days.

(21) Appl. No.: 09/873,553

(22) Filed: Jun. 4, 2001

(65) Prior Publication Data
US 2003/0216901 A1 Nov. 20, 2003

Related U.S. Application Data

(63) Continuation of application No. 09/237,549, filed on Jan. 26, 1999, now Pat. No. 6,606,588, which is a continuation of application No. 09/041,985, filed on Mar. 13, 1998, now Pat. No. 6,233,540.

(60) Provisional application No. 60/039,078, filed on Mar. 14, 1997, provisional application No. 60/039,079, filed on Mar. 14, 1997, and provisional application No. 60/041,121, filed on Mar. 20, 1997.

(51) Int. Cl.
G06F 17/50 (2006.01)

(52) U.S. Cl. .................... 703/15; 716/5; 716/7; 716/18; 717/108

(58) Field of Classification Search .............. 703/13–15, 703/20, 23, 27; 716/3, 5–8, 11, 12, 18; 717/104, 717/108, 114, 116
See application file for complete search history.

(56) References Cited

U.S. PATENT DOCUMENTS

| | | | |
|---|---|---|---|
| 5,493,508 A | 2/1996 | Dangelo et al. | 716/5 |
| 5,544,067 A | 8/1996 | Rostoker et al. | 703/14 |
| 5,623,418 A | 4/1997 | Rostoker et al. | 716/1 |
| 5,726,902 A | 3/1998 | Mahmood et al. | 716/6 |
| 5,870,585 A | 2/1999 | Stapleton | 703/15 |
| 5,923,867 A | 7/1999 | Hand | 703/14 |
| 5,933,356 A | 8/1999 | Rostoker et al. | 703/15 |
| 6,064,819 A | 5/2000 | Franssen et al. | 717/156 |
| 6,233,540 B1 | 5/2001 | Schaumont et al. | 703/14 |
| 6,324,678 B1 | 11/2001 | Dangelo et al. | 716/18 |
| 6,606,588 B1 | 8/2003 | Schaumont et al. | 703/15 |

FOREIGN PATENT DOCUMENTS

| | | |
|---|---|---|
| EP | 0445942 A1 | 2/1991 |
| EP | 0772140 A1 | 7/1997 |

OTHER PUBLICATIONS

Altmeyer, et al., "Generating ECAD Framework Code from Abstract Models", Proc. Of the 32$^{nd}$ ACM/IEEE Conf. On Design Automation, Jun. 1995, pp. 88–93.

(Continued)

*Primary Examiner*—Russell Frejd
(74) *Attorney, Agent, or Firm*—Knobbe, Martens, Olson & Bear, LLP

(57) ABSTRACT

The present invention is a design apparatus compiled on a computer environment for generating from a behavioral description of a system comprising at least one digital system part, an implementable description for said system, said behavioral description being represented on said computer environment as a first set of objects with a first set of relations therebetween, said implementable description being represented on said computer environment as a second set of objects with a second set of relations therebetween, said first and second set of objects being part of a design environment.

52 Claims, 25 Drawing Sheets

OTHER PUBLICATIONS

Figure 1A:
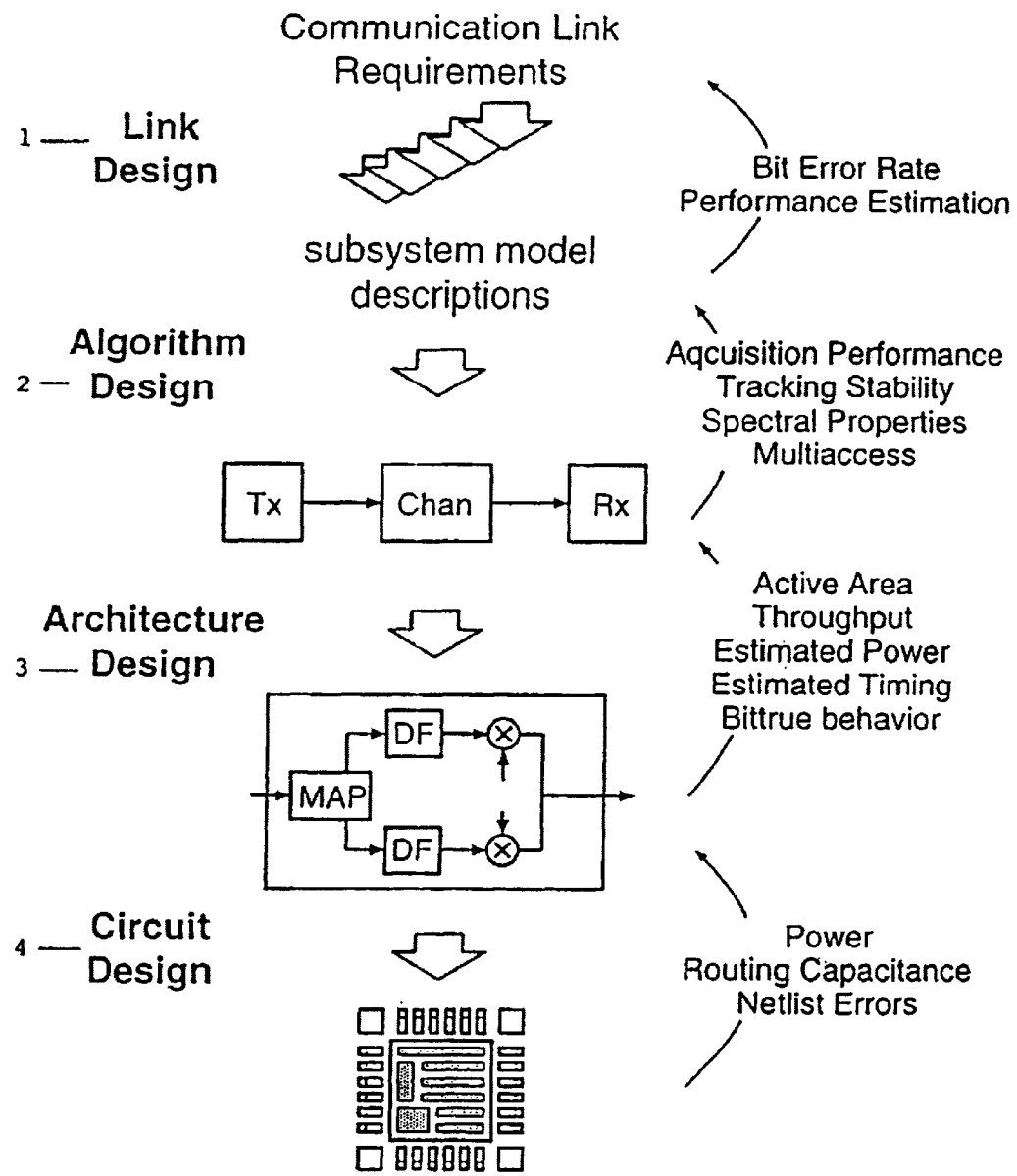

Basu, A., et al., "Doors: An Object–Oriented CAD System for High Level Synthesis", IEE Proceedings—Computers and Digital Techniques, vol. 144, Issue 5, pp. 331–342, Sep. 1997.

Bill Lin, "System Design Tools for Broadband Telecom Network Applications" XP–002114729, 1996, pp. 23–26.

Bolsons, et al., "Hardware/Software Co–Design of Digital Telecommunications System", Proceedings of the IEEE, vol. 85, Issue 3, pp. 391–418, Mar. 1997.

Bredenfeld, et al., "Tool Integration and Construction using General Graph–Based Design Representations", Of the $32^{ns}$ ACM/IEEE Conference on Design Automation, Jun. 1995.

Burr, et al., "Operas in a DSP CAD Environment", Proceedings of the European Design Automation Conference, Sep. 1994, pp. 130–135.

Chao, et al., "Efficient Retiming and Unfolding", IEEE Inter. Conf. On Accoustics, Speech and Signal Processing, 1993, vol. 1, pp. 421–424, Apr. 1993.

DeMicheli, G., et al., The Olympus Synthesis System IEEE Design & Test of Computers, vol. 7, Issue 5, pp. 37–53, Oct. 1990.

Forest, John, "Implementation–Independent Description Using an Object–Oriented Approach, in Co–Design–Computer–Aided Software/Hardware Engineering", IEEE Press Marketing, 1995, pp. 263–278.

Gupta, R., et al., "Using a Programming Language for Digital System Design", IEEE Design & Test of Computers, pp. 72–80, Apr.–Jun. 1997.

Hylander, P., et al., Object VLSI Design Automation for Pulse Coded Neural Networks, IEEE International Conference on Neural Networks, vol. 3, pp. 1825–1829, Jul. 1994.

Lanneer, et al., "An Object–Oriented Framework Supporting the full High–Level Synthesis Trajectory" Computer Hardware Description Language and their Applications, XP–002114731, 1991, pp. 301–320.

Lavenier, D., et al., "From Behavioral to RTL Models" An Approach, Proceedings of the Fifth International Workshop on Rapid System Prototyping, pp. 153–161, Jun. 1994.

Moon, et al., "An Object–Oriented VHDL Design Environment", Proc. Of the $27^{th}$ ACM/IEEE Design Automation Conf. Pp. 431–436, Jun. 1990.

Nagasmay, et al., "Specification, Planning and Synthesis in a VHDL Design Environment", IEEE Design & Test of Computers, vol. 9, Issue 2, pp. 56–68, Jun. 1992.

Pangrie, B.M., et al., An Integrated Multi–Levey Synthesis System, First International Workshop on Rapid System Prototyping, pp. 167–175, Jun. 1990.

Poechmuller, et al., "A CAD Tool for Designing Large, Fault–Tolerant VLSI Arrays", Proceedings of the First Great Lakes Symposium on VLSI, 1991, pp. 132–137.

Sarkar, S., et al., "Synchronization of Communicating Modules and Processes in High Level Synthesis", Proc. Of the $8^{th}$ International Conference on VLSI Design, a995, pp. 87–92, Jan. 1995.

Schaumont, et al., "Synthesis of Multi–Rate and Variable Rate Circuits for High Speed Telecommunications Applications" XP–002114732, 1997, pp. 542–546.

Stoel, et al., "VIOOL for Hardware/Software Codesign", Proc. 1995 Inter. Symp. On System Eng. Of Computer Bases Systems, pp. 333–340, Mar. 1995.

Swamy, S., et al., "Object Oriented Extensions to VHDL", Computer vol. 28, No. 10, pp. 18–26, Oct. 1995.

Tanurhan, et al., "An Approach for Integrated Specification and Design of Real–Time Systems", Proceedings of the EURO–VHDL '96 and European Design Automation, Sep. 1996, pp. 258–263.

Van Rompaey, et al., "CoWare–A Design Environment for Heterogeneous Hardware/Software Systems", Proc. EURO–DAC pp. 252–257, Sep. 1996.

Vemuri, et al., "Integrated Multicomponent Synthesis Environment for MCM's", Computer, vol. 26, Issue 4, pp. 62–74, Apr. 1993.

Yang, L., et al., "Object–Oriented Design of an Expandable Hardware Description Language Analyzer for a High Level Synthesis System", Proc. Twenty Fifth Hawaii Inter Conference on System Sciences, vol. 2, Jan. 1992.

York, G., et al., "Integrated Environment for HDL Verification", Proceedings of the IEEE International Verilog HDL Conference, pp. 9–18, Mar. 1995.

Verkest, et al., 1996, pp. 357–386.

Woo, et al., 1994, pp. 42–47.

Yeh, et al., 1994, pp. 130–135.

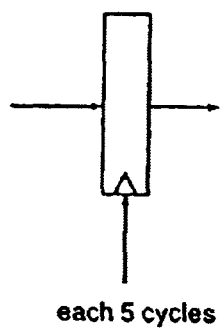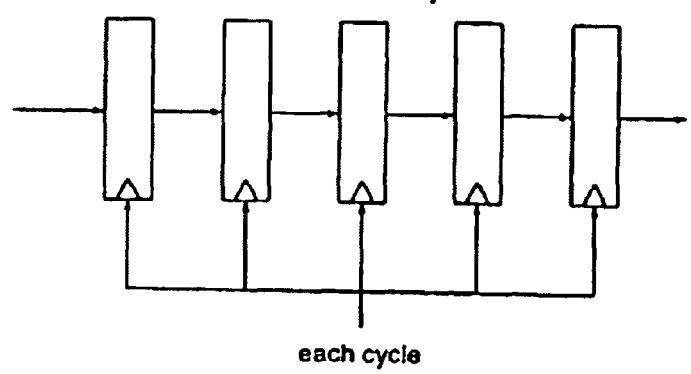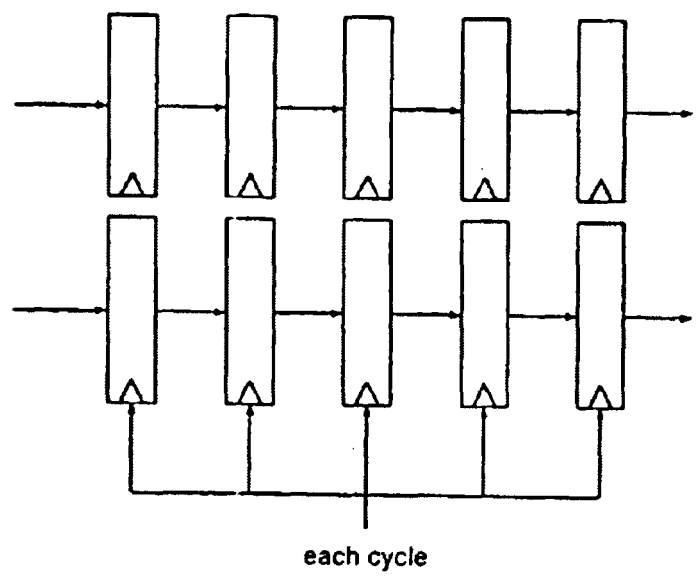
FIG. 9

```
dfix T_sample(8, 6);
dfix T_acc    (8, 6);
dfix T_bit    (1, 0, ns);
double hardwired_coef = { 0.5, 0.2, -0.3, 0.15 };

fsm correlator::define(clk & _ck)
{
  sig_array  coef       (4, ck, T_sample);
  sig_array  sample     (4, ck, T_sample);
  sig        accu       (ck, T_accu  );
  sig        sample_in  (T_sample    );
  sig        coef_in    (T_sample    );
  sig        corr_out   (T_sample    );
  sig        load       (ck, T_bit   );
  sig        load_ctr   (T_bit       );

sfg initialize_coefs;
  for (i = 0; i < 4; i++)
     coef[i] = W(T_sample, hardwired_coef[i] );

sfg load_coef_0;
  input(coef_in);
  coef[0] = in_coef_in;

sfg correl_1;
  accu    = cast(T_acc, coef[0] * sample[0] + coef[1] * sample[1]);

sfg correl_2;
  corr    = accu + cast(T_acc, coef[2] * sample[2] + coef[3] * sample[3] );
  output(corr);

sfg read_sample;
  input(sample_in);
  for (i = 3; i >=0; i--)
     if (i)
        sample[i] = sample[i-1];
     else
        sample[i] = sample_in;

sfg read_control;
  input(load_ctr);
  load = load_ctr;

fsm myfsm;
  initial rst;
  state phase_1;
  state phase_2;
  rst    <<  always    << initialize_coefs      << phase1;
  phase1 <<  always    << read_control
                       << correl_1              << phase2;
  phase2 <<  !cnd(load) << correl_2
                       << read_sample           << phase1;
  phase2 <<  cnd(load) << correl_2
                       << read_sample
                       << load_coef_0           << phase1;
  return myfsm;
}
```

FIG. 11

Sig Class

```
class sig {
  Value value;
  char  *name;
public:
  sig(Value v);
  sig operator +(sig v);
  virtual Value simulate();
  virtual void gen_code(ostream &os);
};

sig sig::operator +(sig v) {
  sigadd s;
  add.left  = &v;
  add.right = this;
  return add;
}

Value sig::simulate() {
  return value;
} sig::gen_code(ostream &os) {
  os << name;
}
```

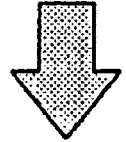

Derived Operator Class

```
class sigadd : public sig {
  sig *left;
  sig *right;
public:
  Value simulate();
   void gen_code(ostream &os);
};

Value sigadd::simulate() {
  return left->eval() +
         right->eval();
} sigadd::gen_code(ostream &os) {
  os << left->cg()
     << " + "
     << right->cg();
}
```

FIG. 16

```
fsm f;
initial s0;
state s1;

s0 << allways    << sfg1 << s1;
s1 << cnd(eof)   << sfg2 << s1;
s1 << !cnd(eof)  << sfg3 << s0;
```

DESIGN APPARATUS AND A METHOD FOR GENERATING AN IMPLEMENTABLE DESCRIPTION OF A DIGITAL SYSTEM

RELATED APPLICATION

This application is a continuation of and claims priority to and incorporates by reference, in its entirety, U.S. application Ser. No. 09/237,549, titled "A DESIGN APPARATUS AND A METHOD FOR GENERATING AN IMPLEMENTABLE DESCRIPTION OF A DIGITAL SYSTEM", filed Jan. 26, 1999, now U.S. Pat. No. 6,606,588, which in turn is a continuation of and claims priority to U.S. application Ser. No. 09/041,985, titled "DESIGN APPARATUS AND A METHOD FOR GENERATING AN IMPLEMENTABLE DESCRIPTION OF A DIGITAL SYSTEM", filed Mar. 13, 1998, now U.S. Pat. No. 6,233,540, which in turn claims priority under 35 U.S.C. § 120, to the following U.S. provisional patent applications: "Design Environment and a Method for Dataflow Support and Refinement of Dataflow for Hardware Design and Hardware/software Co-design," Application No. 60/039,078, and filed on Mar. 14, 1997; "Design Environment and a Method for Generating an Implementable Description of a Digital System," Application No. 60/039,079, and filed on Mar. 14, 1997; "Design Environment and a Method for Generating an Implementable Description of a Digital System," Application No. 60/041,121, and filed on Mar. 20, 1997".

FIELD OF THE INVENTION

The present invention is situated in the field of design of systems. More specifically, the present invention is related to a design apparatus for digital systems, generating implementable descriptions of said systems.

The present invention is also related to a method for generating implementable descriptions of said systems.

STATE OF THE ART

The current need for digital systems forces contemporary system designers with ever increasing design complexities in most applications where dedicated processors and other digital hardware are used, demand for new systems is rising and development time is shortening. As an example, currently there is a high interest in digital communication equipment for public access networks. Examples are modems for Asymmetric Digital Subscriber Loop (ADSL) applications, and up- and downstream Hybrid Fiber-Coax (HFC) communication. These modems are preferably implemented in all-digital hardware using digital signal processing (DSP) techniques. This is because of the complexity of the data processing that they require. Besides this, these systems also need short development cycles. This calls for a design methodology that starts at high level and that provides for design automation as much as possible.

One frequently used modeling description language is VHDL (VHSIC Hardware Description Language), which has been accepted as an IEEE standard since 1987. VHDL is a programming environment that produces a description of a piece of hardware. Additions to standard VHDL can be to implement features of Object Oriented Programming Languages into VHDL. This was described in the paper OO-VHDL (Computer, October 1995, pages 18–26). Another frequently used modeling description language is VERILOG.

A number of commercially available system environments support the design of complex DSP systems.

MATLAB of Mathworks Inc offers the possibility of exploration at the algorithmic level. It uses the data-vector as the basic semantical feature. However, the developed MATLAB description has no relationship to a digital hardware implementation, nor does MATLAB support the synthesis of digital circuits.

SPW of Alta Group offers a toolkit for the simulation of these kind of systems. SPW is typically used to simulate data-flow semantics. Data-flow semantics define explicit algorithmic iteration, whereas data-vector semantics do not. SPW relies on an extensive library and toolkit to develop systems. Unlike MATLAB, the initial description is a block-based description. Each block used in the systems appears in two different formats, (a simulatable and a synthesizable version) which results in possible inconsistency.

COSSAP of Synopsys performs the same kind of system exploration as SPW.

DC and BC are products of Synopsys that support system synthesis. These products do not provide sufficient algorithm exploration functions.

Because all of these tools support only part of the desired functionality, contemporary digital systems are designed typically with a mix of these environments. For example, a designer might do algorithmic exploration in MATLAB, then do architecture definition with SPW, and finally map the architecture definition to an implementation in DC.

AIMS OF THE INVENTION

It is an aim of the present invention to disclose a design apparatus that allows to generate from a behavioral description of a digital system, an implementable description for said system.

It is another aim of the present invention to disclose a the design apparatus that allows for design, digital systems starting from a data vector or data flow description and generating an implementable level such as VHDL. A further aim is to perform such design tasks within one object oriented environment.

Another aim is to provide a means comprised in said design apparatus for simulating the behavior of the system at any level of the design stage or trajectory.

SUMMARY OF THE INVENTION

A first aspect of the present invention concerns a design apparatus compiled on a computer environment for generating from a behavioral description of a system comprising at least one digital system part, an implementable description for said system, said behavioral description being represented on said computer environment as a first set of objects with a first set of relations therebetween, said implementable description being represented on said computer environment as a second set of objects with a second set of relations therebetween, said first and second set of objects being part of a design environment.

A behavioral description is a description which substantiates the desired behavior of a system in a formal way. In general, a behavioral description is not readily implementable since it is a high-level description, and it only describes an abstract version of the system that can be simulated. An implementable description is a more concrete description that is, in contrast to a behavioral description, detailed enough to be implemented in software to provide an approximative simulation of real-life behavior or in hardware to provide a working semiconductor circuit.

With design environment is meant an environment in which algorithms can be produced and run by interpretion or compilation.

With objects is meant a data structure which shows all the characteristics of an object from an object oriented programming language, such as described in "Object Oriented Design" (G. Booch, Benjamin/Cummings Publishing, Redwood City, Calif., 1991).

Said first and second set of objects are preferably part of a single design environment.

Said design environment comprises preferably an Object Oriented Programming Language (OOPL). Said OOPL can be C++.

Said design environment is preferably an open environment wherein new objects can be created. A closed environment will not provide the flexibility that can be obtained with an open environment and will limit the possibilities of the user.

Preferably, at least part of the input signals and output signals of said first set of objects are at least part of the input signals and output signals of said second set of objects. Essentially all of the input signals and output signals of said first set of objects can be essentially all of the input signals and output signals of said second set of objects.

At least part of the input signals and output signals of said behavioral description are preferably at least part of the input signals and output signals of said implementable description. Essentially all of the input signals and output signals of said behavioral description can be essentially all of the input signals and output signals of said implementable description.

Said first set of objects has preferably first semantics and said second set of objects has preferably second semantics. With semantics is meant the model of computation. Said first semantics is preferably a data-vector model and/or a dataflow model. Said second semantics is preferably a Finite State Machine Data Path (FSMD) data structure, comprising a control part and a data processing part, the data processing part being modeled by a signal flow graph (SFG) data structure and the control part being modeled by a FSM data structure. The terms FSMD and SFr are used interchangeably throughout the text.

Preferably, the impact in said implementable description of at least a part of the objects of said second set of objects is essentially the same as the impact in said behavioral description of at least a part of the objects of said first set of objects.

Preferably, the impact in said implementable description of essentially all of the objects of said second set of objects is essentially the same as the impact in said behavioral description of essentially all of the objects of said first set of objects.

With impact is meant not only the function, but also the way the object interacts with its environment from an external point of view. A way of rephrasing this is that the same interface for providing input and collecting output is present. This does not mean that the actual implementation of the data-processing between input and output is the same. The implementation is embodied by objects, which can be completely different but perform a same function. In an OOPL, the use of methods of an object without knowing its actual implementation is referred to as information hiding.

The design apparatus preferably further comprises means for simulating the behavior of said system said means simulating the behavior of said behavioral description, said implementable description or any intermediate description therebetween. Said intermediate description can be obtained after one or several refining steps from said behavioral description.

Preferably, at least part of said second set of objects is derived from objects belonging to said first set of objects. This can be done by using the inheritance functionalities provided in an OOPL. Essentially all of said second set of objects can be derived from objects belonging to said first set of objects.

Said implementable description can be at least partly obtained by refining said behavioral description. Said implementable description can be essentially obtained by refining said behavioral description. Preferably, said refining comprises the refining of objects.

The design apparatus can further comprise means to derive said first set of objects from a vector description, preferably a MATLAB description, describing said system as a set of operations on data vectors, means for simulating statically or demand-driven scheduled dataflow on said dataflow description and/or means for clock-cycle true simulating said digital system using said dataflow description and/or one or more of said SFG data structures.

In a preferred embodiment, said implementable description is an architecture description of said system, said system advantageously further comprising means for translating said architecture description into a synthesizable description of said system, said synthesizable description being directly implementable in hardware. Said synthesizable description is preferably a netlist of hardware building blocks. Said hardware is preferably a semiconductor chip or a electronic circuit comprising semiconductor chips.

A synthesizable description is a description of the architecture of a semiconductor that can be synthesized without further processing of the description. An example is a VHDL description.

Said means for translating said architecture description into a synthesizable description can be Cathedral-3 or Synopsys DC.

A second aspect of the present invention is a method for designing a system comprising at least one digital part, comprising a refining step wherein a behavioral description of said system is transformed into an implementable description of said system, said behavioral description being represented as a first set of objects with a first set of relations therebetween and said implementable description being represented as a second set of objects with a second set of relations therebetween.

Said refining step preferably comprises translating behavioral characteristics at least partly into structural characteristics. Said refining step can comprise translating behavioral characteristics completely into structural characteristics.

Said method can further comprise a simulation step in which the behavior of said behavioral description, said implementable description and/or any intermediate description therebetween is simulated.

Said refining step can comprises the addition of new objects, permitting interaction with existing objects, and adjustments to said existing objects allowing said interaction.

Preferably, said refining step is performed in an open environment and comprises expansion of existing objects. Expansion of existing objects can include the addition to an object of methods that create new objects. Said object is said to be expanded with the new objects. The use of expandable objects allows to use meta-code generation: creating expandable objects implies an indirect creation of the new objects.

Said behavioral description and said implementable description are preferably represented in a single design environment, said single design environment advantageously being an Object Oriented Programming Language, preferably C++.

Preferably, said first set of objects has first semantics and said second set of objects has second semantics. Said first semantics is preferably a data-vector model and/or a data-flow model. Said second semantics is preferably an SFG data structure.

The refining step comprises preferably a first refining step wherein said behavioral description being a data-vector model is at least partly transformed into a data-flow model. Advantageously, said data-flow model is an untimed floating point data-flow model.

Said refining step preferably further comprises a second refining step wherein said data-flow model is at least partly transformed into an SFG model. Said data-flow model can be completely transformed into an SFG model.

In a preferred embodiment, said first refining step comprises the steps of determining the input vector lengths of input, output and intermediate signals, determining the amount of parallelism of operations that process input signals under the form of a vector to output signals, determination of objects, connections between objects and signals between objects of said data-flow model, and determining the wordlength of said signals between objects. In the sequel of this application, the term "actors" is also used to denote objects. Connections between objects are denoted as "edges" and signals between objects are denoted as "tokens". Said step of determining the amount of parallelism can preferably comprise determining the amount of parallelism for every data vector and reducing the unspecified communication bandwidth of said data-vector model to a fixed number of communication buses in said data-flow model. Said step of determination of actors, edges and tokens of said data-flow model preferably comprises defining one or a group of data vectors in said first data-vector model as actors; defining data precedences crossing actor bounds, as edges, said edges behaving like queues and transporting tokens between actors; construct a system schedule and run a simulation on a computer environment. Said second refining step comprises preferably transforming said tokens from floating point to fixed point. Preferably, said SFG model is a timed fixed point SFG model.

Said second set of objects with said second set of relations therebetween are preferably at least partly derived from said first set of objects with said first set of relations therebetween. Objects belonging to said second set of objects are preferably new objects, identical with and/or derived by inheritance from objects from said first set of objects, or a combination thereof.

Several of said SFG models can be combined with a finite state machine description resulting in an implementable description. Said implementable description can be transformed to synthesizable code, said synthesizable code preferably being VHDL code.

Another aspect of the present invention is a method for simulating a system, wherein a description of a system is transformed into compilable C++ code.

Preferably, said description is an SFG data structure and said compilable C++ code is used to perform clock cycle true simulations.

Several SFG data structures can be combined with a finite state machine description resulting in an implementable description, said implementable description being said compilable C++ code suitable for simulating said system as software.

A clock-cycle true simulation of a system uses one or more SFG data structures.

Said clock-cycle true simulation can be an expectation-based simulation, said expectation-based simulation comprising the steps of: annotating a token age to every token; annotating a queue age to every queue; increasing token age according to the token aging rules and with the travel delay for every queue that has transported the token; increasing queue age with the iteration time of the actor steering the queue, and; checking whether token age is never smaller than queue age throughout the simulation.

Another aspect of the present invention is a hardware circuit or a software simulation of a hardware circuit designed with the design apparatus as recited higher.

Another aspect of the present invention is a hardware circuit or a software simulation of a hardware circuit designed with the method as recited higher.

DETAILED DESCRIPTION OF THE INVENTION

The present invention will be further explained by means of examples, which does not limit the scope of the invention as claimed.

SHORT DESCRIPTION OF THE DRAWINGS

In FIGS. 1A, 1B, 1C and 1D, the overall design methodology according to an embodiment of the invention is described.

Figure 2:
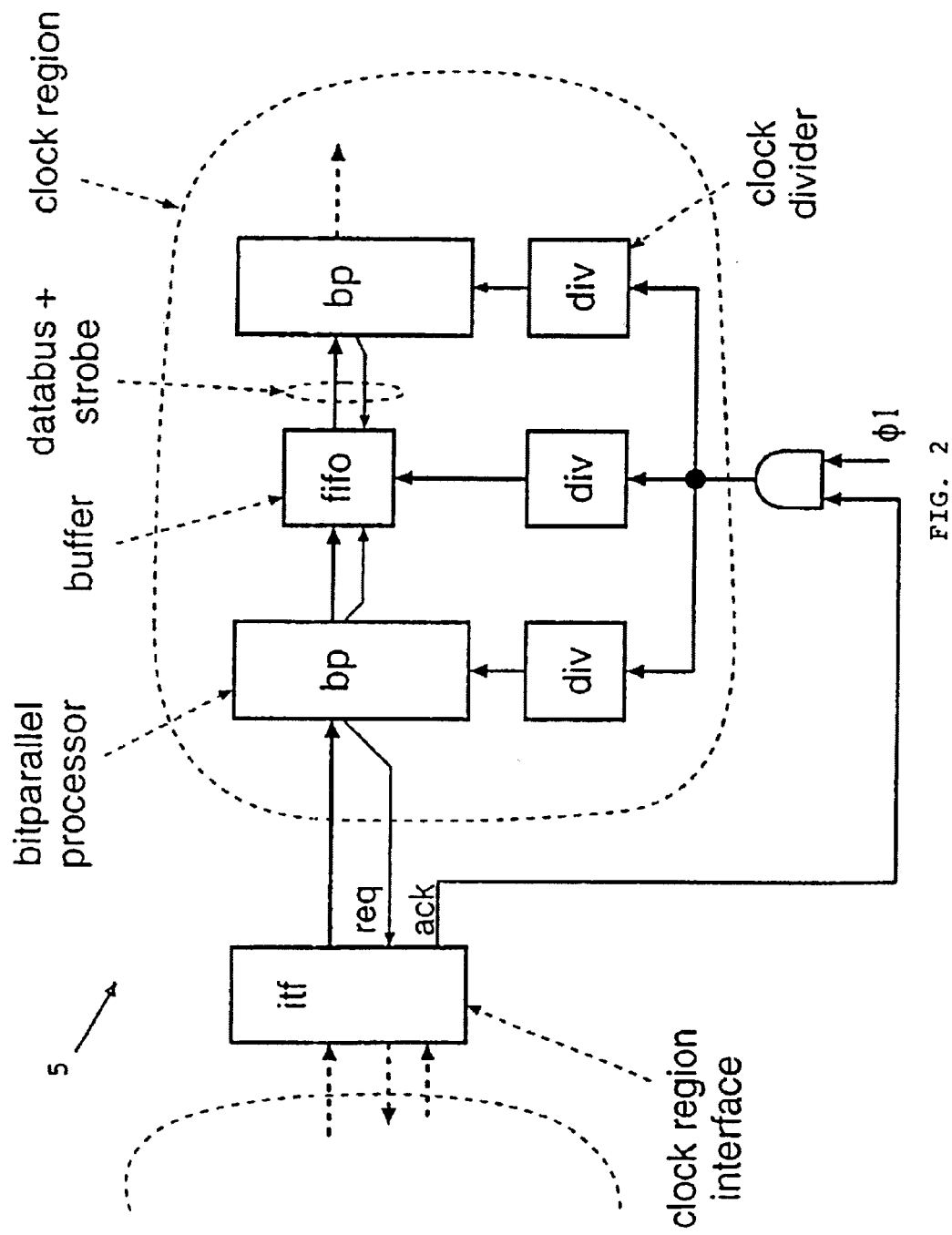

In FIG. 2, a targeted architecture of a system that is to be designed according to the invention is described.

Figure 3:
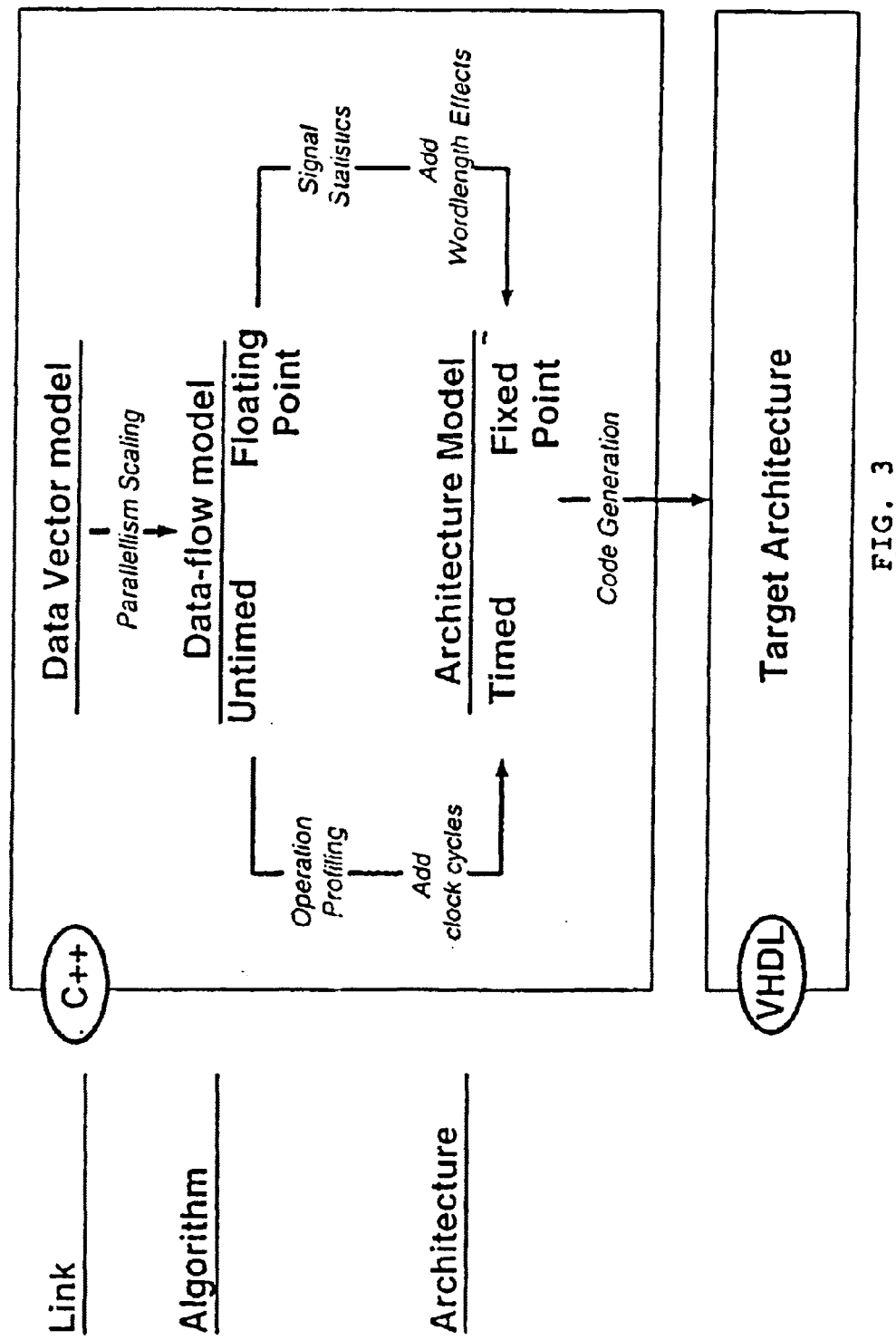

In FIG. 3, the C++ modeling levels of target architecture are depicted.

Figure 4:
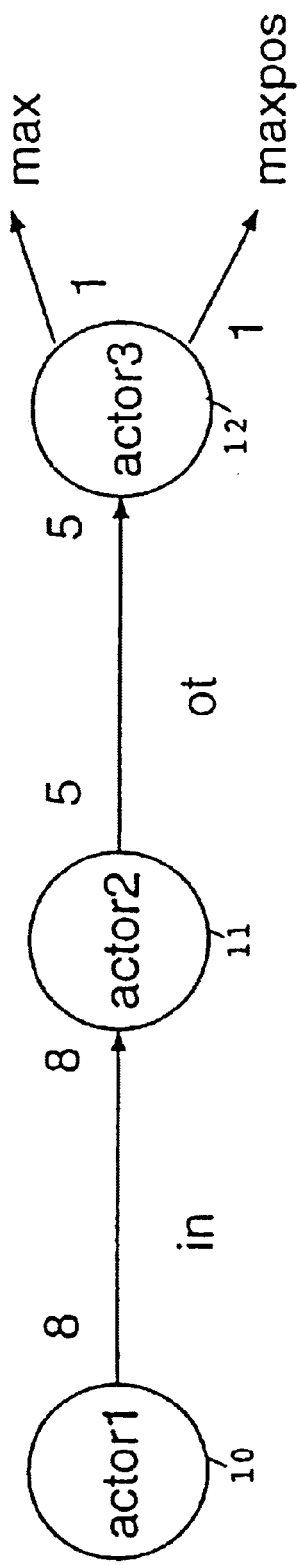

In FIG. 4, an SDF model of the PN correlator of the target architecture of FIG. 2 is shown.

Figure 5:
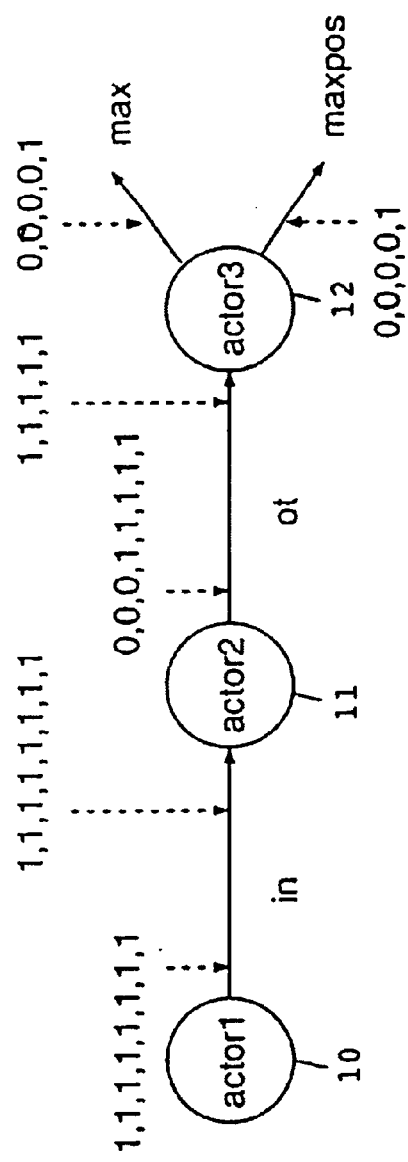

In FIG. 5, a CSDF model of the PN correlator is described.

Figure 6:
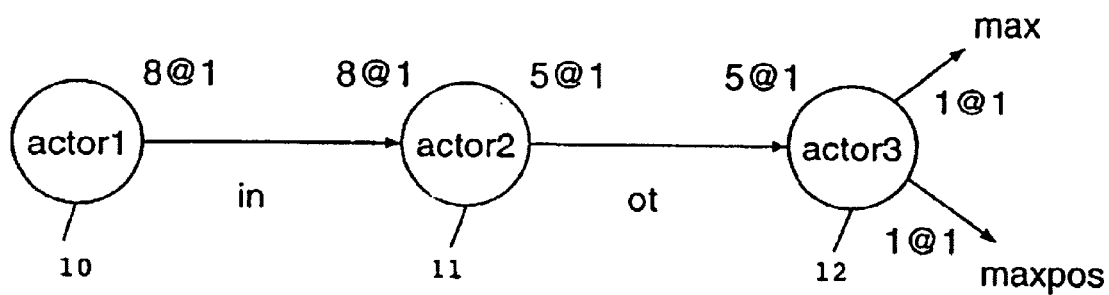

In FIG. 6, a MATLAB Dataflow model of the PN correlator is shown.

Figure 7:
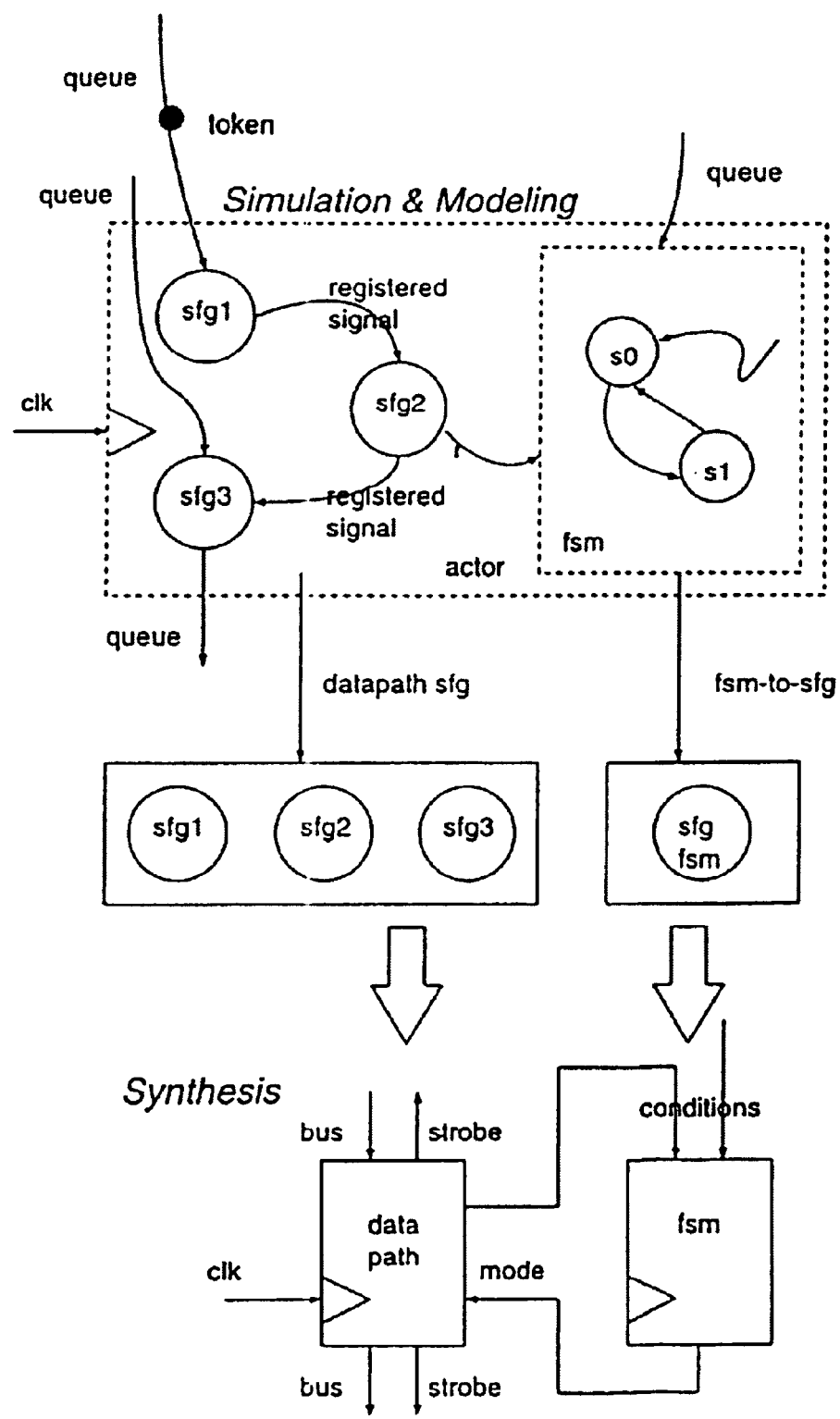

In FIG. 7, the SFG modeling concepts are depicted.

Figure 8:
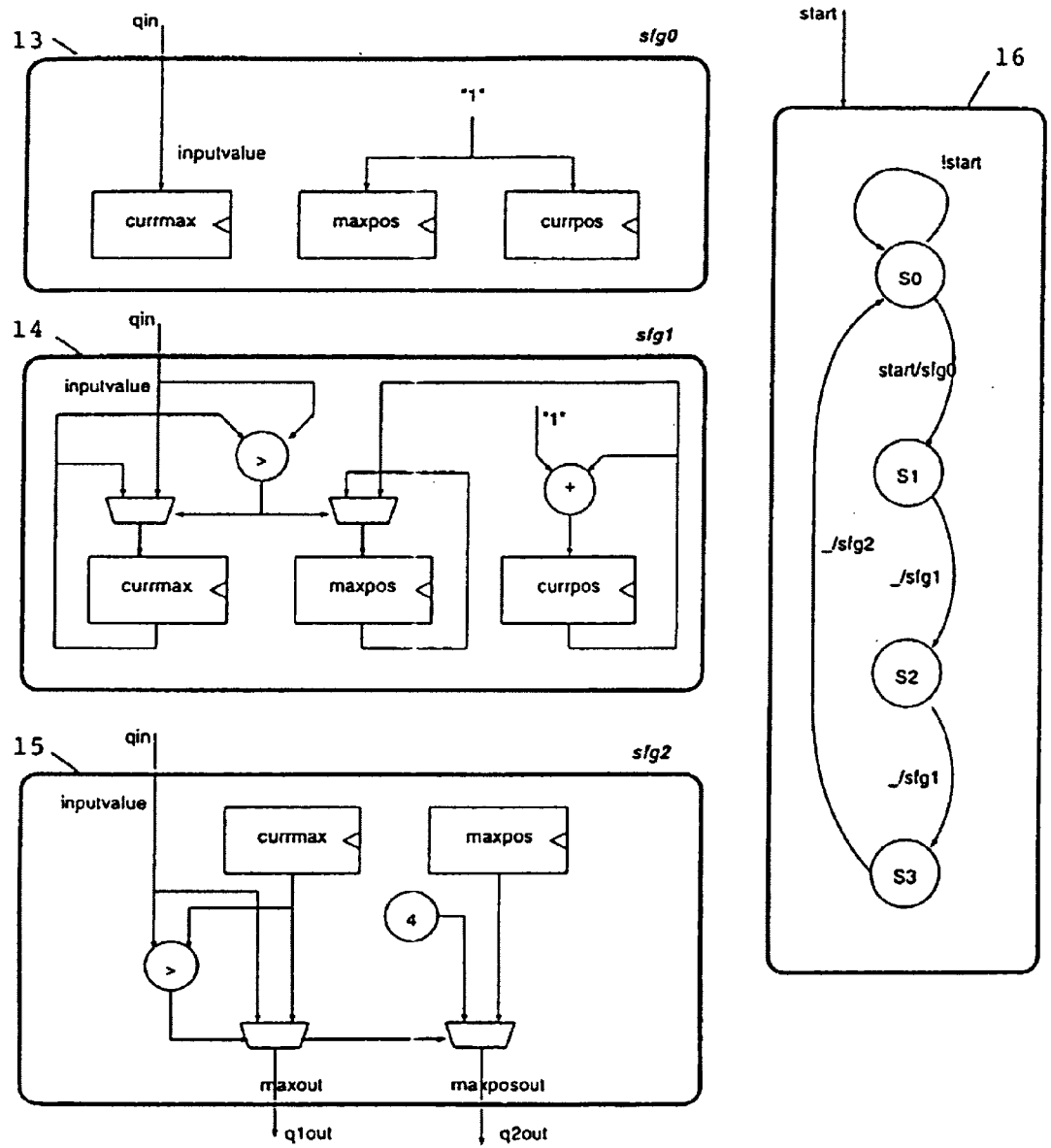

In FIG. 8, the implied description of the max actor is described.

In FIG. 9, example implementations for different expectations are given.

Figure 10:
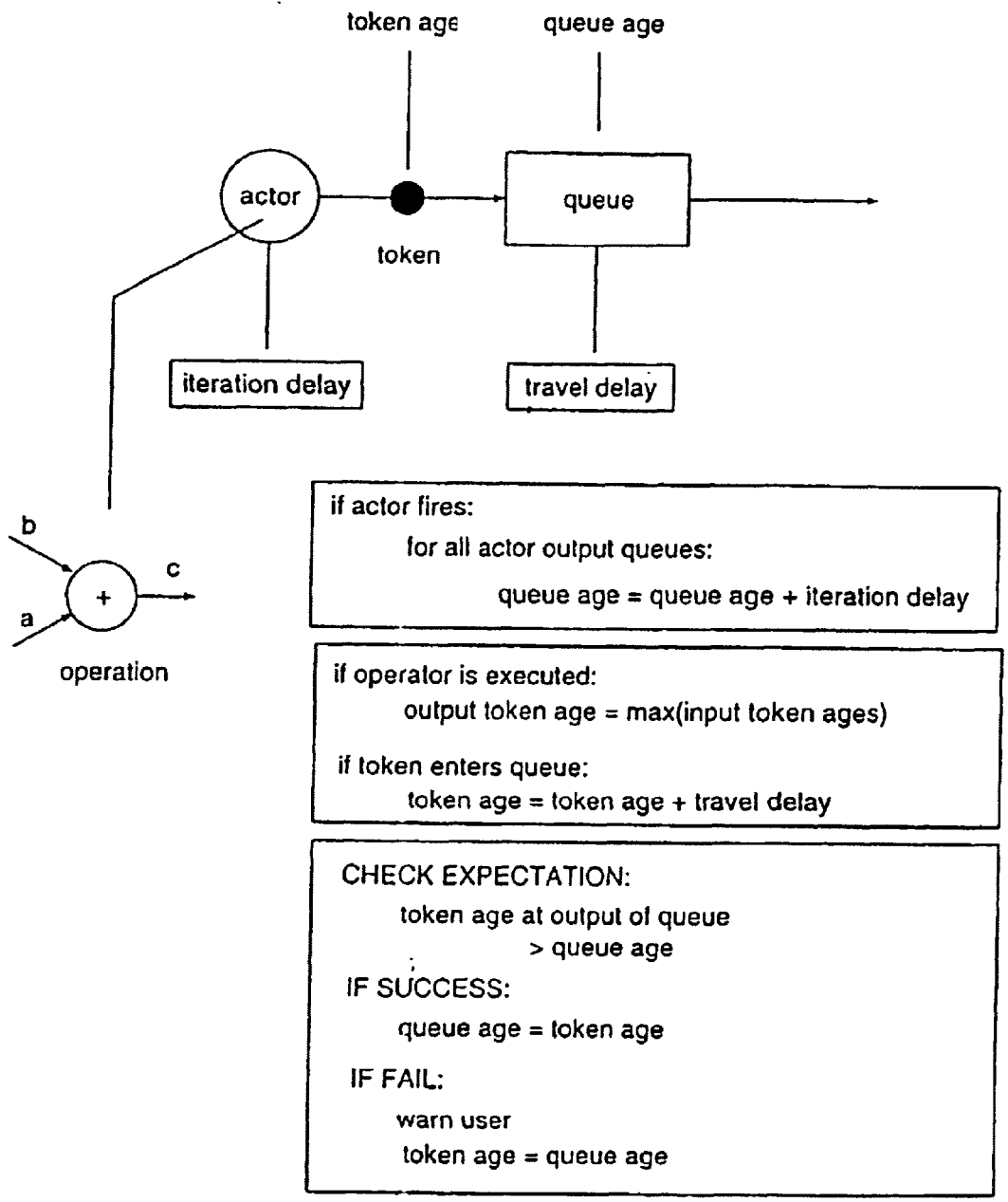

In FIG. 10, an overview of expectation based simulation is shown.

In FIG. 11, the code in OCAPI, or design environment of the invention, for a correlator processor is given.

Figure 12:
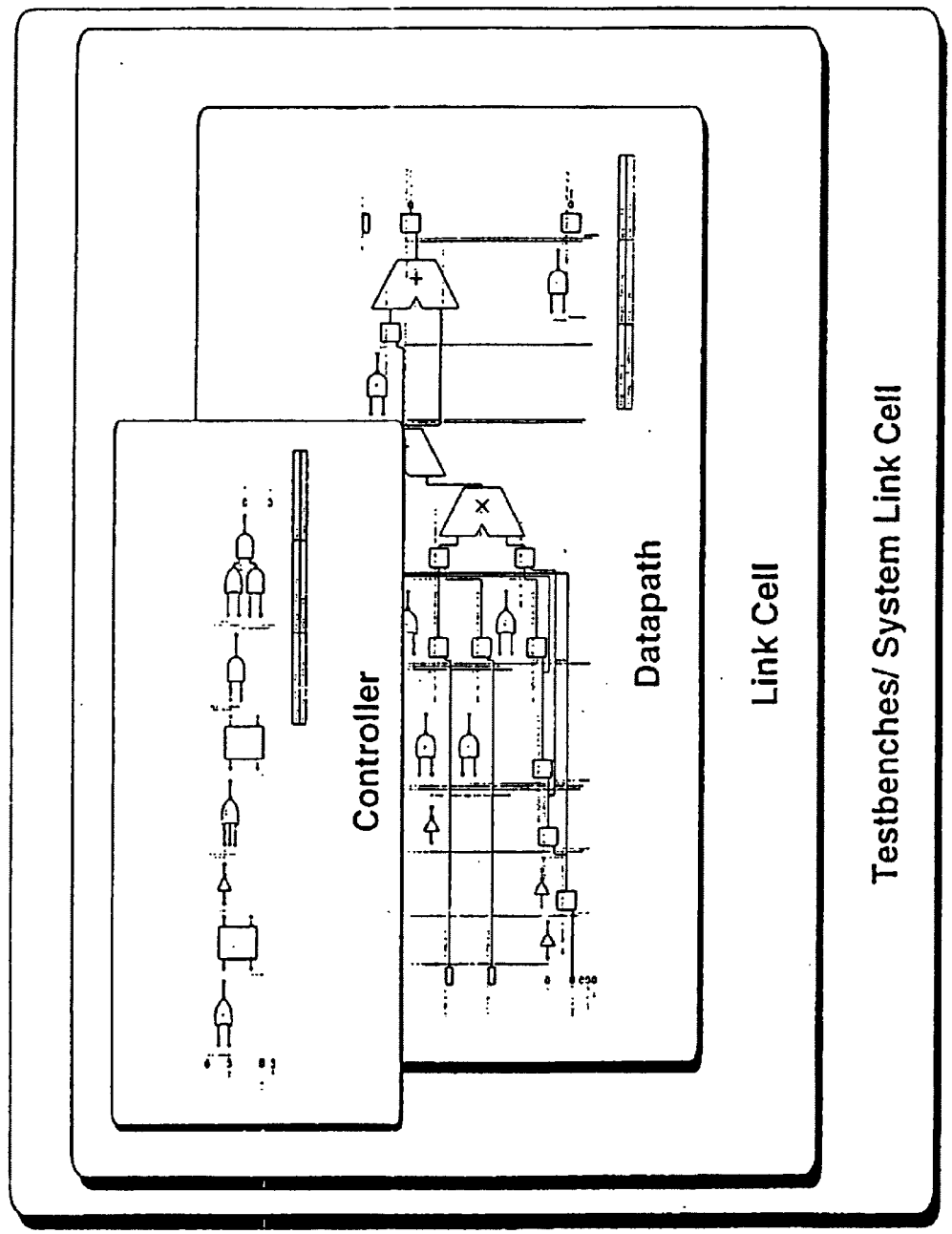

In FIG. 12, the resulting circuit for datapath and controller is hierarchically drawn.

Figure 13:
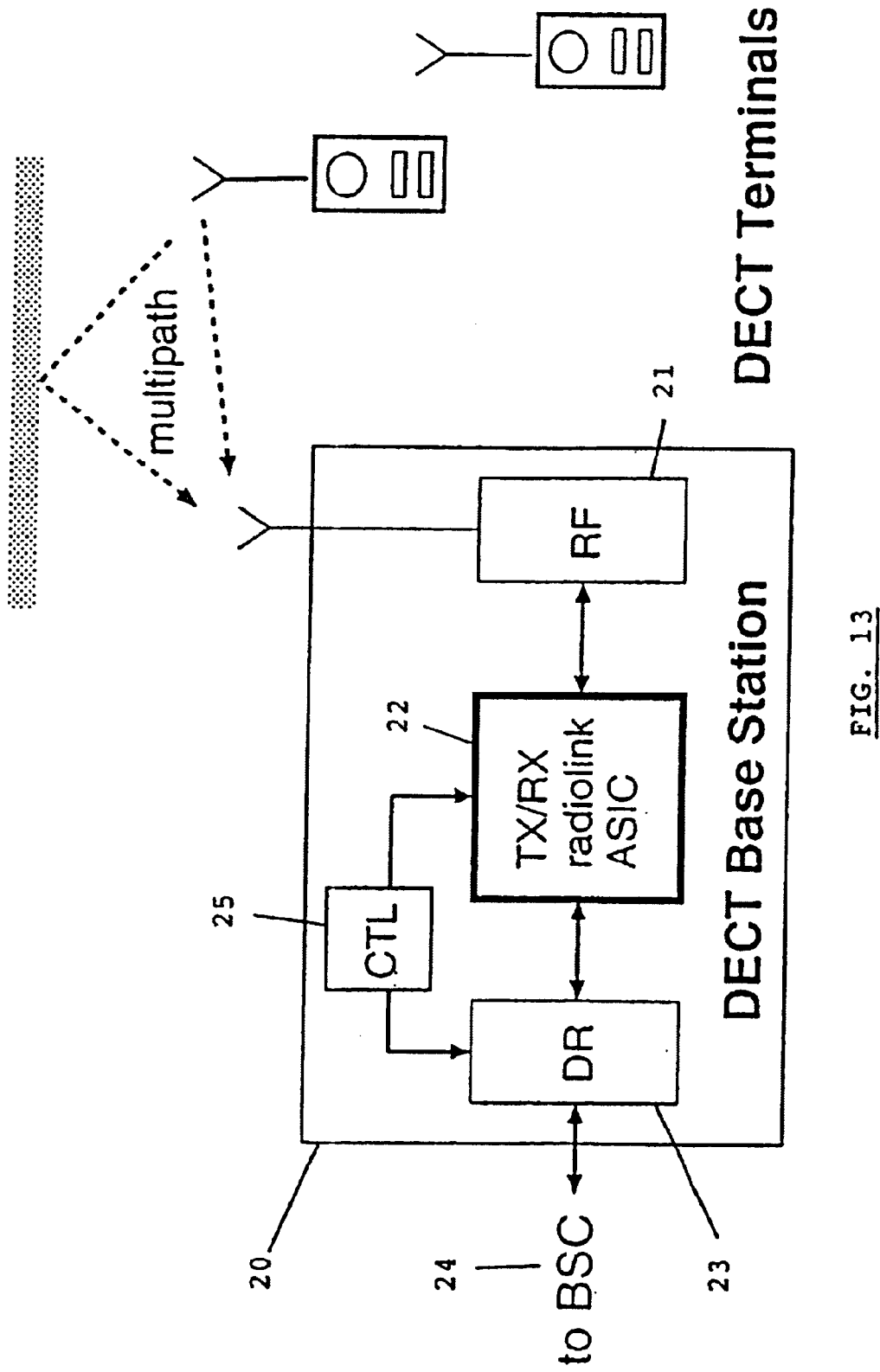

FIG. 13 describes a DECT Base station setup.

Figure 14:
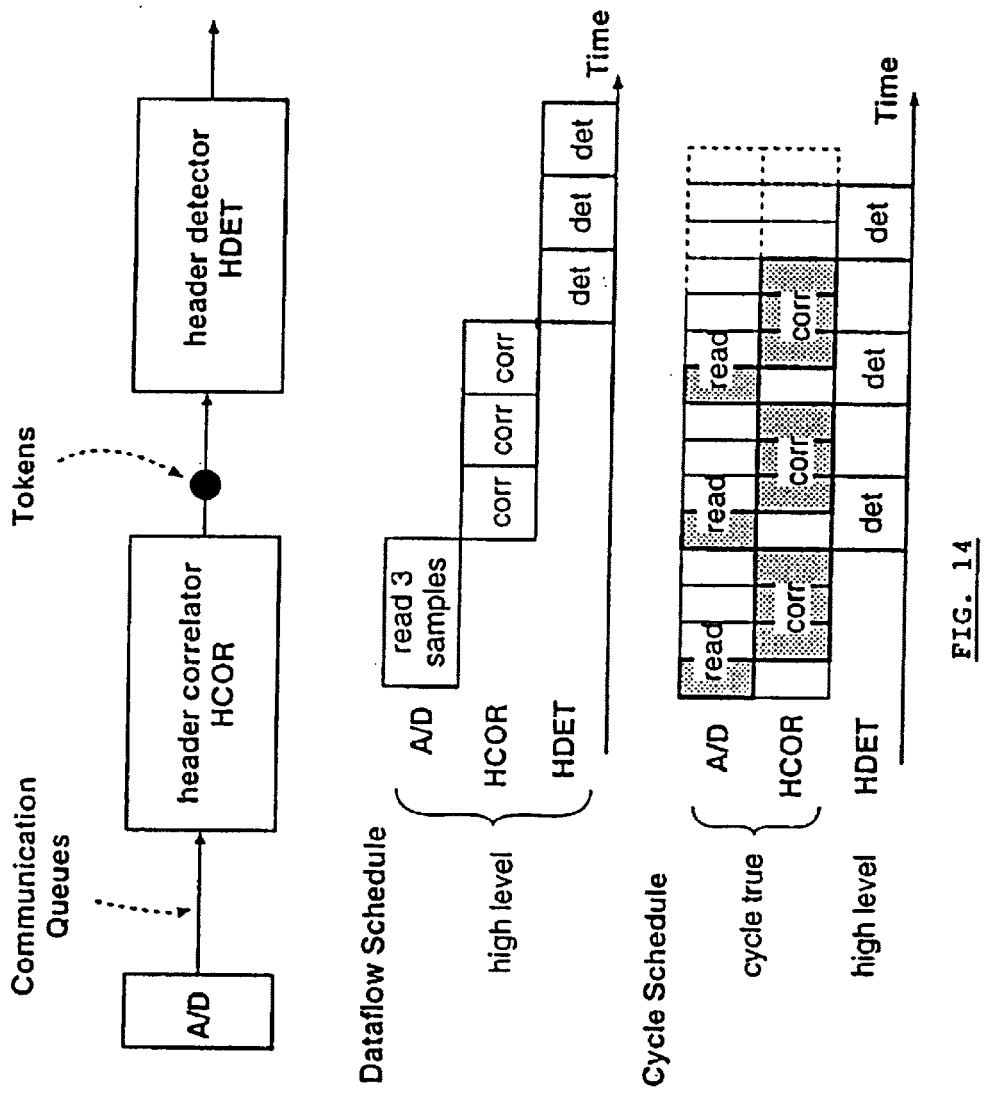

FIG. 14 shows the front-end processing of the DECT transceiver.

Figure 15:
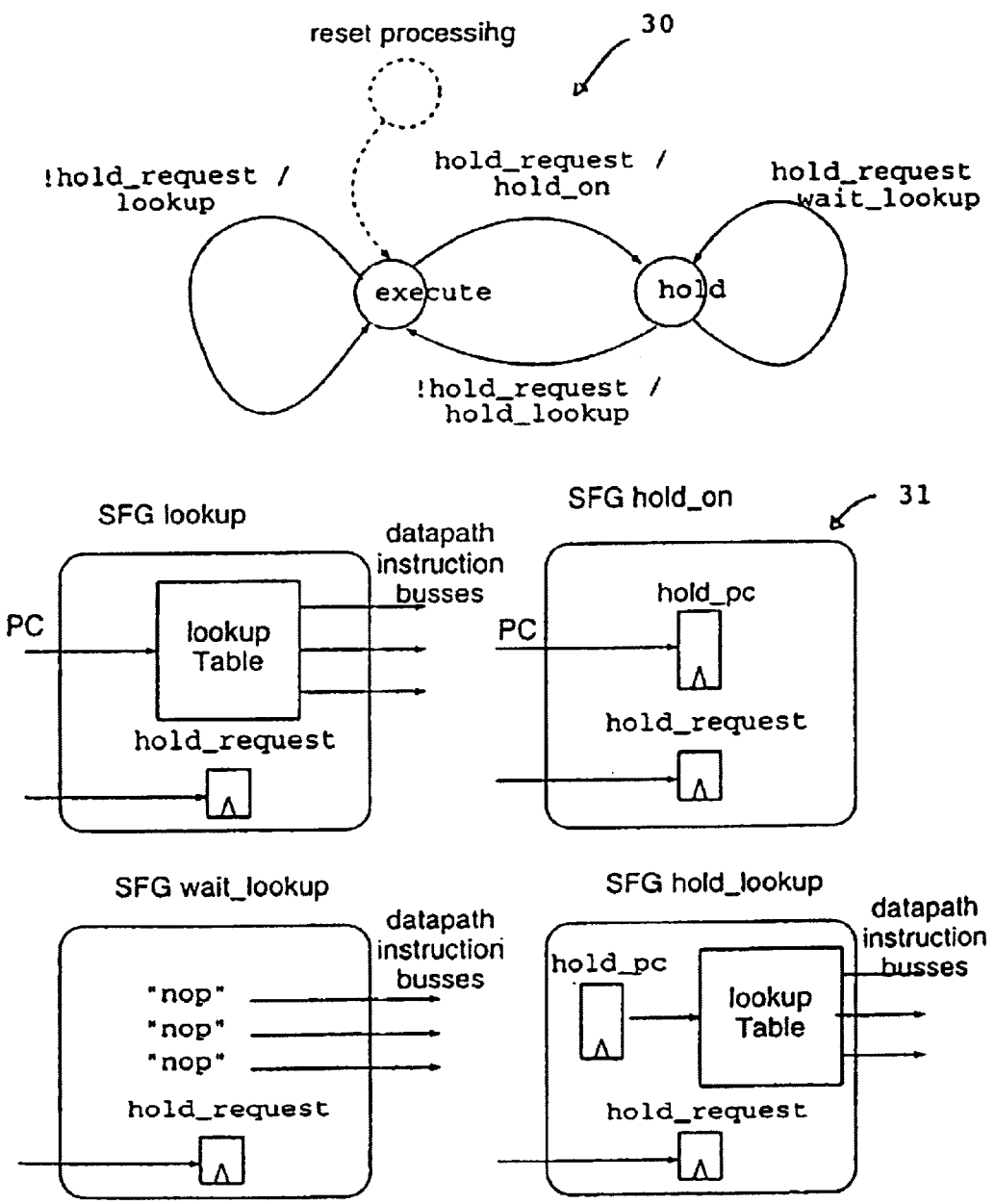

In FIG. 15, a part of the central VLIW controller description for the DECT transceiver ASIC is shown.

In FIG. 16, the use of overloading to construct the signal flowgraph data structure is shown.

Figure 17:
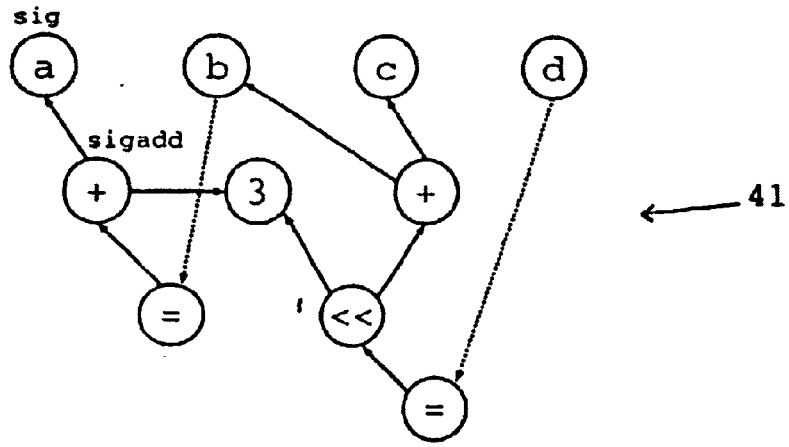

In FIG. 17, an example C++ code fragment and its corresponding data structure is described.

Figure 18:
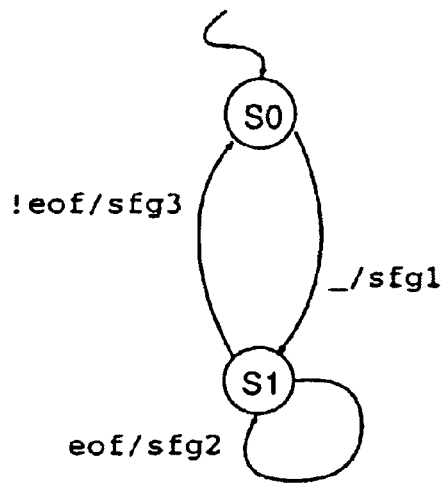

In FIG. 18, a graphical and C++-textual description of the same FSM is shown.

Figure 19:
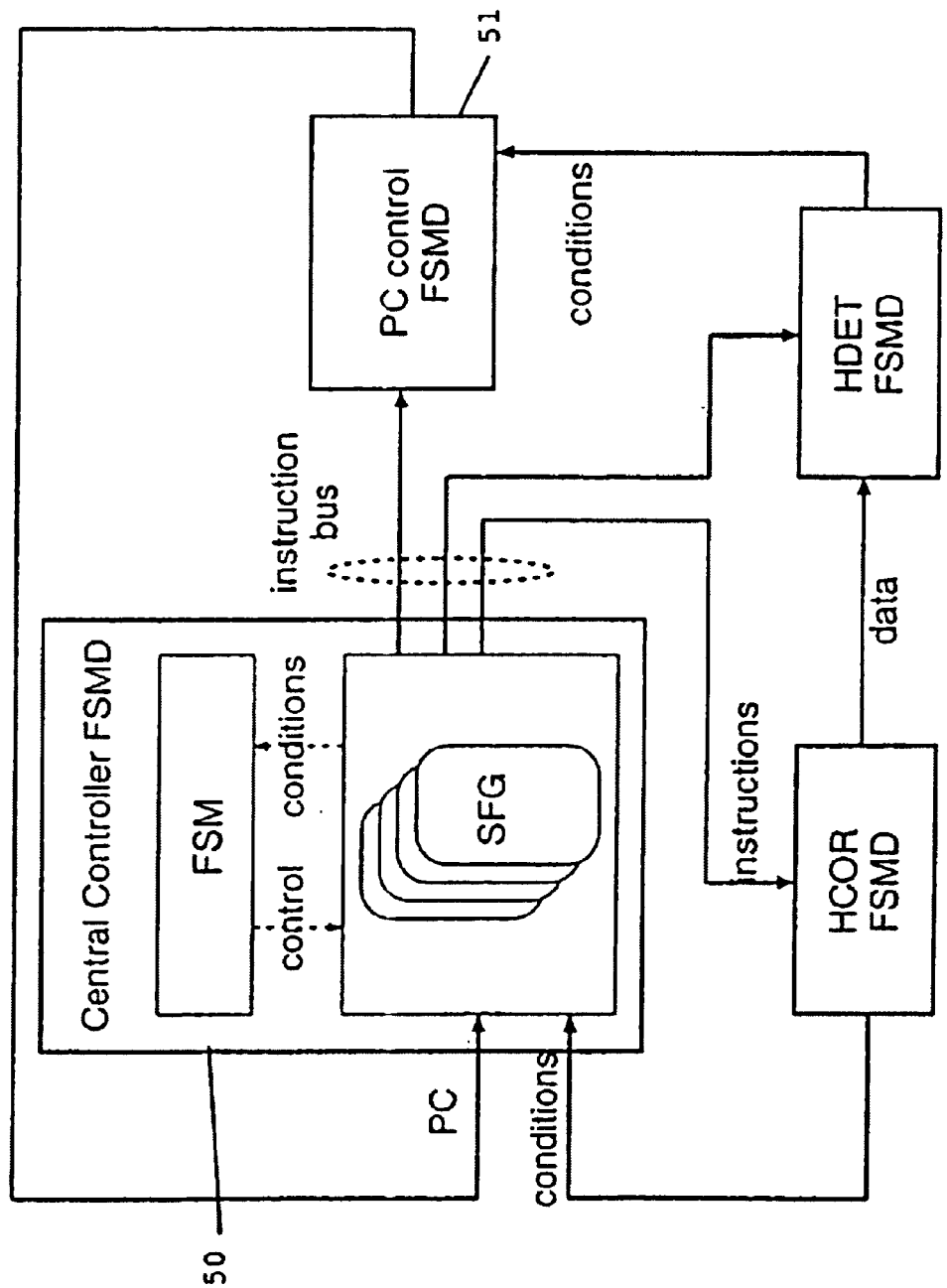

In FIG. 19, the final system architecture of the DECT transceiver is shown.

Figure 20:
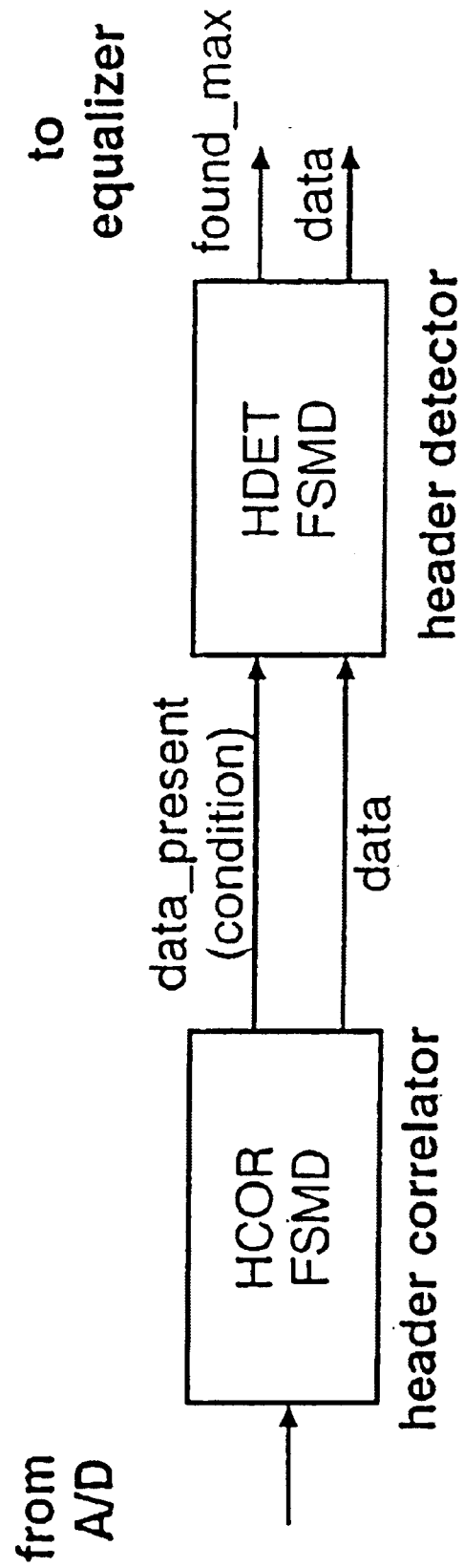

In FIG. 20, a data-flow target architecture is shown.

Figure 21:
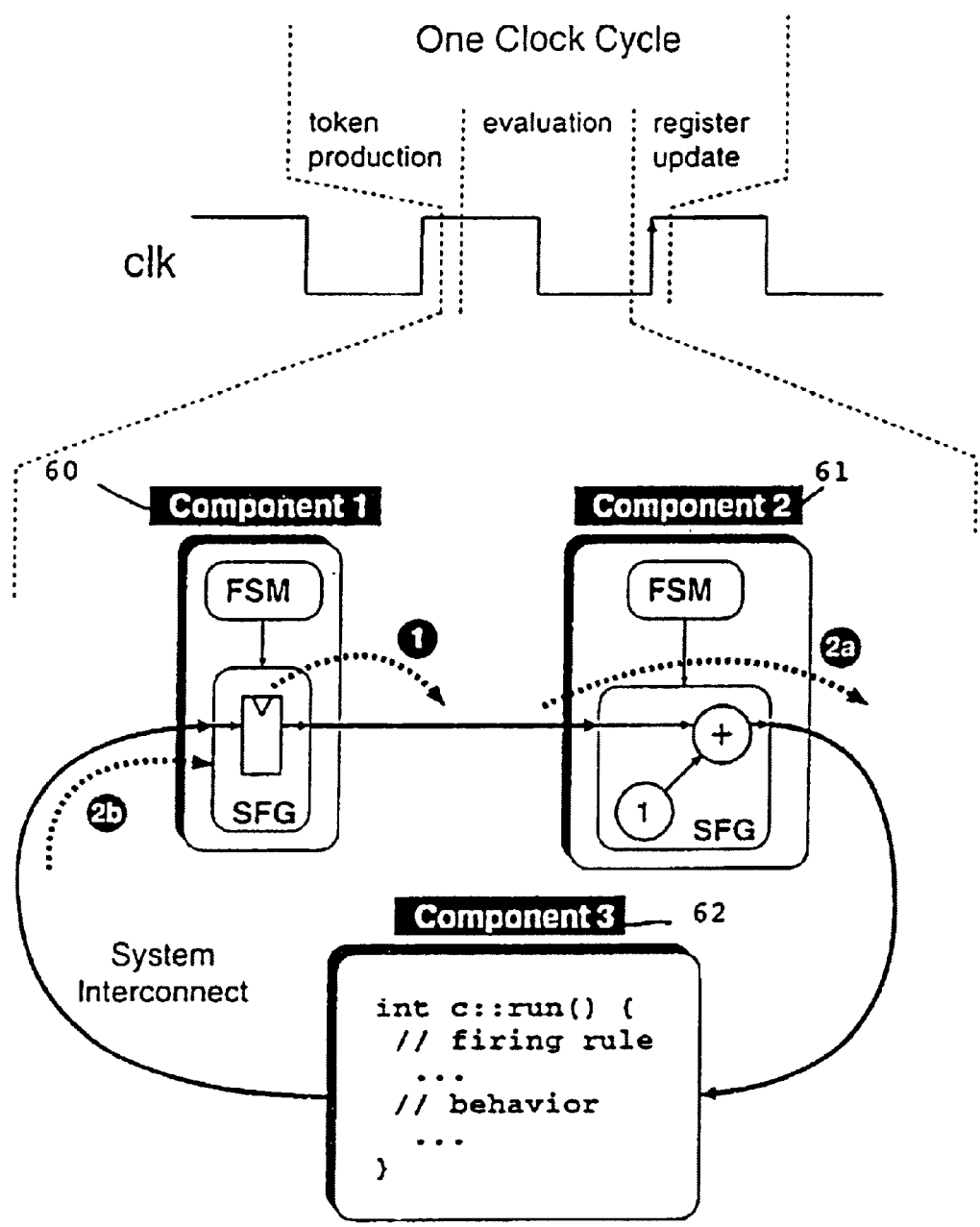

In FIG. 21, the simulation of one cycle in a system with three components is shown.

Figure 22:
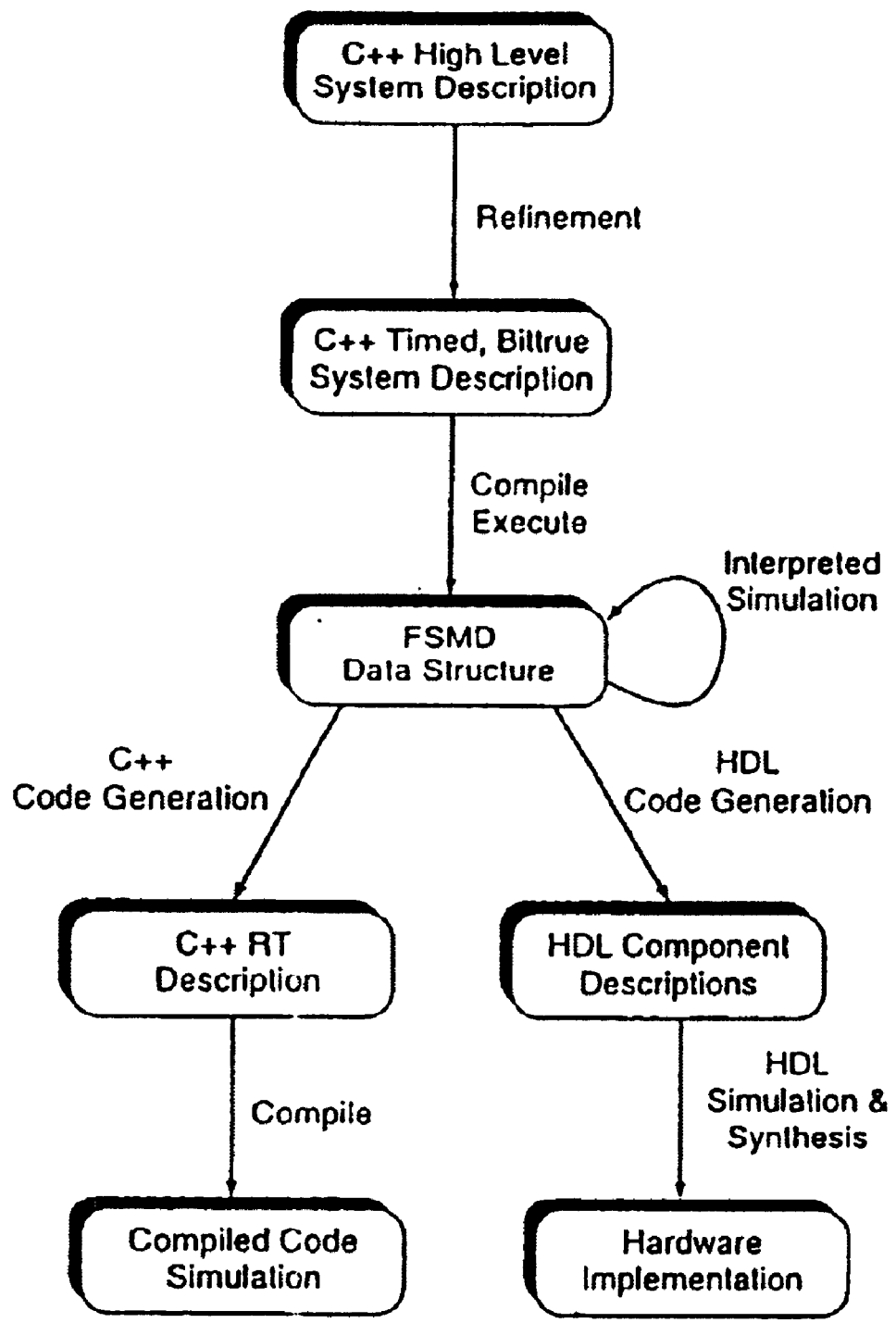

In FIG. 22, the implementation and simulation strategy is depicted.

Figure 23:
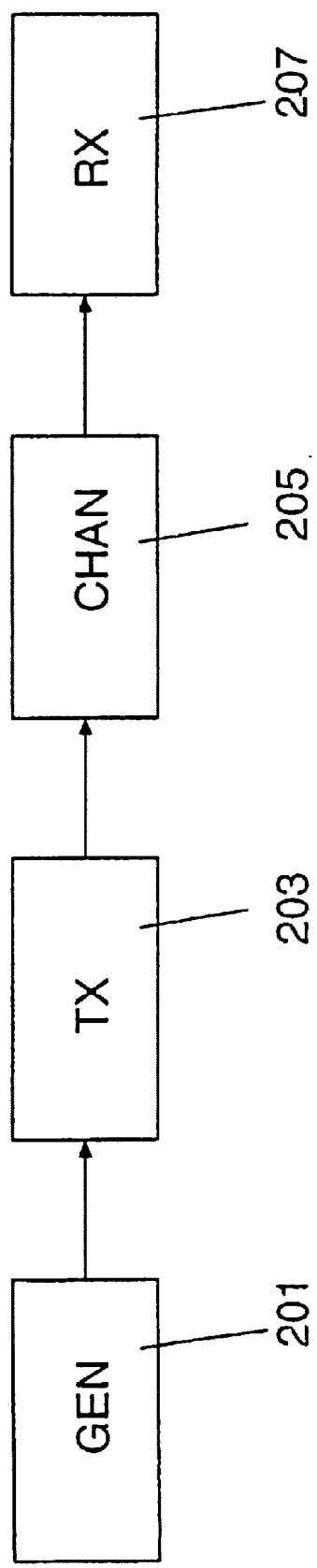

In FIG. 23, an end-to-end model of a QAM transmission system is shown.

Figure 24:
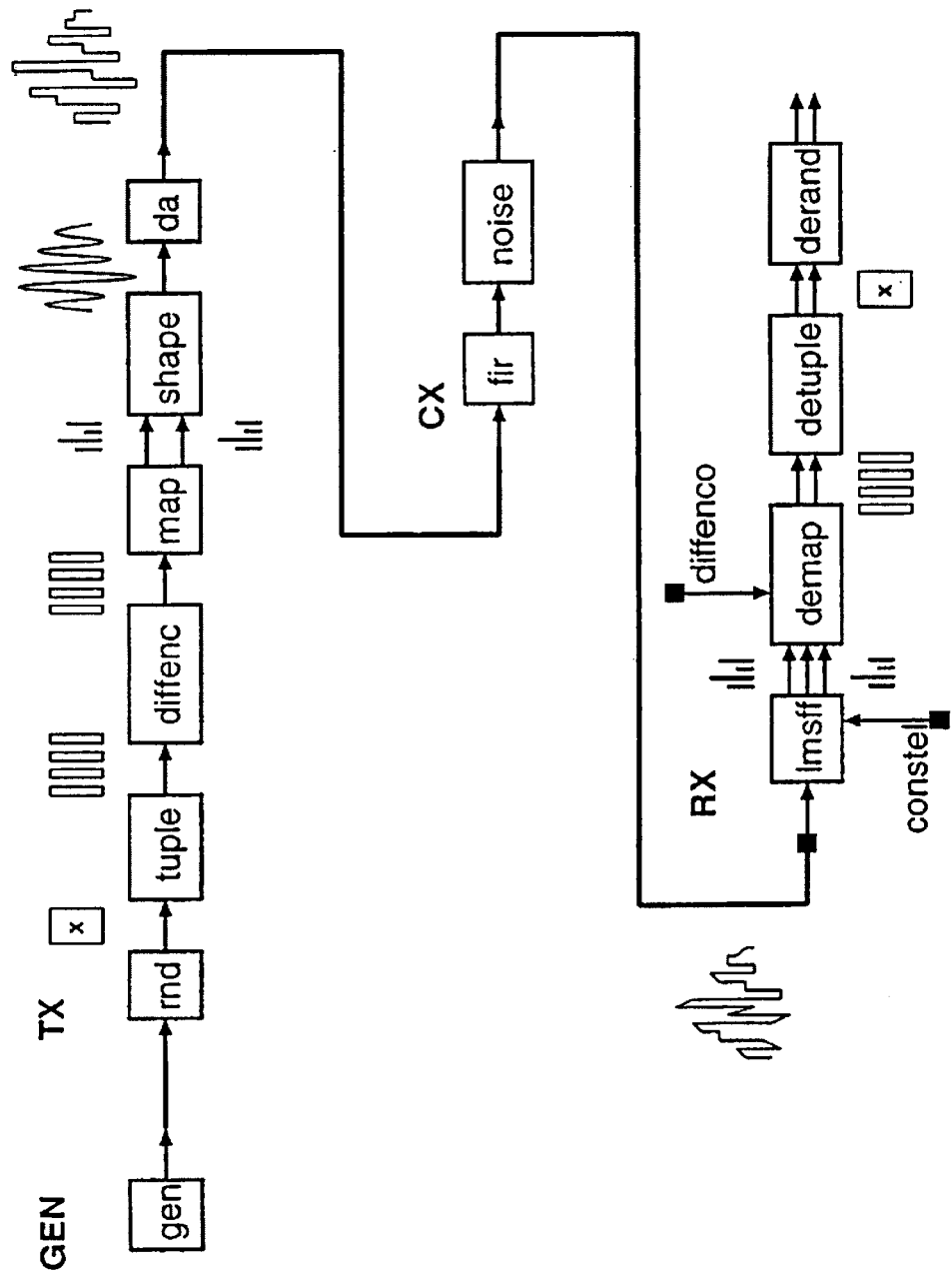

In FIG. 24, the system contents for the QAM transmission system is described.

The present invention can be described as a design environment for performing subsequent gradual refinement of descriptions of digital systems within one and the same object oriented programming language environment. The lowest level is semantically equivalent to a behavioral description at the register transfer (RT) level.

A preferred embodiment of the invention comprising the design method according to the invention is called OCAPI. OCAPI is part of a global design methodology concept SOC++. OCAPI includes both a design environment in an object oriented programming language and a design method. OCAPI differentiates from current systems that support architecture definition (SPW, COSSAP) in the way that a designer is guided from the MATLAB level to the register transfer level. This way, combined semantic and syntactic translations in the design flow are avoided.

The designer is offered a single coding framework in an object oriented programming language, such as C++, to express refinements to the behavior. An open environment is used, rather than the usual interface-and-module approach.

The coding framework is a container of design concepts, used in traditional design practice. Some example design concepts currently supported are simulation queues, finite state machines, signal flowgraphs, hybrid floating/fixed point data types, operation profiling and signal range statistics. The concepts take the form of object oriented programming language objects (referred to as object in the remainder of this text), that can be instantiated and related to each other.

With this set of objects, a gradual refinement design route is offered: more abstract design concepts can be replaced with more detailed ones in a gradual way. Also, design concepts are combined in an orthogonal way: quantization effects and clock cycles (operation/ operator mapping) for instance are two architecture features that can be investigated separately. Next, the different design hierarchies can be freely intermixed because of this object-oriented approach. For instance, it is possible to simulate half of the description at fixed point level, while the other half is still in floating point.

The use of a single object oriented programming language framework in OCAPI allows fast design iteration, which is not possible in the typical nowadays hybrid approach.

Comparing to existing data-flow-based systems like SPW and COSSAP we see that the algorithm iterations can be freely chosen. Comparing to existing hardware design environments like DC or BC, we see that we can start from a specification level that is more abstract than the connection of blocks.

Two concepts of scaleable parallelism and expectation based simulation are introduced. The designer is given an environment to check the feasibility of what the designer thinks that can be done. In the development process, the designer creates his library of Signal FlowGraph (SFG) versions of abstract MATLAB operations.

DESCRIPTION OF OCAPI, A PREFERRED EMBODIMENT OF THE PRESENT INVENTION

OCAPI is a C++ library intended for the design of digital systems. It provides a short path from a system design description to implementation in hardware. The library is suited for a variety of design tasks, including:

Fixed Point Simulations

System Performance Estimation

System Profiling

Algorithm-to-Architecture Mapping

System Design according to a Dataflow Paradigm

Verification and Testbench Development

Development Flow

The Flow Layout

Figure 1B:
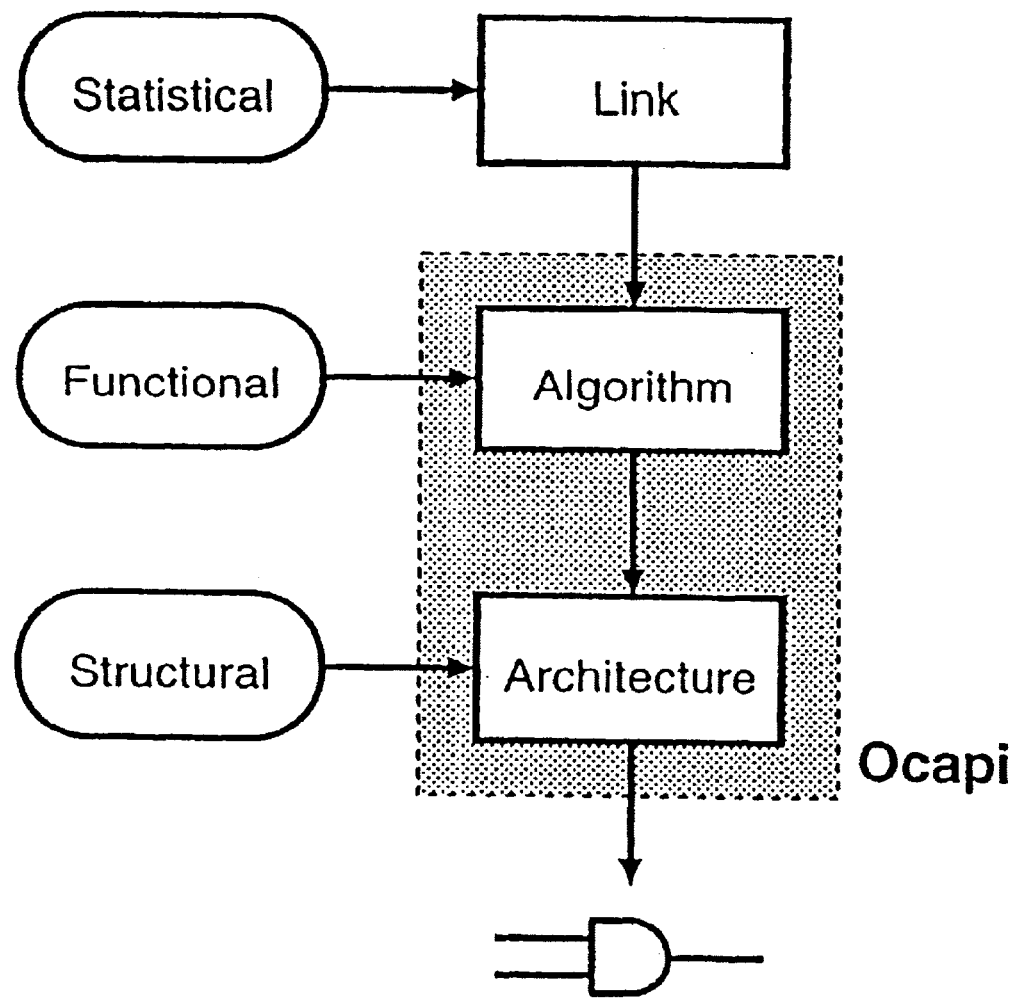
Figure 1C:
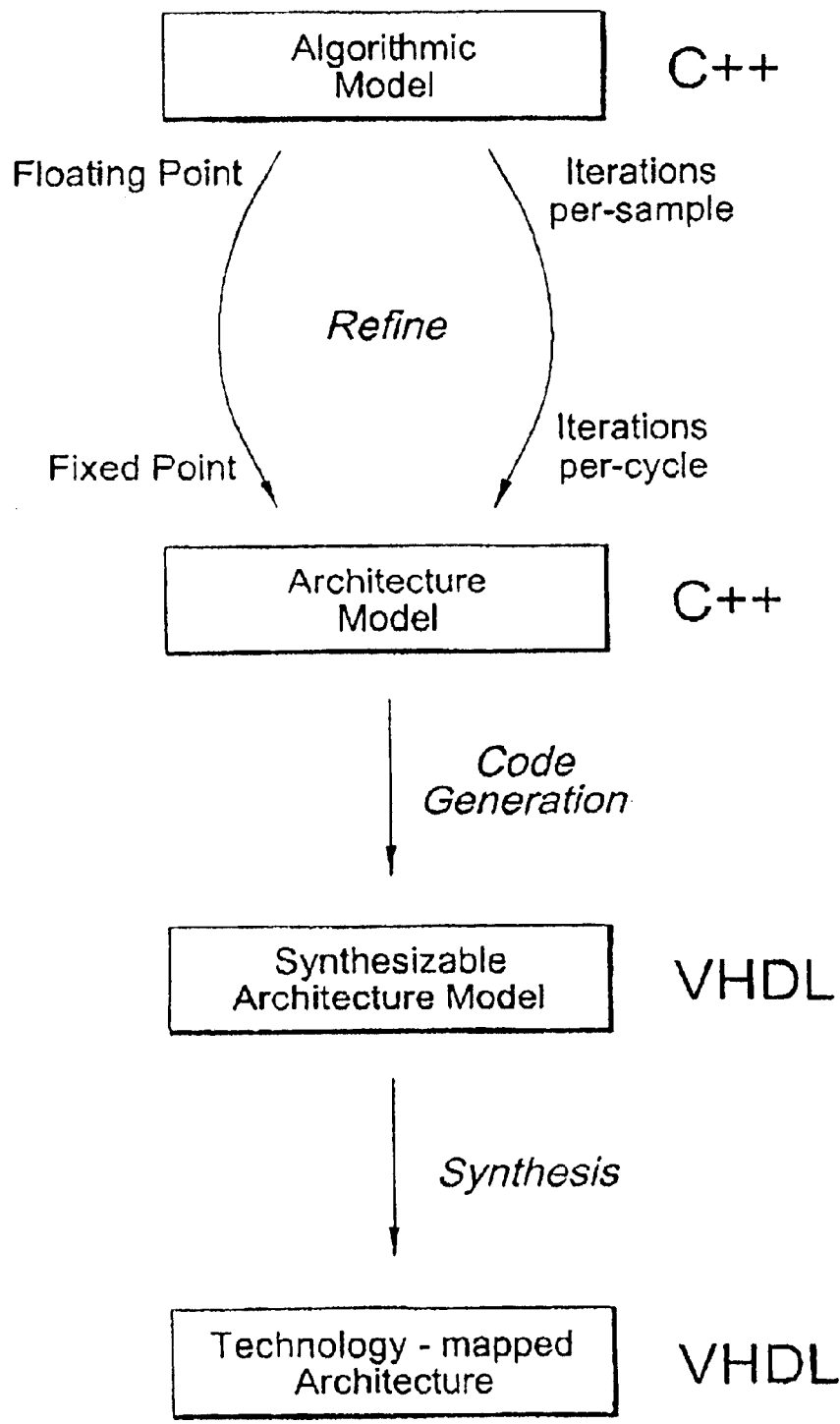
Figure 1D:
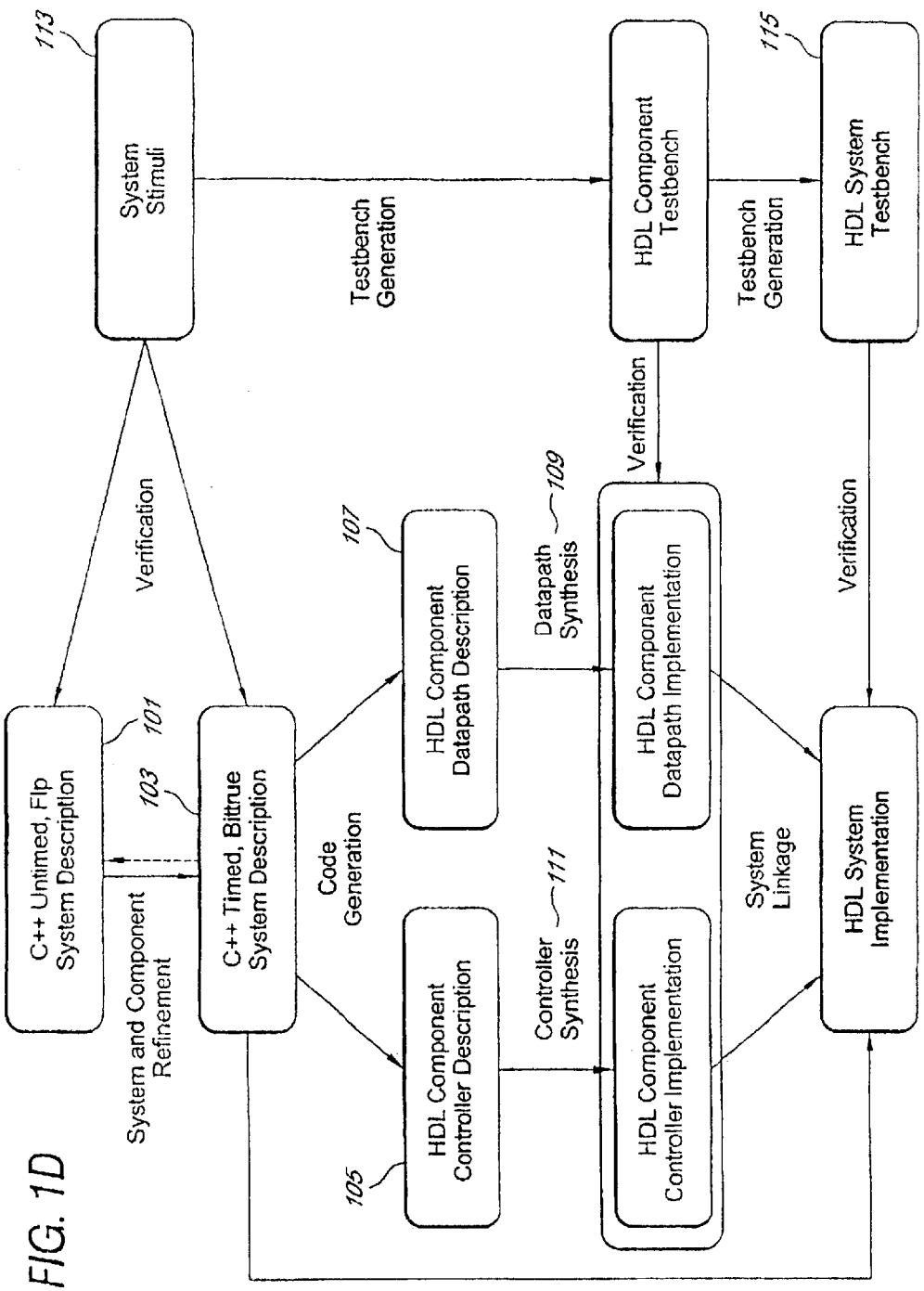

The design flow according to an embodiment of the present invention, as shown in FIG. 1D, starts off with an untimed, floating point C++ system description 101. Since data-processing intensive applications such as all-digital transceivers are targeted, this description uses data-flow semantics. The system is described as a network of communicating components.

At first, the design is refined, and in each component, features expressing hardware implementation are introduced, including time (clock cycles) and bittrue rounding effects. The use of C++ allows to express this in an elegant way. Also, all refinement is done in a single environment, which greatly speedups the design effort.

Next, the timed, bittrue C++ description 103 is translated into an equivalent HDL description by code generation. For each component, a controller description 105 and a datapath description 107 can be generated. Also for each component a single HDL description can be generated, this description preferably jointly representing the control processing and data processing of the component. This is done because OCAPI relies on separate synthesis tools for both parts, each one optimized towards controller or else datapath synthesis tasks. Through the use of an appropriate object modeling hierarchy the generation of datapath and controller HDL can be done fully automatic.

For datapath synthesis 109, OCAPI relies on the Cathedral-3 datapath synthesis tools, that allow to obtain a bitparallel hardware implementation starting from a set of signal flowgraphs. Controller synthesis 111 on the other hand is done by the logic synthesis of Synopsys DC. This divide and conquer strategy towards synthesis allows each tool to be applied at the right place.

During system simulation, the system stimuli 113 are also translated into testbenches that allow to verify the synthesis result of each component. After interconnecting all synthesized components into the system netlist, the final implementation can also be verified using a generated system testbench 115.

The System Model

The system machine model that is used is a set of concurrent processes. Each process translates to one component in the final system implementation.

At the system level, processes execute using data flow simulation semantics. That is, a process is described as an iterative behavior, where inputs are read in at the start of an iteration, and outputs are produced at the end. Process execution can start as soon as the required input values are available.

Inside of each process, two types of description are possible. The first one is an untimed description, and can be expressed using any C++ constructs available. A firing rule is also added to allow dataflow simulation. Untimed processes are not subject to hardware implementation but are needed to express the overal system behavior. A typical example is a channel model used to simulate a digital transceiver.

The second flavor of processes is timed. These processes operate synchronously to the system clock. One iteration of such a process corresponds to one clock cycle of processing. Such a process falls apart in two pieces: a control description and a data processing description.

The control description is done by means of a finite state machine, while the data description is a set of instructions. Each instruction consists of a series of signal assignments, and can also define process in- and outputs. Upon execution, the control description is evaluated to select one or more instructions for execution. Next, the selected instructions are executed. Each instruction thus corresponds to one clock cycle of RT behavior.

For system simulation, two schedulers are available. A dataflow scheduler is used to simulate a system that contains only untimed blocks. This scheduler repeatedly checks process firing rules, selecting processes for execution as their inputs are available. When the system also contains timed blocks however, a cycle scheduler is used. The cycle scheduler manages to interleave execution of multi-cycle descriptions, but can incorporate untimed blocks as well.

The Standard Program

The library of OCAPI has been developed with the g++ C++ GNU compiler. The best mode embodiment uses the g++ 2.8.1 compiler, and has been successfully compiled and run under the HPUX 10 (HPUX10) operating system platform. It is also possible to use a g++ 2.7.2 compiler, allowing for compilation and run under operating system platforms such as HPUX-9 (HPRISC), HPUX-10 (HPUX10), SunOS (SUN4), Solaris (SUN5) and Linux 2.0.0 (LINUX).

The layout of the 'standard' g++ OCAPI program will be explained, including compilation and linking of this program.

First of all, g++ is a preferred standard compilation environment. On Linux, this is already the case after installation. Other operating system vendors however usually have their own proprietary C++ compiler. In such cases, the g++ compiler should be installed on the operating system, and the PATH variable adapted such that the shell can access the compiler.

The OCAPI library comes as a set of include files and a binary lib. All of these are put into one directory, which is called the BASE directory.

The 'standard program' is the minimal contents of an OCAPI program. It has the following layout.

```
include "qlib.h"
int main ( )
{
//your program goes here
}
```

The include "qlib.h" includes everything you need to access all classes within OCAPI.

If this program is called "standard.cxx", then the following makefile will transform the source code into an executable for you:

```
HOSTTYPE = HPUX10
BASE = /imec/vsdm/OCAPI/release/v0.9
CC = g++
QFLAGS = -c -g -Wall -I${BASE}
LIBS = -lm
%.o: %.cxx
    $(CC) $(QFLAGS) $< -o $@
TARGET = standard
all: $(TARGET)
define lnkqlib
$(CC) $^ -o $@ $(LIBS)
endef
OBJS = standard.o
standard:${OBJS} $(BASE)/lib$(HOSTTYPE) qlib.a
    ${lnkqlib}
clean:
rm -f *.o $(TARGET)
```

This is a makefile for GNU's "make"; other "make" programs can have a slightly different syntax, especially for the definition of the "lnkqlib" macro. It is not the shortest possible solution for a makefile, but it is one that works on different platforms without making assumptions about standard compilation rules.

The compilation flags "QFLAGS" mean the following: "-c" selects compilation-only, "-g" turns on debugging information, and "-Wall" is the warning flag. The debugging flag allows you to debug your program with "gdb", the GNU debugger.

Even if you don't like a debugger and prefer "printf( )" debugging, "gdb" can at least be of great help in the case the program core dumps. Start the program under "gdb" (type "gdb standard" at the shell prompt), type "run" to let "standard" crash again, and then type "bt". One now see the call trace.

Calculation

OCAPI processes both floating point and fixed point values. In contrast to the standard C++ data types like "int" and "double", a "hybrid" data type class is used, that simulates both fixed point and floating point behavior.

The dfix Class

This class is called "dfix". The particular floating/fixed point behavior is selected by the class constructor. The standard format of this constructor is

```
dfix a;       // a floating point value
dfix a (0.5);// a floating point value with initial value
dfix a (0.5, 10, 8);
// a fixed point value with initial value,
// 10 bits total word-length, 8 fractional bits
```

A fixed point value has a maximal precision of the mantissa precision of a C++ "double". On most machines, this is 53 bits.

A fixed point value can also select a representation, an overflow behavior, and a rounding behavior. These flags are, in this order, optional parameters to the "dfix" constructor. They can have the following values.

Representation flag: "dfix::tc" for two's complement signed representation, "dfix::ns" for unsigned representation.

Overflow flag: "dfix::wp" for wrap-around overflow, "dfix::st" for saturation.

Rounding flag: "dfix::fl" for truncation (floor), "dfix::rd" forrounding behavior.

Some examples are

```
dfix a(0.5, 10, 8);
    // the default is two's complement, wrap-around,
    // truncated quantisation
dfix a(0.5, 10, 8, dfix::tc, dfix::st, dfix::rd);
    // two's complement, saturation, rounding quantisation
dfix a(0.5, 10, 8, dfix::ns);
    // unsigned, wrap-around, truncated quantisation
```

When working with fixed point "dfix"es, it is important to keep the following rule in mind: "quantisation occurs only when a value is defined or assigned". This means that a large expression with several intermediate results will never have these intermediate values quantised. Especially when writing code for hardware implementation, this should be kept in mind. Also intermediate results are stored in finite hardware and therefore will have some quantisation behavior. There is however a a "cast" operator that will come at help here.

The dfix Operators
The operators on "dfix" are shown below

+, -, *, /
    Standard addition, subtraction (including unary minus), multiplication and division.

+=, -=, *=, /=
    In-place versions of previous operators.

abs
    Absolute value.

<<, >>
    Left and right shifts.

<<=, >>=
    In place left and right shifts.

msbpos
    Most-significant bit position.

&, |, ^, ~
    Bitwise and, or, exor, and not operators.

frac( ) (member call)
    Fractional part.

==, !=, <=, >=, <, >
    Relational operators: equal, different, smaller then or equal to, greater then or equal to, smaller then, greater then. These return an "int" instead of a "dfix".

All operators with exception of the bitwise operators work on the maximal fixed point precision (53 points). The bitwise operators have a precision of 32 bits (a C++ "long"). Also, they assume the fixed point representation contains no fractional bits.

In addition to the arithmetic operators, several utility methods are available for the "dfix" class.

```
dfix a,b;
// cast a to another type
b = cast(dfix(0, 12, 10), a);
// assign b to a, retaining the quantisation of a
a = b;
// assign b to a, including the quantisation
a.duplicate(b);
// return the integer part of b
int c = (int) b;
// retrieve the value of b as a double
double d,e:
d = b.Val( );
e = Val (b);
// return quantisation characteristics of a
a.TypeW( );          // returns the number of bits
a.TypeL( );          // returns the number of fractional bits
a.TypeSign( );       // returns dfix::tc or dfix::ns
a.TypeOverflow( );   // returns dfix::wp or dfix::st
a.TypeRound( );      // returns dfix::fl or dfix::rd
// check if two dfixes are identical in value and
quantisation
identical(a,b);
// see wether a is floating or fixed point
a.TypeMode( ); // returns dfix::fixpoint or dfix::floatpoint
a.isDouble( );
a.isFix( );
// write a to cout
cout << a;
// write a to stdout, in float format,
// on a field of 10 characters
write (cout, a, 'f', 10);
// now use a fixed-format
write (cout, a, 'g', 10);
// next assume a is a fixed point number, and write out an
// integer representation (considering the decimal point at
// the lsb of a) use a hexadecimal format
write (cout, a, 'x', 10);
// use a binary format
write (cout, a, 'b', 10);
// use a decimal format
write (cout, a, 'd', 10);
// read a from stdin
cin >> a;
```

Communication

Apart from values, OCAPI is concerned with the communication of values in between blocks of behavior. The high level method of communication in OCAPI is a FIFO queue, of type "dfbfix". This queue is conceptually infinite in length. In practice it is bounded by a sysop phonecall telling that you have wasted up all the swap space of the system.

The dfbfix Class
A queue is declared as
dfbfix a("a");

This creates a queue with name a. The queue is intented to pass value objects of the type "dfix". There is also an alias type of "dfbfix", known as "FB" (flow buffer). So you can also write FB a("a");
The dfbfix Operations
The basic operations on a queue allow to store and retrieve "dfix" objects. The operations are

```
dfix k;
dfix j(0.5);
dfbfix a("a");
// insert j at the front of a
a.put(j);
// operator format for an insert
a << j;
// insert j at position 5, with position 0 corresponding to
// the front of a.
a.putIndex(j,5);
// read one element from the back of a
k = a.get( );
// operator format for a read
a >> j;
// peek one element at position 1 of a
k = a.getIndex(1);
// operator format for peek
k = a[1];
```

-continued

```
// retrieve one element from a and throw it
a.pop( );
// throw all elements, if any, from a
a.clear( );
// return the number of elements in a as an int
int n = a.getSize( );
// return the name of the queue
char *p = a.name( );
```

Whenever you perform an access operation that reads past the end of a FIFO, a runtime error results, showing
Queue Underflow @ get in queue a
Utility Calls for dfbfix
Besides the basic operations on queues, there are some additional utiliy operations that modify a queue behavior

```
// make a queue of length 20. The default length of a queue
// is 16. Whenever this length is exceeded by a put, the
// storage in the queue is dynamically expanded by a factor
// of 2.
dfbfix a("a", 20);
// After the asType( ) call, the queue will have an input
// "quantizer" that will quantize each element inserted
// into the queue to that of the quantizer type
dfix q(0, 10, 8);
a.asType(q);
// After an asDebug( ) call, the queue is associated with a
// file, that will collect every value written into the
// queue. The file is opened as the queue is initialized
// and closed when the queue object is destroyed.
a.asDebug ("thisfile.dat");
// Next makes a duplicate queue of a, called b. Every write
// into a will also be done on b. Each queue is allowed to
// have at most ONE duplicate queue.
dfbfix b("b");
a.asDup(b);
// Thus, when another duplicate is needed, you write is as
dfbfix c("c");
b.asDup(c);
```

During the communication of "dfix" objects, the queues keep track of some statistics on the values that are passed through it. You can use the "<<" operator and the member function "stattitle( )" to make these statistics visible.
The next program demonstrates these statistics

```
include "qlib.h"
void main( )
{
dfbfix a ("a");
a << dfix(2);
a << dfix(1);
a << dfix(3);
a.stattitle(cout);
cout << a;
}
```

When running this program, the following appears on screen

| Name | put | get | MinVal | @idx | MaxVal | @idx | Max# | ®idx |
|------|-----|-----|--------|------|--------|------|------|------|
| A | 3 | 0 | 1.0000e+00 | 2 | 3.0000e+00 | 3 | 3 | 3 |

The first line is printed by the "stattitle( )" call as a mnemonic for the fields printed below. The next line is the result of passing the queue to the standard output stream object. The fields mean the following:

| | |
|---|---|
| Name | The name of the queue |
| put | The total number of elements "put ( )" into the queue |
| get | The total number of elements "get ( )" from the queue |
| MinVal | The lowest element put onto the queue |
| @idx | The put sequential number that passed this lowest element |
| MaxVal | The highest element put onto the queue |
| @idx | The put sequential number that passed this highest element |
| Max# | The maximal queue length that occurred |
| @idx | The put sequential number that resulted ion this maximal queue length |

Globals and Derivatives for dfbfix
There are two special derivates of "dfbfix". Both are derived classes such that you can use them wherever you would use a "dfbfix". Only the first will be discussed here, the other one is related to cycle-true simulation and is discussed in section "Faster Communications".
The "dfbfix_nil" object is like a "/dev/null" drain. Every "dfix" written into this queue is thrown. A read operation from such a queue results in a runtime error.
There are two global variables related to queues. The "listOfFB" is a pointer to a list of queues, containing every queue object you have declared in your program. The member function call "nextFB( )" will return the successor of the queue in the global list. For example, the code snippet

```
dfbfix *r;
for ( r = listOfFB ; r ; r = r->nextFB ( ) )
{
    . . .
}
``` will walk trough all the queues present in the OCAPI program.
The other global variable is "nilFB", which is of the type "dfbfix_nil". It is intended to be used as a global trashcan.
The Basic Block
OCAPI supports the dataflow simulation paradigm. In order to define the actors to the system, one "base" class is used, from which all actors will inherit. In order to do untimed simulations, one should follow a standard template to which new actor classes must conform. In this section, the standard template will be introduced, and the writing style is documented.
Basic Block Include and Code File
Each new actor in the system is defined with one header file and one source code C++ file. We define a standard block, "add", which performs an addition.
The include file, "add.h", looks like

```
#ifndef ADD_H
#define ADD_H
#include "qlib.h"
class add : public base
{
    public:
        add (char *name, FB & _in1, FB & _in2, FB & _o1);
        int run( );
    private:
```

```
        FB *in1;
        FB *in2;
        FB *o1;
};
#endif
```

This defines a class "add", that inherits from "base". The "base" object is the one that OCAPI likes to work with, so you must inherit from it in order to obtain an OCAPI basic block.

The private members in the block are pointers to communication queues. Optionally, the private members should also contain state, for example the tap values in a filter. The management of state for untimed blocks is entirely the responsibility of the user; as far as OCAPI is concerned, it does not care what you use as extra variables.

The public members include a constructor and an execution call "run". The constructor must at least contain a name, and a list of the queues that are used for communication. Optionally, some parameters can be passed, for instance in case of parametrized blocks (filters with a variable number of taps and the like).

The contents of the adder block will be described in "add.cxx".

```
#include "add.cxx"
add::add(char *name, FB & _in1, FB & _in2, FB & _o1):
base(name)
{
    in1 = _in1.asSource(this);
    in2 = _in2.asSource(this);
    o1 = _o1.asSink (this);
}
int add::run( )
{
    // firing rule
    if (in1->getSize( ) < 1)
    return 0;
    if (in2->getSize( ) < 1)
    return 0 ;
    o1->put (in1->get( ) + in2->get( ));
    return 1;
}
```

The constructor passes the name of the object to the "base" class it inherits from. In addition, it initializes private members with the other parameters. In this example, the communication queue pointers are initialized. This is not done through simple pointer assignment, but through function calls "asSource" and "asSink". This is not obligatory, but allows OCAPI to analyze the connectivity in between the basic blocks. Since a queue is intended for point-to-point communication, it is an error to use a queue as input or ouput more then once. The function calls "asSource" and "asSink" keep track of which blocks source/sink which queues. They will return a runtime error in case a queue is sourced or sinked more then once. The constructor can optionally also be used to perform initialization of other private data (state for instance). The "run( )" method contains the operations to be performed when the block is invoked. The behavior is described in an iterative way. The "run" function must return an integer value, 1 if the block succeeded in performing the operation, and 0 if this has failed.

This behavior consists of two parts: a firing rule and an operative part. The firing rule must check for the availability of data on the input queues. When no sufficient data is present (checked with the "getSize( )" member call), it stops execution and returns 0. When sufficient data is present, execution can start. Execution of an untimed behavior can use the different C++ control constructs available. In this example, the contents of the two input queues is read, the result is added and put into the ouput queue. After execution, the value 1 is returned to signal the behavior has completed.

Predefined Standard Blocks: File Sources and Sinks

The OCAPI library contains three predefined standard blocks, which is a file source "src", a file sink "snk", and a ram storage block "ram".

The file sources and sinks define operating system interfaces and allow you to bring file data into an OCAPI simulation, and to write out resulting data to a file. The examples below show various declarations of these blocks. Data in these files is formatted as floating point numbers separated by white space. For output, newlines are used as whitespace.

```
// define a file source block, with name a, that will read
// data from the file "in.dat" and put it into the queue k
dfbfix k("k");
src a("a", k, "in.dat");
// an alternative definition is
dfbfix k("k");
src a ("a", k);
a.setAttr(src::FILENAME, "in.dat");
// which also gives you a complex version
dfbfix k1("k1");
dfbfix k2("k2");
src a ("a", k1, k2);
a.setAttr (src::FILENAME, "in.dat");
// define a sink block b, that will put data from queue o
// into a file "out.dat".
dfbfix o("o");
snk b("b", o, "out.dat");
// an alternative definition is
dfbfix o("o");
snk b("b", o);
b.setAttr (snk::FILENAME, "out.dat");
// which gives one also a complex version
dfbfix o1("o1");
dfbfix o2 ("o2");
snk b("b", o1, o2);
b.setAttr (snk::FILENAME, "out.dat");
// the snk mode has also a matlab-goodie which will format
// output data into a matrix A that can be read in directly
// by Matlab.
dfbfix o("o");
snk b("b", o, "out.m");
b.setAttr (snk::FILENAME, "out.m");
b.setAttr(snk::MATLABMODE, 1);
```

Predefined Standard Blocks: RAM

The ram untimed block is intended to simulate single-port storage blocks at high level. By necessity, some interconnect assumptions had to be made on this block. On the other hand, it is supported all the way through code generation.

OCAPI does not generate RAM cells. However, it will generate appropriate connections in the resulting system netlist, onto which a RAM cell can be connected.

The declaration of a ram block is as follows.

```
// make a ram a, with an address bus, a data input bus, a
// data output bus, a read command line, a write command
// line, with 64 locations
dfbfix address("address");
dfbfix data_in("data_in");
dfbfix data_out("data_out");
dfbfix read_c("read_c");
dfbfix write_c("write_c");
ram a ("a",address,data_in,data_out,write_c,read_c,64);
```

```
// clear the ram
a.clear( );
// fill the ram with the linear sequence data = k1+address
// * k2;
a.fil(k1, k2);
// dump the contents of a to cout
a.show( );
```

The execution semantics of the ram are as follows. For each read or write, an address, a read command and a write command must be presented. If the read command equals "dfix(1)", a read will be performed, and the value stored at the location presented through "address" will be put on "data_out". If the read command equals any other value, a dummy byte will be presented at "data_out". If no read command was presented, no data will be presented on "data_out". For writes, an identical story holds for reads on the "data_in" input: whenever a write command is presented, the data input will be consumed. When the write command equals 1, then the data input will be stored in the location provided through "address". When a read and write command are given at the same time, then the read will be performed before the write. The ram also includes an online "purifier" that will generate a warning message whenever data from an unwritten location is read.

Untimed Simulations

Given the descriptions of one or more untimed blocks, a simulation can be done. The description of a simulation requires the following to be included in a standard C++ "main( )" procedure:

The instantiation of one or more basic blocks.

The instantiation of one or more communication queues that interconnect the blocks The setup of stimuli. Either these can be included at runtime by means of the standard file source blocks, or else dedicated C++ code can be written that fills up a queue with stimuli.

A schedule that drives the execution methods of the basic blocks.

A schedule, in general, is the specification of the sequence in which block firing rules must be tested (and fired if necessary) in order to run a simulation. There has been quite some research in determining how such a schedule can be constructed automatically from the interconnection network and knowledge of the block behavior. Up to now, an automatic mechanism for a general network with arbitrary blocks has not been found. Therefore, OCAPI relies on the designer to construct such a schedule.

Layout of an Untimed Simulation

In this section, the template of the standard simulation program will be given, along with a description of the "scheduler" class that will drive the simulation. A configuration with the "adder" block (described in the section on basic blocks) is used as an example.

```
include "qlib.h"
include "add.h"
void main( )
{
dfbfix i1("i1");
dfbfix i2("i2");
dfbfix o1("o1") ;
src SRC1("SRC1", i1,"SRC1");
src SRC2("SRC2", i2, "SRC2");
add ADD ("ADD", i1, I2, o1);
snk SNK1("SNK1", o1, "SNK1");
schedule S1 ("S1");
S1.next(SRC1);
S1.next(SRC2);
S1.next(ADD );
S1.next(SNK1);
while (S1.run( )) ;
i1.stattitle(cout);
cout << i1;
cout << i2;
cout << o1;
}
```

The simulation above instantiates three communication buffers, that interconnect four basic blocks. The instantiation defines at the same time the interconnection network of the simulation. Three of the untimed blocks are standard file sources and sinks, provided with OCAPI. The "add" block is a user defined one.

After the definition of the interconnection network, a schedule must be defined. A simulation schedule is constructed using "schedule" objects. In the example, one schedule object is defined, and the four blocks are assigned to it by means of a "next( )" member call.

The order in which "next( )" calls are done determines the order in which firing rules will be tested. For each execution of the schedule object "S1" the "run( )" methods of "SRC1", "SRC2", "ADD" and "SNK1" are called, in that order. The execution method of a scheduler object is called "run( )". This function returns an integer, equal to one when at least on block in the current iteration has executed (i.e. the "run( )" of the block has returned one). When no block has executed, it returns zero.

The while loop in the program therefore is an execution of the simulation. Let us assume that the directory of the simulator executable contains the two required stimuli files, "SRC1" and "SRC2". Their contents is as follows

| SRC1 | SRC2 | |
|---|---|---|
| ---- | ---- | -- not present in the file |
| 1 | 4 | -- not present in the file |
| 2 | 5 | |
| 3 | 6 | |

When compiling and running this program, the simulator responds:

\*\*\* INFO: Defining block SRC1
\*\*\* INFO: Defining block SRC2
\*\*\* INFO: Defining block ADD
\*\*\* INFO: Defining block SNK1

| Name | put | get | MinVal | @idx | MaxVal | @idx | Max# | @idx |
|---|---|---|---|---|---|---|---|---|
| i1 | 3 | 3 | 1.0000e+00 | 1 | 3.0000e+00 | 3 | 1 | 1 |
| i2 | 3 | 3 | 4.0000e+00 | 1 | 6.0000e+00 | 3 | 1 | 1 |
| o1 | 3 | 3 | 5.0000e+00 | 1 | 9.0000e+00 | 3 | 1 | 1 | and in addition has created a file "SNK1", containing
SNK1—not present in the file
-----—not present in the file
5.000000e+00
7.000000e+00
9.000000e+00

The "INFO" message appearing on standard output are a side effect of creating a basic block. The table at the end is produced by the print statements at the end of the program.

More on Schedules

If you would examine closely which blocks are fired in which iteration, (for instance with a debugger) then you would find

```
iteration 1
    run SRC1 => i1 contains 1.0
    run SRC2 => i2 contains 4.0
    run ADD  => o1 contains 5.0
    run SNK1 => write out o1
schedule.run( ) returns 1
iteration 2
    run SRC1 => i1 contains 2.0
    run SRC2 => i2 contains 5.0
    run ADD  => o1 contains 7.0
    run SNK1 => write out o1
schedule.run( ) returns 1
iteration 3
    run SRC1 => i1 contains 3.0
    run SRC2 => i2 contains 6.0
    run ADD  => o1 contains 9.0
    run SNK1 => write out o1
schedule.run( ) returns 1
iteration 4
    run SRC1 => at end-of-file, fails
    run SRC2 => at end-of-file, fails
    run ADD  => no input tokens, fails
    run SNK1 => no input tokens, fails
schedule.run( ) returns 0 => end simulation
```

There are two schedule member functions, "traceOn( )" and "traceOff( )", that will produce similar information for you. If you insert
S.traceOn( );
just before the while loop, then you see
*** INFO: Defining block SRC1
*** INFO: Defining block SRC2
*** INFO: Defining block ADD
*** INFO: Defining block SNK1
S1 [SRC1 SRC2 ADD SNK1]
S1 [SRC1 SRC2 ADD SNK1]
S1 [SRC1 SRC2 ADD SNK1]
S1 [ ]

| Name | put | get | MinVal | @idx | MaxVal | @idx | Max# | @idx |
|------|-----|-----|--------|------|--------|------|------|------|
| i1 | 3 | 3 | 1.0000e+00 | 1 | 3.0000e+00 | 3 | 1 | 1 |
| i2 | 3 | 3 | 4.0000e+00 | 1 | 6.0000e+00 | 3 | 1 | 1 |
| o1 | 3 | 3 | 5.0000e+00 | 1 | 9.0000e+00 | 3 | 1 | 1 | appearing on the screen. This trace feature is convenient during schedule debugging.

In the simulation ouput, you can also notice that the maximum number of tokens in the queues never exceeds one. When you had entered another schedule sequence, for example

```
schedule S1("S1");
    S1.next(ADD );
    S1.next(SRC2);
    S1.next(SRC1);
    S1.next(SNK1);
``` then you would notice that the maximum number of tokens on the queues would result in different figures. On the other hand, the resulting data file, "SNK1", will contain exactly the same results. This demonstrates one important property of dataflow simulations: any arbitrary but consistent schedule yields the same results. only the required amount of storage will change from schedule to schedule.

In multirate systems, it is convenient to have different schedule objects and group all blocks working on the same rate in one schedule.

Profiling in Untimed Simulations

Untimed simulations are not targeted to circuit implementation. Rather, they have an explorative character. Besides the queue statistics, OCAPI also enables you to do precise profiling of operations. The requirement for this feature is that You use "schedule" objects to construct the simulation You describe block behavior with "dfix" objects Profiling is by default enabled. To view profiling results, you send the schedule object under consideration to the standard output stream. In the "main" example program given above, you can modify this as

```
include "qlib.h"
include "add.h"
void main( )
{
    ...
    schedule S1("S1");
    ...
    cout << S1;
}
```

When running the simulation, you will see the following appearing on stdout:
*** INFO: Defining block SRC1
*** INFO: Defining block SRC2
*** INFO: Defining block ADD
*** INFO: Defining block SNK1

| Name | put | get | MinVal | @idx | MaxVal | @idx | Max# | @idx |
|------|-----|-----|--------|------|--------|------|------|------|
| i1 | 3 | 3 | 1.0000e+00 | 1 | 3.0000e+00 | 3 | 1 | 1 |
| i2 | 3 | 3 | 4.0000e+00 | 1 | 6.0000e+00 | 3 | 1 | 1 |
| o1 | 3 | 3 | 5.0000e+00 | 1 | 9.0000e+00 | 3 | 1 | 1 |

Schedule S1 ran 4 times:

| | |
|---|---|
| SRC1 | 3 |
| SRC2 | 3 |
| ADD | 3 |
| + | 3 |
| SNK1 | 3 |

For each schedule, it is reported how many times it was run. Inside each schedule, a firing count of each block is given. Inside each block, an operation execution count is given. The simple "add" block gives the rather trivial result that there were three additions done during the simulation.

The gain in using operation profiling is to estimate the computational requirement for each block. For instance, if you find that you need to do 23 multiplications in a block that was fired 5 times, then you would need at least five multipliers to guarantee the block implementation will need only one cycle to execute.

Finally, if you want to suppress operation profiling for some blocks, then you can use the member function call "noOpsCnt( )" for each block. For instance, writing ADD.noOpsCnt( );
suppresses operation profiling in the ADD block.
Implementation The features presented in the previous sections contain everything you need to do untimed, high level simulations. These kind of simulations are useful for initial development. For real implementation, more detail has to be added to the descriptions.

OCAPI makes few assumptions on the target architecture of your system. One is that you target bitparallel and synchronous hardware. Synchronicity is not a basic requirement for OCAPI. The current version however constructs single-thread simulations, and also assumes that all hardware runs at the same clock. If different clocks need to be implemented, then a change to the clock-cycle true simulation algorithm will have to be made. Also, it is assumed that one basic block will eventually be implemented into one processor.

One question that comes to mind is how hardware sharing between different basic blocks can be expressed. The answer is that you will have to construct a basic block that merges the two behaviors of two other blocks. Some designers might feel reluctant to do this. On the other hand, if you have to write down merged behavior, you will also have to think about the control problems that are induced from doing this merging. OCAPI will not solve this problem for you, though it will provide you with the means to express it.

Before code generation will translate a description to an HDL, one will have to take care of the following tasks:

One will have to specify wordlengths. The target hardware is capable of doing bitparallel, fixed point operations, but not of doing floating point operations. One of the design tasks is to perform the quantisation on floating point numbers. The "dfix" class discussed earlier contains the mechanisms for expressing fixed point behavior.

One will have to construct a clock-cycle true description. In constructing this description, one will not have to allocate actual hardware, but rather express which operations one expects to be performed in which clock cycle. The semantical model for describing this is clock cycle true behavior consists of a finite state machine, and a set of signal flow graphs. Each signal flow graph expresses one cycle of implemented behavior. This style of description splits the control operations from data operations in your program. In contrast, the untimed description you have used before has a common representation of control and data.

OCAPI does not force an ordening on these tasks. For instance, one might first develop a clock cycle true description on floating point numbers, and afterwards tackle the quantization issues. This eases verification of the clock-cycle true circuit to the untimed high level simulation.

The final implementation also assumes that all communication queues will be implemented as wiring. They will contain no storage, nor they will be subject to buffer synthesis. In a dataflow simulation, initial buffering values can however be necessary (for instance in the presence of feedback loops). In OCAPI, such a buffer must be implemented as an additional processor that incorporates the required storage. The resulting system dataflow will become deadlocked because of this. The cycle scheduler however, that simulates timed descriptions, is clever enough to look for these 'initial tokens' inside of the descriptions.

In the next sections, the classes that allow you to express clock cycle true behavior are introduced.

Signals and Signal Flowgraphs

Some initial considerations on signals are introduced first.
Hardware Versus Software Software programs always use memory to store variables. In contrast, hardware programs work with signals, which might or might not be stored into a register. This feature can be expressed in OCAPI by using the "_sig" class. Simply speaking, a "_sig" is a "dfix" for which one has indicated whether is needs storage or not.

In implementation, a signal with storage is mapped to a net driven by a register, while an immediate signal is mapped to a net driven by an operator.

Besides the storage issue, a signal also departs from the concept of "scope" one uses in a program. For instance, in a function one can use local variables, which are destroyed (i.e. for which the storage is reclaimed) after one has executed the function. In hardware however, one controls the signal-to-net mapping by means of the clock signal.

Therefore one have to manage the scope of signals. The signal scope is expressed by using a signal flowgraph object, "sfg". A signal flowgraph marks a boundary on hardware behavior, and will allow subsequent synthesis tools to find out operator allocation, hardware sharing and signal-to-net mapping.

The _sig Class and Related Operations

Hardware signals can expressed in three flavors. They can be plain signals, constant signals, or registered signals. The following example shows how these three can be defined.

```
// define a plain signal a, with a floating point dfix
// inside of it.
_sig a("a");
// define a plain signal b, with a fixed point dfix inside
// of it.
_sig b("b", dfix(0,10,8));
// define a registered signal c, with an initial value k
// and attached to a clock ck.
dfix k(0.5);
clk ck;
_sig c("c", ck, k);
// define a constant signal d, equal to the value k
_sig d(k);
```

The registered signals, and more in particular the clock object, are explained more into detail when signal flowgraphs and finite state machines are discussed. This section concentrates on operations that are available for signals.

Using signals and signal operations, one can construct expressions. The signal operations are a subset of the operations on "dfix". This is because there is a hardware operator implementation behind each of these operations.

+, −, *
  Standard addition, subtraction (including unary minus), multiplication
&, |, ^, ~
  Bitwise and, or, exor, and not operators
==, !=, <=, >=, <, >
  Relational operators
<<, >>
  Left and right shifts
s.cassign(s1,s2)
  Conditional assignment with s1 or s2 depending on s
cast(T,s)
  Convert the type of s to the type expressed in "dfix" T
lu(L,s)

Use s as in index into lookuptable L and retrieve msbpos(s)
Return the position of the msb in s
Precision considerations are the same as for "dfix". That is, precision is at most the mantissa precision of a double (53 bits). For the bitwise operations, 32 bits are assumed (a long). "cast", "lu" and "msbpos" are not member but friend functions. In addition, "msbpos" expects fixed-point signals.

```
_sig a("a");
_sig b("b");
_sig c("c");
// some simple operations
c = a + b;
c = a - b;
c = a * b;
// bitwise operations works only on fixed point signals
_sig e(dfix(0xff, 10, 0));
_sig d("d",dfix(0,10,0));
_sig f("f",dfix(0,10,0));
f = d & e;
f = d | e;
f = ~d;
f = d ^ _sig(dfix(3,10,0));
// shifting
// a dfix is automatically promoted to a constant _sig
f = d << dfix (3,8,0);
// conditional assignment
f = (d < dfix(2,10,0)).cassign(e,d);
// type conversion is done with cast
_sig g("g",dfix(0,3,0));
g = cast (dfix(0,3,0), d);
// a lookup table is an array of unsigned long
unsigned long j = {1, 2, 3, 4, 5};
// a lookuptable with 5 elements, 3 bits wide
lookupTable j_lookup ("j_lookup", 5, dfix (0,3,0)) = j;
// find element 2
g = lu(j_lookup, dfix (2,3,0));
```

If one is interested in simulation only, then one should not worry too much about type casting and the like. However, if one intends implementation, then some rules are at hand. These rules are induced by the hardware synthesis tools. If one fails to obey them, then one will get a runtime error during hardware synthesis.

All operators, apart from multiplication, return a signal with the same wordlength as the input signal.

Multiplication returns a wordlength that is the sum of the input wordlengths.

Addition, subtraction, bitwise operations, comparisons and conditional assignment require the two input operands to have the same wordlength.

Some common pitfalls that result of this restriction are the following.

Intermediate results will, by default, not expand wordlength. In contrast, operations on dfix do not loose precision on intermediate results. For example, shifting an 8 bit signal up 8 positions will return you the value of zero, on 8 bits. If you want too keep up the precision, then you must first cast the operation to the desired output wordlength, before doing the shift.

The multiplication operator increases the wordlength, which is not automatically reduced when you assign the result to a signal of smaller with. If you want to reduce wordlength, then you must do this by using a cast operation.

For complex expressions, these type promotion rules look a bit tedious. They are however used because they allow you to express behavior precisely downto the bit level. For example, the following piece of code extracts each of the bits of a three bit signal:

```
_sig threebits(dfix(6,3,0));
dfix bit(0,1,0);
_sig bit2("bit2"), bit1("bit1"), bit0("bit0");
bit2=cast(bit, threebits>>dfix(2));
bit1=cast(bit, threebits>>dfix(1));
bit0=cast(bit, threebits);
```

These bit manipulations were not possible without the given type promotion rules.

For hardware implementation, the following operators are present.

Addition and subtraction are implemented on ripple-carry adder/subtractors.

Multiplication is implemented with a booth multiplier block.

Casts are hardwired.

Shifts are either hardwired in case of constant shifts, or else a barrel shifter is used in case of variable shifts.

Comparisons are implemented with dedicated comparators (in case of constant comparisons), or subtractions (in case of variable comparisons).

Bitwise operators are implemented by their direct gate equivalent at the bit level.

Lookup tables are implemented as PLA blocks that are mapped using two-level or multi-level random logic.

Conditional assignment is done using multiplexers.

Msbit detection is done using a dedicated msbit-detector.

Globals and Utility Functions for Signals

There are a number of global variables that directly relate to the "_sig" class, as well as the embedded "sig" class. In normal circumstances, you do not need to use these functions.

The variables "glbNumberOf_Sig" and "glbNumberOf-Sig" contain the number of "_sig" and "sig" that your program has defined. The variable "glbNumberOfReg" contains the number of "sig" that are of the register type. This represents the word-level register count of your design. The "glbSigHashConflicts" contain the number of hash conflicts that are present in the internal signal data structure organization. If this number is more then, say 5% of "glbNumberOf_Sig", then you might consider knocking at OCAPIs complaint counter. The simulation is not bad if you exceed this bound, only it will go slower.

The variable "glbListOfSig" contains a global list of signals in your system. You can go through it by means of

```
sig *run;
for (run = glbListOfSig; run; run = run->nextsig( ))
{
    . . .
}
```

For each such a "sig", you can access a number of utility member functions.

"isregister( )" returns 1 when a signal is a register.

"isconstant( )" returns 1 when a signal is a constant value.

"isterm( )" returns 1 when you have defined this signal yourself. These are signals which are introduced through "_sig( )" class constructors. OCAPI however also adds signals of its own.

"getname( )" returns the "char *" name you have used to define the signal.

"get_showname( )" returns the "char *" name of the signal that is used for code generation. This is equal to the original name, but with a unique suffix appended to it.

The sfg Class

In order to construct a timed (clocked) simulation, signals and signals expressions must be assigned to a signal flowgraph. A signal flowgraph (in the context of OCAPI) is a container that collects all behavior that must be executed during one clock cycle.

The sfg behavior contains

A set of expressions using signals

A set of inputs and outputs that relate signals to output and input queues

Thus, a signal flowgraph object connects local behavior (the signals) to the system through communications queues. In hardware, the indication of input and output signals also results in ports on your resulting circuit.

A signal flowgraph can be a marker of hardware scope. This is also demonstrated by the following example.

```
_sig a("a");
_sig b("b");
_sig c(dfix(2));
dfbfix A("A");
dfbfix B("B");
// a signal flowgraph object is created
sfg add_two, add_three;
// from now on, every signal expression written down will
// be included in the signal flowgraph add_two
add_two.starts( );
a = b + c;
// You must also give a name to add_two, for code
// generation
add_two << "add_two";
// also, inputs and ouputs have to be indicated.
// you use the input and ouput objects ip and op for this
add_two << ip(b, B);
add_two << op(a, A);
// next expression will be part of add three
add_three.starts( );
a = b + dfix(3);
add_three << "add_three";
add_three << ip(b,B);
add_three << op(a,A);
// you can also to semantical checks on signal flowgraphs
add_two.check( );
add_three.check( );
```

The semantical check warns you for the following specification errors:

Your signal flowgraph contains a signal which is not declared as a signal flowgraph input and at the same time, it is not a constant or a register. In other words, your signal flowgraph has a dangling input.

You have written down a combinatorial loop in your signal flowgraph. Each signal must be ultimately dependent on registered signals, constants, or signal flowgraph inputs. If any other dependency exists, you have written down a combinatorial loop for which hardware synthesis is not possible.

Execution of a Signal Flowgraph

A signal flowgraph defines one clock cycle of behavior. The semantics of a signal flowgraph execution are well defined.

At the start of an execution, all input signals are defined with data fetched from input queues.

The signal flowgraph output signals are evaluated in a demand driven way. That is, if they are defined by an expression that has signal operands with known values, then the ouput has signal is evaluated. Otherwise, the unknown values of the operands are determined first. It is easily seen that this is a recursive process. Signals with known values are: registered signals, constant signals, and signals that have already been calculated in the current execution.

The execution ends by writing the calculated output values to the output queues.

Signal flowgraph semantics are somewhat related to untimed blocks with firing rules. A signal flowgraph needs one token to be present on each input queue. Only, the firing rule on a signal flowgraph is not implemented. If the token is missing, then the simulation crashes. This is a crude way of warning you that you are about to let your hardware evaluate a nonsense result.

The relation with untimed block firing rules will allow to do a timed simulation which consist partly of signal flowgraph descriptions and partly of untimed basic blocks. The section "Timed simulations will treat this more into detail.

Running a Signal Flowgraph by Hand

A signal flowgraph is only part of a timed description. The control component (an FSM) still needs to be introduced. There can however be situations in which you would like to run a signal flowgraph directly. For instance, in case you have no control component, or if you have not yet developed a control description for it.

The "sfg" member function "run( )" performs the execution of the signal flowgraph as described above. An example is used to demonstrate this.

```
include "qlib.h"
void main( )
{
    _sig a("a");
    _sig b("b");
    _sig c(dfix(2));
    dfbfix A("A");
    dfbfix B("B");
    sfg add_two;
    add two.starts( );
    a = b + c;
    add_two << "add_two";
    add_two << ip(b, B);
    add_two << op(a, A);
    add_two.check( );
    B << dfix(1) << dfix(2);
    // running silently
    add_two.eval( );
    cout << A.get( ) << "\n";
    // running with debug information
    add_two.eval(cout);
    cout << A.get( ) << "\n";
    add_two.eval(cout);
}
```

When running this simulation, the following appears on the screen.

```
3.000000e+00
add_two(                    b                    2)
        :                   a                    4
        =>                  a                    4
4.000000e+00
add_two(Queue Underflow @ get in queue B
```

The first line shows the result in the first "eval( )" call. When this call is given an output stream as argument, some additional information is printed during evaluation. For each signal flowgraph, a list of input values is printed. Intermediate signal values are printed after the ":" at the beginning of the line. The output values as they are entered in the ouput queues are printed after the "=>". Finally, the last line shows what happens when "eval( )" is called when no inputs are available on the input queue "B".

For signal flowgraphs with registered signals, you must also control the clock of these signals. An example of an accumulator is given next.

```
include "qlib.h"
void main( )
{
        clk ck;
        _sig a("a",ck,dfix(0));
        _sig b("b");
        dfbfix A("A");
        dfbfix B("B");
        sfg accu;
        accu.starts( );
        a = a + b;
        accu << "accu";
        accu << ip(b, B);
        accu << op(a, A);
        accu.check( );
        B << dfix(1) << dfix(2) << dfix(3);
        while(B.getSize( ))
        {
        accu.eval(cout);
        accu.tick(ck);
        }
}
```

The simulation is controlled in a while loop that will consume all input values in queue "B". After each run, the clock attached to registered signal "a" is triggered. This is done indirectly through the "sfg" member call "tick( )", that updates all registered signals that have been assigned within the scope of this "sfg". Running this simulation results in the following screen ouput

```
accu         (   b    1)
    :            a    0/    1
    =>           a    0/    1
accu         (   b    2)
    :            a    1/    3
    =>           a    1/    3
accu         (   b    3)
    :            a    3/    6
    =>           a    3/    6
```

The registered signal "a" has two values: a present value (shown left of "/"), and a next value (shown right of "/"). When the clock ticks, the next value is copied to the present value. At the end of the simulation, registered signal "a" will contain 6 as its present value. The ouput queue "A" however will contain the 3, the "present value" of "a" during the last iteration.

Finally, if you want to include a signal flowgraph in an untimed simulation, you must make shure that you implement a firing rule that guards the sfg evaluation.

An example that incorporates the accumulator into an untimed basic block is the following.

```
include "qlib.h"
class accu : public base
{
        public:
          accu(char *name, dfbfix &i, dfbfix &o);
          int run( );
        private:
```

```
          dfbfix *ipq;
          dfbfix *opq;
          sfg _accu;
          clk ck;
}
accu::accu(char *name, dfbfix &i, dfbfix &o) : base(name)
{
          ipq = i.asSource(this);
          opq = o.asSink(this);
          _sig a("a",ck,dfix(0));
          _sig b("b");
          _accu.starts( );
          a = a + b;
          _accu << "accu";
          _accu << ip(b, *ipq);
          _accu << op(a, *opq);
          _accu.check( );
}
int accu::run( )
{
          if (ipq->getSize( ) < 1)
          return 0;
          _accu.eval( );
          accu.tick(ck);
}
```

In this example, the signal flowgraph _accu is included into the private members of class _accu.

Globals and Utility Functions for Signal Flowgraphs

The global variable "glbNumberOfSfg" contains the number of "sfg" objects that you have constructed in your present OCAPI program. Given an "sfg( )" object, you have also a number of utility member function calls.

"getname( )" returns the "char *" name of the signal flowgraph.

"merge( )" joins two signal flowgraphs.

"getisig(int n)" returns a "sig *" that indicates which signal corresponds to input number "i" of the signal flowgraph. If 0 is returned, this input does not exist.

"getiqueue(int n)" returns the queue ("dfbfix *") assigned to input number "i" of the signal flowgraph. If 0 is returned, then this input does not exist.

"getosig(int n)" returns a "sig *" that indicates which signal corresponds to output number "i" of the signal flowgraph. If 0 is returned, this output does not exist.

"getoqueue(int n)" returns the queue ("dfbfix *") assigned to output number "i" of the signal flowgraph. If 0 is returned, then this output does not exist.

You should keep in mind that a signal flowgraph is a data structure. The source code that you have written helps to build this data structure. However, a signal flowgraph is not executed by running your source code. Rather, it is interpreted by OCAPI. You can print this data structure by means of the "cg(ostream)" member call.

For example, if you appended
accu.cg(cout);

to the "running-an-sfg-by-hand" example, then the following output would be produced:

```
sfg accu
          inputs      { b_2 }
          outputs     { a_1 }
          code {
               a_1 = a_1_at1 + b_2;
          };
```

Finite State Machines

With the aid of signals and signal flowgraphs, you are able to construct clock-cycle true data processing behavior. On top of this data processing, a control sequencing component can be added. Such a controller allows to execute signal flowgraphs conditionally. The controller is also the anchoring point for true timed system simulation, and for hardware code generation. A signal flowgraph embedded in an untimed block cannot be translated to a hardware processor: you have to describe the control component explicitly.

The ctlfsm and State Classes

The controller model currently embedded in OCAPI is a Mealy-type finite state machine. This type of FSM selects the transition to the next state based on the internal state and the previous output value.

In an OCAPI description, you use a "ctlfsm" object to create such a controller. In addition, you make use of "state" objects to model controller states. The following example shows the use of these objects.

```
include "qlib.h"
void main( )
{
        sfg dummy;
        dummy << "dummy";
        // create a finite state machine
        ctlfsm f;
        // give it a name
        f << "theFSM";
        // create 2 states for it
        state rst;
        state active;
        // give them a name
        rst << "rst";
        active << "active";
        // identify rst as the initial state of
        // ctlfsm f
        f << deflt(rst);
        // identify active as a plain state of ctlfsm
        // f
        f << active;
        // create an unconditional transition from
        // rst to active
        rst << allways << active;
        // allways' is a historical typo and will be
        // replaced by "always" in the future
        // create an unconditional transition from
        // active to active, executing the dummy sfg.
        active << allways << dummy << active;
        // show what's inside f
        cout << f;
}
```

There are two states in this fsm, "rst" and "active". Both are inserted in the fsm by means of the "<<" operator. In addition, the "rst" state is identified as the default state of the fsm, by embedding it into the "deflt" object. An fsm is allowed to have one default state. When the fsm is simulated, then the state at the start of the first clock cycle will be "rst". In the hardware implementation, a "reset" pin will be added to the processor that is used to initialize the fsm's state register with this state.

Two transitions are defined. A transition is written according to the template: starting state, conditions, actions, target state, all of this separated by the "<<" operator. The condition "allways" is a default condition that evaluates to true. It is used to model unconditional transitions.

The last line of the example shows a simple operation you can do with an fsm. By relating it to the output stream, the following will appear on the screen when you compile and execute the example.

```
digraph g
{
        rst [shape=box];
        rst->active;
        active->active;
}
```

This output represent a textual format of the state transition diagram. The format is that of the "dotty" tool, which produces a graphical layout of your state transition diagram.

"dotty" is commercial software available from AT&T.

You cannot simulate a "ctlfsm" object on itself. You must do this indirectly through the "sysgen" object, which is introduced in the section "Timed Simulations".

The cnd Class

Besides the default condition "allways", you can use also boolean expressions of registered signals. The signals need to be registered because we are describing a Mealy-type fsm. You construct conditions through the "cnd" object, as shown in the next example.

```
include "qlib.h"
void main( )
{
        clk ck;
        _sig a("a",ck, dfix(0));
        _sig b("b",ck, dfix(0));
        _sig a_input("a");
        _sig b_input("a");
        dfbfix A("A");
        dfbfix B("B");
        sfg some_operation;
        // some operations go here . . .
        sfg readcond;
        readcond.starts( );
        a = a_input;
        b = b_input;
        readcond << "readcond";
        readcond << ip(a_input,A);
        readcond << ip(binput,B);
        readcond.check( );
        // create a finite state machine
        ctlfsm f;
        f << "theFSM";
        state rst;
        state active;
        state wait;
        rst       << "rst";
        active   << "active";
        wait     << "wait";
        f << deflt(rst);
        f << active;
        f << wait;
        rst       << allways << readcond << active;
        active   << _cnd(a) << readcond << some_operation
                  << wait;
        wait     << (_cnd(a) && _cnd(b)) << readcond
                  << wait;
        wait     <<(!_cnd(a) ||!_cnd (b)) <<readcond<< active;
}
```

A FAQ is why condition signals must be registers, and whether they can be plain signals also. The answer is simple: no, they can't. The fsm control object is a stand-alone machine that must be able to 'boot' every clock cycle. During one execution cycle, it will first select the transition to take (based on conditions), and then execute the signal flowgraphs that are attached to this transition. If "immediate" transition conditions had to be expressed, then the signals should be read in before the fsm transition is made, which is not possible: the execution of an sfg can only be done when a transition is selected, in other words: when the condition signals are known. Besides this semantical consideration, the registered-condition requirement will also prevent you from writing combinatorial control loops at the system level.

The first signal flowgraph "readcond" takes care of reading in two values "a" and "b" that are used in transition conditions. The sfg reads the signals "a" and "b" in through the intermediate signals "a_input" and "b_input". This way, "a" and "b" are explicitly assigned in the signal flowgraph, and the semantical check "readcond.check( )" will not complain about unassigned signals.

The fsm below it defines three states. Besides an initial state "rst" and an operative state "active", a wait state "wait" is defined, that is entered when the input signal "a" is high. This is expressed by the "_cnd(a)" transition condition in the second fsm transition. You must use "_cnd( )" instead of "cnd( )" because of the same reason that you must use "_sig( )" instead of "sig( )": The underscore-type classes are empty boxes that allocate the objects that do the real work for you. This allocation is dynamic and independent of the C++ scope.

Once the wait state is entered, it can leave it only when the signals "a" or "b" go low. This is indicated in the transition condition of the third fsm transition. A "&&" operator is used to express the and condition. If the signals "a" and "b" remain high, then the wait state is not left. The transition condition of the last transition expresses this. It uses the logical not "!" and logical or "||" operators to express this.

The "readcond" signal flowgraph is executed at all transitions. This ensures that the signals "a" and "b" are updated every cycle. If you fail to do this, then the value of "a" and "b" will not change, potentially creating a deadlock.

To summarize, you can use either "always" or a logical expression of "_cnd( )" objects to express a transition condition. The signals use in the condition must be registers. This results in a Mealy-type fsm description Utility Functions for fsm Objects A number of utility functions on the "ctlfsm" and "state" classes are available for query purposes. This is only minimal: The objects are intended to be manipulated by the cycle scheduler and code generators.

```
sfg action;
ctlfsm f;
state s1;
state s2;
f << deflt(s1);
f << s2;
s1 << allways << s2;
s2 << allways << action << s1;
// run through all the state in f
statelist *r;
for (r = f.first; r; r = r->next)
{
    ...
}
// print the nuymber of states in f,
// print the number of transitions in f,
// print the name of f,
// print the number of sfg's in f
cout << f.numstates( ) << "\n";
cout << f.numtransitions( ) << "\n";
cout << f.getname( ) << "\n";
cout << f.numactions( ) << "\n";
// print the name of a state
cout << s1.getname( ) << "\n";
```

The Basic Block for Timed Simulations

Using signals, signal flowgraphs, finite state machines and states, you can construct a timed description of a block.

Having obtained such a description, it is convenient to merge it with the untimed description. This way, you will have one class that allows both timed and untimed simulation. Of course, this merging is a matter of writing style, and nothing forces you to actually have both a timed and untimed description for a block.

The basic block example, that was introduced in the section "The basic block", will now be extended with a timed version. As before, both an include file and a code file will be defined. The include file, "add.h", looks like the following code.

```
#ifndef ADD_H
#define ADD_H
#include "qlib.h"
class add : public base
{
    public:
        add(char *name, FB & _in1, FB & _in2, FB & _o1) ;
            // untimed
            int run( );
            // timed
            void      define( );
            ctlfsm    &fsm( ) {return _fsm};
    private:
        FB *in1;
        FB *in2;
        FB *o1;
        ctlfsm    _fsm;
        sfg _add;
        state    _go;
};
#endif
```

The private members now also contain a control fsm object, in addition to signal flowgraph objects and states. If you feel this is becoming too verbose, you will find help in the section "Faster description using macros", that defines a macro set that significantly accelerates description entry.

In the public members, two additional member functions are declared: the "define( )" function, which will setup the timed description data structure, and the "fsm( )", which returns a pointer to the fsm controller. Through this pointer, OCAPI accesses everything it needs to do simulations and code generation.

The contents of the adder block will be described in "add.cxx".

```
#include "add.h"
add::add(char *name, FB & _in1, FB & _in2, FB & _o1) :
base(name)
{
        in1 = _in1.asSource(this);
        in2 = _in2.asSource(this);
        o1 = _o1.asSink (this);
        define( );
}
int add::run( )
{
        ...
}
void add::define( )
{
        _sig i1("i1");
        _sig i2("i2");
        _sig ot("ot");
        _add << "add";
        _add.starts( );
        ot = i1 + i2;
        _add << ip(i1, *in1);
```

-continued

```
    _add << ip(i2, *in2);
    _add << op(ot, *o1);
    _fsm << "fsm";
    _go << "go";
    _fsm << deflt(_go);
    _go << allways << _add << _go;
}
```

If the timed description, uses also registers, then a pointer to the global clock must also be provided (OCAPI generates single-clock, synchronous hardware). The easiest way is to extend the constructor of "add" with an additional parameter "clk &ck", that will also be passed to the "define" function.

Timed Simulations

By obtaining timed descriptions for you untimed basic block, you are now ready to proceed to a timed simulation. A timed simulation differs from an untimed one in that it proceeds clock cycle by clock cycle. Concurrent behavior between different basic blocks is simulated on a cycle-by-cycle basis. In contrast, in an untimed simulation, this concurrency is present on an iteration by iteration basis.

The sysgen Class

The "sysgen" object is for timed simulations the equivalent of a "scheduler" object for untimed simulations. In addition, it also takes care of code and testbench generation, which explains the name.

The sysgen class is used at the system level. The timed "add" class, defined in the previous section, is used as an example to construct a system which uses untimed file sources and sinks, and a timed "add" class.

```
include "qlib.h"
include "add.h"
void main( )
{
        dfbfix i1("i1");
        dfbfix i2("i2");
        dfbfix o1("o1");
        src SRC1("SRC1", i1, "SRC1");
        src SRC2("SRC2", i2,"SRC2");
        add ADD ("ADD", i1, i2, o1);
        snk SNK1("SNK1", o1, "SNK1");
        sysgen S1("S1");
        S1 << SRC1;
        S1 << SRC2;
        S1 << ADD.fsm( );
        S1 << SNK1;
        S1.setinfo(verbose);
        clk ck;
        int i;
        for (i=0; i<3; i++)
        {
        S1.run(ck);
        }
}
```

The simulation is set up as before with queue objects and basic blocks. Next, a "sysgen" object is created, with name "S1". All basic blocks in the simulation are appended to the "sysgen" objects by means of the $<<$ operator. If a timed basic block is to be used, as for instance in case of the "add" object, then the "fsm( )" pointer must be presented to "sysgen" rather then the basic block itself. A "sysgen" object knows how to run and combine both timed and untimed objects. For the description shown above, untimed versions of the file sources and sink "src" and "snk" will be used, while the timed version of the "add" object will be used.

Next, three clock cycles of the system are run. This is done by means of the "run(ck)" member function call of "sysgen". The clock object "ck" is, because this simulation contains no registered signals, a dummy object. When running the simulator executable with stimuli file contents

| SRC1 | SRC2 | |
|------|------|---|
| ---- | ---- | -- not present in the file |
|      |      | -- not present in the file |
| 1    | 4    | |
| 2    | 5    | |
| 3    | 6    | | you see the following appearing on the screen.
*** INFO: Defining block SRC1
*** INFO: Defining block SRC2
*** INFO: Defining block ADD
*** INFO: Defining block SNK1

| | | |
|---|---|---|
| fsm fsm: transition from go to go | | |
| add#0 | | |
| add#1 | | |
| in | i1 | 1 |
| in | i2 | 4 |
| sig | ot | 5 |
| out' | ot | 5 |
| fsm fsm: transition from go to go | | |
| add#0 | | |
| add#1 | | |
| in | i1 | 2 |
| in | i2 | 5 |
| sig | ot | 7 |
| out' | ot | 7 |
| fsm fsm: transition from go to go | | |
| add#0 | | |
| add#1 | | |
| in | i1 | 3 |
| in | i2 | 6 |
| sig | ot | 9 |
| out' | ot | 9 |

The debugging output produced is enabled by the "setinfo( )" call on the "sysgen" object. The parameter "verbose" enables full debugging information. For each clock cycle, each fsm responds which transition it takes. The fsm of the "add" block is called "fsm", an as is seen it makes transitions from the single state "go" to the obvious destination. Each signal flowgraph during this simulation is executed in two phases (below it is indicated why). During simulation, the value of each signal is printed.

Selecting the Simulation Verbosity

The "setinfo" member function call of "sysgen" selects the amount of debugging information that is produced during simulation. Four values are available:

"silent" will cause no output at all. This can significantly speed up your simulation, especially for large systems containing several hundred of signal flowgraphs.

"terse" will only print the transitions that fsm's make.

"verbose" will print detailed information on all signal updates.

"regcontents" will print a list the values of registered signals that change during the current simulation. This is by far the most interesting option if you are debugging at the system level: when nothing happens, for instance when all your timed descriptions are in some "hold" mode, then no ouput is produced. When there is a lot of activity, then you will be able to track all registered signals that change.

This example is part of a simulation containing 484 registerd signals and 483 signal flowgraphs. Using "setinfo (verbose)" here might require a good text editor to see what is happening—if anything will happen before your quota is exceeded.

For instance, the code fragment

```
sysgen S("S");
S.setinfo(regcontents);
int cycle;
for (cycle=0; cycle < 100; cycle++)
{
        cout << "> Cycle " << cycle << "\n";
        S.run(ck);
}
``` can produce an output as shown below.

```
> Cycle 18
                coef_ram_ir_2        0    1
                copy_step_flag       1    0
                ext_ready_out        1    0
                pc                  15   16
                step_flag            1    0
> Cycle 19
                coef_ram_ir_2        1    0
                coef_wr_adr         12   13
                hold_pc              0   16
                pc                  16   17
                pc_ctl_ir_1          1    0
> Cycle 20
                step_clock           0    1
> Cycle 21
                copy_step_flag       0    1
                prev_step_clock      0    1
                step_flag            0    1
```

Three Phases are Better

Although you will be saved from the details behind two-phase simulation, it is worthwhile to see the motivation behind it.

When you run an "sfg" "by hand" using the "run( )" method of an "sfg", the simulation proceeds in one phase: read inputs, calculate, produce ouput. The "sysgen" object, on the other hand, uses a two-phase simulation mechanism.

The origin is the following. In the presence of feedback loops, your system data flow simulation will need initial values on the communication queues in order to start the simulation. However, the code generator assumes the communication queues will translate to wiring. Therefore, there will never be storage in the implementation of a communication queue to hold these intitial values. OCAPI works around this by producing these initial values at runtime. This gives rise to a three-phase simulation: in the first phase, initial values are produced, while in the second phase, they are consumed again. This process repeats every clock cycle.

The three-phase simulation mechanism is also able to detect combinatorial loops at the system level. If there exists such a loop, then the first phase of the simulation will not produce any initial value on the system interconnect. Consequently, in the last phase there will be at least one signal flowgraph that will not be able to complete execution in the current clock cycle. In that case, OCAPI will stop the simulation. Also, you get a list of all signal flowgraphs that have not completed the current clock cycle, in addition to the queue statistics that are attached to these signal flowgraphs.

Hardware Code Generation

OCAPI allows you to translate all timed descriptions to a synthesizable hardware description.

For each timed description, you get a datapath ".dsfg" file, that can be entered into the Cathedral-3 datapath synthesis environment, converted to VHDL and postprocessed by Synopsys-dc logic synthesis.

For each timed description, you also get a controller ".dsfg" file, which is synthesized through the same environment.

You also get a glue cell, that interconnects the resulting datapath and controller VHDL file.

You get a system interconnect file, that integrates all glue cells in your system. For this system interconnect file, you optionally can specify system inputs and outputs, scan chain interconnects, and RAM interconnects. The file is VHDL.

Finally, you also get debug information files, that summarize the behavior of and ports on each processor.

Untimed blocks are not translated to hardware. The use of the actual synthesis environments will not be discussed in this section. It is assumed to be known by a person skilled in the art.

The generate( ) Call

The member call "generate( )" performs the code generation for you. In the adder example, you just have to add S1.generate( );

at the end of the main function. If you would compile this description, and run it, then you would see things are not quite OK:

\*\*\* INFO: Generating Systen Link Cell
\*\*\* INFO: Component generation for S1
\*\*\* INFO: C++ currently defines 5 sig, 4 _sig, 1 sfg.
\*\*\* INFO: Generating FSMD fsm
\*\*\* INFO: FSMD fsm defines 1 instructions
DSFGgen: signal i1 has no wordlength spec.
DSFGgen: signal i2 has no wordlength spec.
DSFGgen: signal ot has no wordlength spec.
DSFGgen: not all signals were quantized. Aborting.
\*\*\* INFO: Auto-cleanup of sfg Indeed, in the adder example up to now, nothing has been entered regarding wordlengths. During code generation, OCAPI does quite some consistency checking. The general advice in case of warnings and errors is: If you see an error or warning message, investigate it. When you synthesize code that showed a warning or error during generation, you will likely fail in the synthesis process too.

The "add" description is now extended with wordlengths. 8 bit wordlengths are chosen. You modify the "add" class to include the following changes.

```
void add::define( )
{
        dfix wl(0,8,0);
        _sig i1("i1",wl);
        _sig i2("i2",wl);
        _sig ot("ot",wl) ;
        . . .
}
```

After recompiling and rerunning the OCAPI program, you now see:

\*\*\* INFO: Generating Systen Link Cell
\*\*\* INFO: Component generation for S1
\*\*\* INFO: C++ currently defines 5 sig, 4 _sig, 1 sfg.
\*\*\* INFO: Generating FSMD fsm
\*\*\* INFO: FSMD fsm defines 1 instructions
\*\*\* INFO: C++ currently defines 31 sig, 21 _sig, 3 sfg.
\*\*\* INFO: Auto-cleanup of sfg In the directory where you ran this, you will find the following files:

"fsm_dp.dsfg", the datapath description of "add"
"fsm_fsm.dsfg", the controller description of "add"
"fsm.vhd", the glue cell description of add
"S1.vhd", the system interconnect cell
"fsm.ports", a list of the I/O ports of "add".

The glue cell "fsm.vhd" has the following contents (only the entity declaration part is shown).
Cath3 Processor for FSMD design fsm

```
library IEEE;
use IEEE.std_logic_1164.all;
entity fsm is
        port (
          reset: in std_logic;
          clk: in std_logic;
          i1: in std_logic_vector(7 downto 0);
          i2: in std_logic_vector(7 downto 0);
          ot: out std_logic_vector(7 downto 0)
        );
end fsm;
```

Each processor has a reset pin, a clock pin, and a number of I/O ports, depending on the inputs and ouputs defined in the signal flowgraphs contained in this processor. All signals are mapped to "std_logic" or "std_logic_vector". The reset pin is used for synchronous reset of the embedded finite state machine. If you need to initialize registered signals in the datapath, then you have to describe this explicitly in a signal flowgraph, and execute this upon the first transition out of the initial state.

The "fsm.ports" file, indicates which ports are read in in each transition. In the example of the "add" class, there is only one transition, which results in the following ".ports" file

| ********** SFG fsmgogo0 ********** | | | |
|---|---|---|---|
| Port # | I/O | Port | Q |
| 1 | I | i1 | i1 |
| 2 | I | i2 | i2 |
| 1 | O | ot | o1 |

The name of an input or output signal is used as a port name, while the name of the queue associated to it relates to the system net name that will be connected to this port.

System Cell Refinements

The system link cell incorporates all glue cells of your current timed system description. These glue cells are connected if they read/write from the same system queue. There are some refinements possible on the "sysgen" object that will also allow you to indicate system level inputs and ouputs, scan chains, and RAM connections.

System inputs and ouputs are indicated with the "inpad( )" and "outpad( )" member calls of "sysgen". In the example, this is specified as

```
...
sysgen S1 ("S1");
dfix b8 (0,8,0);
S1.inpad(i1, b8);
S1.inpad (i2, b8);
S1.outpad (o1, b8);
```

Making these connections will make the "i1", "i2", "o1" signals appear in the entity declaration of the system cell "S1". The entity declaration inside of the file "S1.vhd" thus looks like

```
entity S1 is
        port (
          reset:     in std_logic;
          clk: in std_logic;
          i1: in std_logic_vector(7 downto 0);
          i2: in std_logic_vector(7 downto 0);
          o1: out std_logic_vector(7 downto 0)
        );
end S1;
```

Scan chains can be added at the system level, too. For each scan chain you must indicate which processors it should include. Suppose you have three basic blocks (including a timed description and registers) with names "BLOCK1", "BLOCK2", "BLOCK3". You attach the blocks to two scan chains using the following code.

```
scanchain SCAN1("scan1");
scanchain SCAN2("scan2");
SCAN1.addscan(& BLOCK1. fsm( ));
SCAN1.addscan(& BLOCK2. fsm( ));
SCAN2.addscan(& BLOCK3. fsm( ));
```

The "sysgen" object identifies the required scan chain connections through the "fsm" objects that are assigned to it. In order to have reasonable circuit test times, you should not include more then 300 flip-flops in each scan chain. If you have a processor that contains more then 300 flip-flops, then you should use another scan chain connection strategy.

Finally, you can generate code for the standard untimed block RAM. There are two possible interconnection mechanisms: the first will include the untimed RAM blocks in "sysgen" as internal components of the system link cell. The second will include the RAM blocks as external components. This latter method requires you to construct a new "system-system link cell", that includes the RAM entities and the system link cell in a larger structure. However, it might be required in case you have to remap the standard RAM interface, or introduce additional asynchronous timing logic.

An example of the two methods is shown next

```
ram RAM1("ram1", addr1, di1, do1, wr, rd, 128);
ram RAM2("ram2", addr2, di2, do2, wr, rd, 128);
// types of address and data bus
dfix addrtype(0, 7, 0);
dfix dattype(0, 4, 0);
sysgen S1 ("S1");
// define an external ram
S1.extern_ram(RAM1, addrtype, dattype);
// define an internal ram
S1.intern_ram(RAM2, addrtype, dattype);
```

Pitfalls for Code Generation

As always, there are a number of pitfalls when things get complex. You should watch the following when diving into code generation.

OCAPI generates nicely formatted code, that you can investigate. To help you in this process, also the actual signal names that you have specified are regenerated in the VHDL and DSFG code. This implies that you have to stay away from VHDL and DSFG keywords, or else you will get an error from either Cathedral-3 or Synopsys.

The mapping of the fixed point library to hardware is, in the present release, minimal. First of all, although registered signals allow you to specify an initial value, you cannot rely on this for the hardware circuit. Registers, when powered on, take on a random state. Therefore, make sure that you specify the initialization sequence of your datapath. A second fixed point pitfall is that the hardware support for the different quantization schemes is lacking. It is assumed that you finally will use truncated quantization on the lsb-side and wrap-around quantization on the msb-side of all signals. The other quantization schemes require additional hardware to be included. If you really need, for instance, saturated msb quantization, then you will have to describe it in terms of the default quantization.

Finally, the current set of hardware operators in Cathedral-3 is designed for signed representations. They work with unsigned representations also as long as you do no use relational operations (<, > and the like). In this last case, you should implement the unsigned operation as a signed one with one extra bit.

Verification and Testbenches

Once you have obtained a gate level implementation of your circuit, it is necessary to verify the synthesis result. OCAPI helps you with this by generating testbenches and testbench stimuli for you while you run timed simulations and do code generations.

The example of the "add" class introduced previously is picked up again, and testbench generation capability is included to the OCAPI description.

Generation of Testbench Vectors

The next example performs a three cycle simulation of the "add" class and generates a testbench vectors for it.

```
include "qlib.h"
void main( )
{
        dfbfix i1("i1");
        dfbfix i2("i2");
        dfbfix o1("o1");
        src SRC1("SRC1", i1, "SRC1");
        src SRC2("SRC2", i2, "SRC2");
        add ADD("ADD", i1, i2, o1);
        snk SNK1("SNK1", o1, "SNK1");
        sysgen S1("S1");
        S1 << SRC1;
        S1 << SRC2;
        S1 << ADD.fsm( );
        S1 << SNK1;
        ADD.fsm( ).tb_enable( );
        clk ck;
        int i;
        for (i=0; i<3; i++)
        S1.run(ck);
        ADD.fsm( ).tb_data( );
}
```

Just before the timed simulation starts, you enable the generation of testbench vectors by means of a "tb_enable( )" member call for each fsm that requires testbench vectors.

During simulation, the values on the input and ouput ports of the "add" processor are recorded. After the simulation is done, the testbenches are generated using a "tb\_data( )" member function call.

Testbench generation leaves three data files behind:

"fsm_tb.dat" contains binary vectors of all inputs of the "add" processor. It is intended to be read in by the VHDL simulator as stimuli.

"fsm_tb.dat_hex" contains hexadecimal vectors of all inputs and outputs of the "add" processor. It contains the output that should be produced by the VHDL simulator when the synthesis was successful.

"fsm_tb.dat_info" documents the contents of the stimuli files by saying which stimuli vector corresponds to which signal When compiling and running this OCAPI program, the following appears on screen.

*** INFO: Defining block SRC1
*** INFO: Defining block SRC2
*** INFO: Defining block ADD
*** INFO: Defining block SNK1
*** INFO: Creating stimuli monitor for testbench of FSMD fsm
*** INFO: Generating stimuli data file for testbench fsm_tb.
*** INFO: Testbench fsm_tb has 3 vectors.

Afterwards, you can take a look at each of the three generated testbenches.

```
-- file: fsm_tb.dat
00000001 00000100
00000010 00000101
00000011 00000110
-- file: fsm_tb.dat_hex
01 04 05
02 05 07
03 06 09
-- file: fsm_tb.dat_info
Stimuli for fsm_tb contains 3 vectors for
        i1_stim          read
        i2_stim          read
```

Next columns occur only in _hex.dat file and are outputs o1_stim write

You can now use the vectors in the simulator. But first, you must also generate a testbench driver in VHDL.

Generation of Testbench Drivers

To generate a testbench driver, simply call the "tb_enable( )" member function of the "add" fsm before you initiate code generation. You will end up with a VHDL file "fsm_tb.vhd" that contains the following driver.

Test Bench for FSMD Design fsm

```
library IEEE;
use IEEE.std_logic_1164.all;
use IEEE.std_logic_textio.all;
use std.textio.all;
library clock;
use clock.clock.all;
entity fsm_tb is
end fsm_tb;
architecture rtl of fsm_tb is
    signal reset: std_logic;
    signal clk:std_logic;
    signal i1: std_logic_vector(7 downto 0);
    signal i2: std_logic_vector(7 downto 0);
    signal ot: std_logic_vector(7 downto 0);
    component fsm
        port (
            reset: in std_logic;
            clk: in std_logic;
```

-continued

```
            i1: in std_logic_vector(7 downto 0);
            i2: in std_logic_vector(7 downto 0);
            ot: out std_logic_vector(7 downto 0)
            );
    end component;
begin
crystal(clk, 50 ns);
fsm_dut: fsm
    port map (
        reset => reset,
        clk => clk,
        i1 => i1,
        i2 => i2,
        ot => ot
        );
ini:    process
        begin
        reset <= '1';
        wait until clk'event and clk = '1';
        reset <= '0';
        wait;
        end process;
input:      process
            file stimuli : text is in "fsm_tb.dat"
            variable aline : line;
            file stimulo : text is out "fsm_tb.sim_out";
            variable oline : line;
            variable v_i1: std_logic_vector(7 downto 0);
            variable v_i2: std_logic_vector(7 downto 0);
            variable v_ot: std_logic_vector(7 downto 0);
            variable v_i1_hx: std_logic_vector(7 downto 0);
            variable v_i2_hx: std_logic_vector(7 downto 0);
            variable v_ot_hx: std_logic_vector(7 downto 0);
            begin
            wait until reset'event and reset = '0';
            loop
            if(not(endfile(stimuli))) then
                readline(stimuli, aline);
                read(aline, v_i1);
                read(aline, v_i2);
            else
                assert false
                report "End of input file reached"
                severity warning;
            end if;
            i1 <= v_i1;
            i2 <= v_i2;
            wait for 50 ns;
            v_ot := ot;
            v_i1_hx := v_i1;
            v_i2_hx := v_i2;
            v_ot_hx := v_ot;
            hwrite(oline, v_i1_hx);
            write(oline, ' ');
            hwrite(oline, v_i2_hx);
            write(oline, ' ');
            hwrite(oline, v_ot_hx);
            write(oline, ' ');
            writeline (stimulo, oline);
            wait until clk'event and clk = '1';
        end loop;
    end process;
end rtl;
configuration tbc_rtl of fsm_tb is
for rtl
    for all : fsm
        use entity work.fsm(structure);
    end for;
end for;
end tbc_rtl;
```

The testbench uses one additional library, "clock", which contains the "crystal" component. This component is a simple clock generator that drives a 50% duty cycle clk.

This testbench will generate a file "fsm_tb.sim_out". After running the testbench in VHDL, this file should be exactly the same as the "fsm_tb.dat_hex". You can use the unix "diff" command to check this. The only possible differences can occur in the first few simulation cycles, if the VHDL simulator initializes the registers to "X".

Using automatic testbench generation greatly speedups the verification process. You should consider using it whenever you are into code generation.

Compiled Code Simulations

For large designs, simulation speed can become prohibitive. The restricting factor of OCAPI is that the signal flowgraph data structures are interpreted at runtime. In addition, runtime quantization (fixed point simulation) takes up quite some CPU power.

OCAPI allows you to generate a dedicated C++ simulator, that runs compiled code instead of interpreted code. Also, additional optimizations are done on the fixed point simulation. The result is a simulator that runs one to two orders of magnitude faster then the interpreted OCAPI simulation. This speed increase adds up to the order of magnitude that interpreted OCAPI already gains over event-driven VHDL simulation.

As an example, a 75 Kgate design was found to run at 55 cycles per second (on a HP/9000). This corresponds to "4.1 million" gates per second, and motivates why C++ is the way to go for system synthesis.

Generating a Compiled Code Simulator

The compiled code generator is integrated into the "sysgen" object. There is one member function, "compiled( )", that will generate this simulator for you.

```
include "qlib.h"
include "add.h"
void main( )
{
    dfbfix i1("i1");
    dfbfix i2("i2");
    dfbfix o1("o1");
    add ADD("ADD", i1, i2, o1);
    sysgen S1("S1");
    S1 << ADD.fsm( );
    S1.compiled( );
}
```

In this simple example, a compiled code generator is made for a design containing only one FSM. The generator allows to include several fsm blocks, in addition to untimed blocks.

When this program is compiled and run, it leaves behind a file "S1_ccs.cxx", that contains the dedicated simulator. For the OCAPI user, the simulator defines one procedure, "one_cycle( )", that simulates one cycle of the system.

When calling this procedure, it also produces debugging ouput similar to the "setinfo(regcontents)" call for "ctlfsm" objects. This procedure must be linked to a main program that will execute the simulation.

If an untimed block is present in the system, then it will be included in the dedicated simulator. In order to declare it, you must provide a member function "CCSdecl(ofstream &)" that generates the required C++ declaration. As an example, the basic RAM block declares itself as follows:

```
-- file: ram.h
class ram : public base
{
public:
    . . .
    ram (char * name,
```

```
                FB& _address,
                FB& _data_in,
                FB& _data_out,
                FB& _w,
                FB& _r,
                int _size);
            void CCSdecl(ofstream &os;);
        ...
    private:
        ...
};
-- file: ram.cxx
void ram::CCSdecl(ofstream &os;)
{
    os << " #include \"ram.h\"\n";
    os << " ram " << typeName( ) << "(";
    os << "\"" << typeName( ) << "\",";
    os << address.name( ) << ", ";
    os << data_in.name( ) << ",";
    os << data_out.name( ) << ",";
    os << w.name( ) << ",";
    os << r.name( ) << ",";
    os << size << ");\n";
}
```

This code enables the ram to reproduce the declaration by which it was originally constructed in the interpreted OCAPI program. Every untimed block that inherits from "base", and that you whish to include in the compiled code simulator must use a similar "CCSdecl" function.

Compiling and Running a Compiled Code Simulator

The compiled code simulator is compiled and linked in the same way as a normal OCAPI program. You must however also provide a "main" function that drives this simulator.

The following code contains an example driver for the "add" compiled code simulator.

```
include "qlib.h"
void one_cycle( );
extern FB i1;
extern FB i2;
extern FB o1;
void main( )
{
    i1 << dfix(1) << dfix(2) << dfix(3);
    i2 << dfix(4) << dfix(5) << dfix(6);
    one_cycle( );
    one_cycle( );
    one_cycle( );
    while(o1.getSize( ))
        cout << o1.get( ) << "\n";
}
```

When run, this program will produce the same results as before. In contrast to the compiled simulaton of your MPEG-4 image processor, you will not be able to notice any speed increase on this small example.

Faster Communications

OCAPI uses queues as a means to communicate during simulation. These queues however take up CPU power for queue management. To save this power, there is an additional queue type, "wireFB", which is used for the simulation of point-to-point wiring connections.

The dfbfix_wire Class

A "wireFB" does not move data. In contrast, it is related to a registered driver signal. At any time, the value read of this queue is the value defined by the registered signal. Because of this signal requirement, a "wireFB" cannot be used for untimed simulations. The following example of an accumulator shows how you can use a "wireFB", or the equivalent "dfbfix_wire".

```
include "qlib.h"
void main( )
{
    clk ck;
    _sig a("a",ck,dfix(0));
    _sig b("b");
    dfbfix_wire A("A",a);
    dfbfix B("B");
    sfg accu;
    accu.starts( );
    a = a + b;
    accu << "accu";
    accu << ip(b, B);
    accu << op(a, A);
    accu.check( );
    B << dfix(1) << dfix(2) << dfix(3);
    while (B.getSize( ))
    {
        accu.eval(cout);
        accu.tick(ck);
    }
{
```

A "wireFB" is identical in use as a normal "FB"}. Only, for each "wireFB", you indicate a registered driver signal in the constructor.

Interconnect Strategies

The "wireFB" object is related to the interconnect strategy that you use in your system. An interconnect strategy includes a decision on bus-switching, bus-storage, and bus-arbitration. OCAPI does not solve this problem for you: it depends on your application what the right interconnection strategy is.

One default style of interconnection provided by OCAPI is the point-to-point, register driven bus scheme. This means that every bus carries only one signal from one processor to another. In addition, bus storage in included in the processor that drives the bus.

More complex interconnect strategies, like the one used in Cathedral-2, are also possible, but will have to be described in OCAPI explicitly. Thus, the freedom of target architecture is not without cost. In the section "Meta-code generation", a solution to this specification problem is presented.

Meta-code Generation

OCAPI internally uses meta-code generation. With this, it is meant that there are code generators that generate new "fsm", "sfg" and "sig" objects which in turn can be translated to synthesizable code.

Meta-code generation is a powerful method to increase the abstraction level by which a specification can be made. This way, it is also possible to make parametrized descriptions, eventually using conditions. Therefore, it is the key method of soft-chip components, which are software programs that translate themselves to a wide range of implementations, depending on the user requirements.

The meta-code generation mechanism is also available to the user. To demonstrate this, a class will be presented that generates an ASIP datapath decoder.

An ASIP Datapath Idiom

An ASIP datapath, when described as a timed description within OCAPI, will consist of a number of signal flowgraphs and a finite state machine. The signal flowgraphs express the different functions to be executed by the datapath. The fsm description is a degenerated one, that will use one transition per decoded instruction. The transition condition is expressed by the "instruction" input, and selects the appropriate signal flowgraph for execution.

Because the finite state machine has a fixed, but parametrizable structure, it is subject for meta-code generation. You can construct a "decoder" object, that generates the "fsm" for you. This will allow compact specification of the instruction set.

First, the "decoder" object (which is present in OCAPI) itself is presented.

```
-- the include file
#define MAXINS 100
#include "qlib.h"
class decoder : public base
{
    public:
        decoder(char *_name, clk &ck;, dfbfix &_insq);
        void dec(int _numinstr);
        ctlfsm &fsm;( );
        void dec(int _code, sfg &);
        void dec(int _code, sfg &, sfg &);
        void dec(int _code, sfg &, sfg &, sfg &);
    private:
        char *name;
        clk *ck;
        dfbfix *insq;
        int inswidth;
        int numinstr;
        int codes [MAXINS];
        ctlfsm _fsm;
        state active;
        sfg decode;
        _sigarray *ir;
        cnd * decend(int);
        void decchk(int);
};
-- the .cxx file
#include "decoder.h"
static int numbits(int w)
{
    int bits = 0;
    while (w)
    {
        bits++;
        w = w >> 1;
    }
    return bits;
}
int bitset (int bitnum, int n)
{
    return (n & (1 << bitnum));
}
decoder::decoder(char *_name, clk &_ck;, dfbfix &_insq;)
: base(_name)
{
    name = _name;
    insq = _insq.asSource(this);
    ck = &_ck;
    numinstr = 0;
    inswidth = 0;
    _fsm << _name;
    // active << strapp(name, "_go_");
    active << "go";
    _fsm << deflt(active);
}
void decoder::dec(int n)
{
    // define a decoder that decodes n instructions
    // instruction numbers are 0 to n-1
    // create also the instruction register
    if (! (n>0))
    {
        cerr << "*** ERROR: decoder " << name << " must
        have at least one instruction\n";
        exit (0);
    }
    inswidth = numbits (n-1);
    if (n > MAXINS)
    {
```

-continued

```
        cerr << "*** ERROR: decoder " << name << "
        exceeds decoding capacity\n";
        exit(0);
    }
    dfix bit (0,1,0,dfix::ns);
    ir = new _sigarray((char *) strapp(name, "_ir"),
    inswidth, ck, bit);
    decode.starts( );
    int i;
    SIGW(irw, dfix(0, inswidth, 0, dfix::ns));
    for (i=0; i<inswidth; i++)
    {
        if(i)
        (*ir)[i] = cast (bit, irw >>
        _sig(dfix(i, inswidth, 0,dfix::ns)));
        else
        (*ir)[i] = cast (bit, irw);
    }
    decode << strapp("decod", name);
    decode << ip(irw, *insq);
}
void decoder::decchk(int n)
{
    // check if the decoder can decode this instruction
    int i;
    if (!inswidth)
    {
        cerr << "*** ERROR: decoder " << name << " must
        first define an instruction width\n";
        exit (0);
    }
    if (n > ((1 << inswidth)-1))
    {
        cerr << "*** ERROR: decoder " << name << "
        cannot decode code " << n << "\n";
        exit(0);
    }
    for (i=0; i<numinstr; i++)
    {
        if (n == codes[i])
        {
            cerr << "*** ERROR: decoder " << name << "
            decodes code " << n << " twice\n";
            exit (0);
        }
    }
    codes [numinstr] = n;
    numinstr++;
}
cnd *decoder::decend(int n)
{
    // create the transition condition that corresponds
    // to the instruction number n
    int i;
    cnd *cresult = 0;
    if (bitset(0, n))
        cresult = &_cnd;(((*ir)[0]));
    else
        cresult = &(!_cnd(((*ir)[0]));
    for (i = 1; i < inswidth; i++)
    {
        if (bitset(i, n))
            cresult = &(*cresult && _cnd((*ir)[i]));
        else
            cresult = &(*cresult && !_cnd((*ir)[i]));
    }
    return cresult;
}
void decoder::dec(int n, sfg &s;)
{
    // enter an instruction that executes one sfg
    decchk(n);
    active << *decend(n) << decode << s << active;
}
void decoder::dec(int n, sfg &s1;, sfg &s2;)
{
```

```
        // enter an instruction that executes two sfgs
        decchk(n);
        active << *decend(n) << decode << s1 << s2 <<
            active;
    }
    void decoder::dec (int n, sfg &s1, sfg &s2, sfg &s3)
    {
        // enter an instruction that executes three sfgs
        decchk(n);
        active << *decend(n) << decode << s1 << s2 << s3 <<
            active;
    }
    ctlfsm & decoder::fsm( )
    {
        return _fsm;
    }
```

The main principles of generation are the following. Each instruction for the ASIP decoder is defined as a number, in addition to one to three signal flowgraphs that need to be executed when this instruction is decoded. The "decoder" object keeps track of the instruction numbers already used and warns you if you introduce a duplicate. When the instruction number is unique, it is split up into a number of instruction bits, and a fsm transition condition is constructed from these bits.

The ASIP Datapath at Work

The use of this object is quite simple. In a timed description were you want to use the decoder instead of a plain "fsm", you inherit from this decoder object rather then from the "base" class. Next, instead of the fsm description, you give the instruction list and the required signal flowgraphs to execute.

As an example, an add/subtract ASIP datapath is defined. We select addition with instruction number 0, and subtraction with instruction number 1. The following code (that also uses the supermacros) shows the specification. The inheritance to "decoder" also establishes the connection to the instruction queue.

```
-- include file
#ifndef ASIP_DP_H
#define ASIP_DP_H
class asip_dp : public decoder
{
public:
    asip_dp    (char *name,
        clk &ck,
        FB &ins,
        _PRT(in1),
        _PRT(in2),
        _PRT(o1));
private:
    PRT(in1);
    PRT(in2);
    PRT(o1 );
};
-- code file
#include "asip_dp.h"
dfix typ(0,8,0);
asip_dp::asip_dp    (char *name,
        clk &ck,
        FB &ins,
        _PRT(in1),
        _PRT(in2),
        _PRT(o1)) :    decoder(name, ck, ins),
```

```
        IS_SIG(in1, typ),
        IS_SIG(in2, typ),
        IS_SIG(o1, typ)
    {
    IS_IP(in1);
    IS_IP(in2);
    IS_OP(o1);
    SFG(add);
    GET(in1);
    GET(in2);
    o1 = in1 + in2;
    PUT(o1);
    SFG(sub);
    GET(in1);
    GET(in2);
    o1 = in1 - in2;
    PUT(o1);
    dec(2); // decode two instructions
    dec(0, SFGID(add));
    dec(1, SFGID(sub));
    }
```

To conclude, one can note that meta-code generation allows reuse of design "idioms" (classes) rather then design "instances" (objects). Intellectual-property code generators are a direct consequence of this.

DESCRIPTION OF A DESIGN OF SYSTEMS ACCORDING TO THE METHOD OF THE INVENTION

In the design of a telecommunication system (FIG. 1A), we distinguish four phases: link design, algorithm design, architecture design and circuit design. These phases are used to define and model the three key components of a communication system: a transmitter, a channel model, and a receiver.

The link design (1) is the requirement capture phase. Based on telecommunication properties such as transmission bandwidth, power, and data throughput (the link requirements), the system design space is explored using small subsystem simulations. The design space includes all algorithms which can be used by a transmitter/receiver pair to meet the link requirements. Out of receiver and transmitter algorithms with an identical functionality, those with minimal complexity are preferred. Besides this exploration, any expected transmission impairment must also be modeled into a software channel model.

The algorithm design (2) phase selects and interconnects the algorithms identified in the link design phase. The output is a software algorithmic description in C++ of digital transmitter and receiver parts in terms of floating point operations. To express parallelism in the transmitter and receiver algorithms, a data-flow data model is used. Also, the transmission imperfections introduced by analog parts such as the RF front-ends are annotated to the channel model.

The architecture design (3) refines the data model of the transmitter or receiver. The target architectural style is optimized for high speed execution, uses distributed control semantics and pipeline mechanisms. The resulting description is a fixed point, cycle true C++ description of the algorithms in terms of execution on bit-parallel operators. The architecture design is finished with a translation of this description to synthesizable VHDL.

Finally, circuit design (4) refines the bit-parallel implementation to circuit level, including technology binding, the introduction of test hardware, and design rule checks.

Target Architecture

The target architecture (5), shown in FIG. 2, consists of a network of interconnected application specific processors. Each processor is made up of bit-parallel data-paths. When hardware sharing is applied, also a local control component is needed to perform instruction sequencing. The processors are obtained by behavioral synthesis tools or RT level synthesis tools. In either case, circuits with a low amount of hardware sharing are targeted. The network is steered by one or multiple clocks. Each clock signal defines a clock region. Inside a clock region the phase relations between all register clocks are manifest. Clock division circuits are used to derive the appropriate clock for each processor.

In between each processor, a hardware queue is present to transport data signals. They increase parallelism inside a clock region and maintain consistency between different streams of data arriving at one processor.

Across clock region boundaries, synchronization interfaces are used. These interfaces detect the presence of data at the clock region boundary and gate clock signals for the clock region that they feed. This way, non-manifest and variable data rates in between clock regions are supported.

The ensemble of clock dividers and handshake circuits forms a parallel scheduler in hardware, synchronizing the processes running on the bit-parallel processor.

Overview of the C++ Modeling Levels

An overview of the distinct C++ modeling levels used by OCAPI is given in FIG. 3. The C++ modeling spans three subsequent levels in the design flow: the link level, the algorithm level and the architecture level. The transition to the last level, the circuit level, is made by automated means trough code generation. Usually, VHDL is used as the design language in this lowest level.

The link level is available through data-vector modeling. Using a design mechanism called parallelism scaling, this level is refined to the algorithm level. The algorithm level uses data-flow semantics. Using two distinct refining mechanisms in the data-flow level, we can refine this level to a register transfer level.

The two refining mechanisms are clock cycle true modeling and fixed point modeling. Clock cycle true modeling is achieved by allocating cycle budgets and operators for each algorithm. To help the designer in this decision, operation profiling is foreseen. Fixed point modeling restricts the dynamic range of variables in the algorithms to a range for which a hardware operator can be devised. Signal statistics are returned by the design to help the designer with this.

The last level, the architecture model, uses a signal flowgraph to provide a behavioral description. Using this description synthesizable code is generated. The resulting code then can be mapped onto gates using a register-transfer design tool such as DC of Synopsys.

Data-vector Modeling

The upper level of representation of a communication system is the link level. It has the following properties:

It uses pure mathematical manipulation of functions. Time is explicitly manipulated and results in irregular-flow descriptions.

It uses abstraction of all telecommunication aspects that are not relevant to the problem at hand.

In this representation level, MATLAB is used for simulation. MATLAB uses the data-vector as the basic data object. To represent time functions in MATLAB, they are sampled at an appropriate rate. Time is present as one of the many vector dimensions. For example, the MATLAB vector addition $$a = b + c;$$

can mean both sequential addition in time (if the b and c vectors are thought of as time-sequential), or parallel addition (if b and c happen to be defined at one moment in time). MATLAB simply make no distinction between these two cases.

Besides this time-space feature, MATLAB has a lot of other properties that makes it the tool-of-choice within this design level:

The ease with which irregular flow of data is expressed with vector operations. For example, the operation max(vector), or std(vector).

The flexibility of operations. A maximum operation on a vector of 10 elements or 1000 elements looks identically: max(vector).

The interactivity of the tool, and the transparency of data object management.

The extended library of operations, that allow very dense description of functionality.

Graphics and simulation speed.

This data-vector restriction is to be refined to a data-flow graph representation of the system. Definition of the data-flow graph requires definition of all actors in the graph (actor contents as well as actor firing rules) and definition of the graph layout.

In order to design systems effectively with the SOC++ design flow, a smooth transition between the data-vector level and the data-flow level is needed. A script to perform this task is constructed as can be seen in the following example.

EXAMPLE 1

Design of a Telecommunication System

Initial Data-Vector Description

We consider a pseudonoise (PN) code correlator inside a direct sequence spread-spectrum (DS/SS) modem as an example (FIG. 4).

```
% input data
in = [1 2 1 3 3 4 1 2];
% spreading code
c = [1 -1 1 -1];
% correlate
ot = corr (in, c)
% find correlation peak
[max, maxpos] = max (ot) ;
```

A vector of input data in is defined containing 8 elements. These are subsequent samples taken from the chip demodulator in the spread spectrum modem. The dimension of in thus corresponds to the time dimension. The input vector in is in principle infinite in length. For simulation purposes, it is restricted to a data set which has the same average properties (distribution) as the expected received data.

The samples of in are correlated with the PN-code vector of length 4, c. The output vector ot thus contains 5 samples, corresponding to the five positions of in at which c can be aligned to. The max function locates the maximum value and position inside the correlated data. The position maxpos is subsequently used to synchronize the PN-code vector with the incoming data and thus is the desired output value of the algorithm.

This code is an elegant and compact specification, yet it offers some open questions for the PN-correlator designer:

The algorithm has an implicit startup-effect. The first correlation value can only be evaluated after 4 input samples are available. From then on, each input sample yields an additional correlation value.

The algorithm misses the common algorithmic iteration found in digital signal processing applications: each statement is executed only once.

For the implementation, no statement is made regarding the available cycle budget. This is however an important specification for the attainable acquisition speed of the modem.

All of these questions are caused by the parallelism of the data-vector description.

We now propose a way to make the parallelism of the operations more visible. Each of the MATLAB operations is easily interpreted. Inside the MATLAB simulation, the length of the operands will first be determined in order to select the correct operation behavior. For example,

[max, maxpos]=max(ot)

determines the maximum on a vector of length 5 (which is the length of the operand ot). It needs at least 4 scalar comparisons to evaluate the result. If ot would for example have a longer length, more scalar comparisons would be needed. To indicate this in the description, we explicitly annotate each specific instance of the generic operations with the length of the input vectors.

```
% input data
in =   [1 2 1 3 3 4 1 2];
       8
% spreading code
c =    [1 -1 1 -1];
       4
% correlate
ot  =   corr  (in, c)
        5    8,4
% find correlation peak
[max, maxpos] =  max  (ot) ;
          1  5
```

This little annotation helps us to see the complexity of the operations more clearly. We will use this when considering implementation of the description in hardware. It is of course not the intention to force a user to do this (MATLAB does this already for him/her).

When thinking about the implementation of this correlator, one can imagine different realizations each having a different amount of parallelism, that is, the mapping of all the operations inside corr( ) and max( ) onto a time/space axis. This is the topic of the next section.

Scaled Description

Consider again the definition of the PN code, as in:

```
% spreading code
c =   [1 -1 1 -1];
      4
```

This MATLAB description defines the variable c to be a data-vector containing 4 different values. This vector assignment corresponds to 4 concurrent scalar assignments. We therefore say that the maximal attainable parallelism in this statement is 4.

In order to achieve this parallelism in the implementation, there must be hardware available to perform 4 concurrent scalar assignments. Since a scalar assignment in hardware corresponds to driving a data bus to a certain state, we need 4 busses in the maximal parallel implementation. If only one bus would be desired, then we would have to indicate this.

For each of the statements inside the MATLAB description, a similar story can be constructed. The indication of the amount of parallelism is an essential step in the transition from data-vectors to data-flow. We call this the scaling of parallelism. It involves a restriction of the unspecified communication bandwidth in the MATLAB description to a fixed number of communication busses. It is indicated as follows in the MATLAB description.

```
% input data
in =   [1 2 1 3 3 4 1 2];
       8@1
% spreading code
c =    [1 -1 1 -1];
       4@4
% correlate
ot  =   corr  (in, c)
        5@1   8,4
% find correlation peak
[max, maxpos] =  max  (ot) ;
           1@1  5
```

As is seen, each assignment is extended with a @i annotation, that indicates how the parallelism in the data vectors is ordened onto a time axis. For example, the 8 input values inside in are provided sequentially by writing 8@1. The 4 values of c on the other hand, are provided concurrently. We see that, whatever implementation of the corr operation we might use, at least 8 iterations will be required, simply to provide the data to the operation.

At this moment, the description is getting closer to the data-flow level, that uses explicit iteration. One more step is required to get to the data flow graph level. This is the topic of the next section.

Data Flow Graph Definition

In order to obtain a graph, the actors and edges inside this graph must be defined. Inside the annotated MATLAB description, data precedences are already present through the presence of the names of the vectors. The only thing that is missing is the definition of actor boundaries; edges will then be defined automatically by the data precedences going across the actor boundaries.

This can be done by a new annotation to the MATLAB description. Three actors will be defined in the DS/SS correlator.

```
actor1 {
% input data
in =   [1 2 1 3 3 4 1 2];
       8@1
}
actor2 {
% spreading code
c =    [1 -1 1 -1];
       4@4
% correlate
ot  =   corr  (in, c)
        5@1   8,4
}
actor3 {
% find correlation peak
[max, maxpos] =  max  (ot) ;
           1@1  5
}
```

Again the annotation should be seen as purely conceptual; it is not intended for the user to write this code. Given these annotations, a data flow graph can be extracted from the scaled MATLAB description in an unambiguous way.

actor1 is an actor with no input, and one output, called in.

actor2 is an actor with 1 input in and one output ot.

actor3 is an actor with 1 input ot and outputs maxpos and max.

Furthermore, the simulation uses queues to transport signals in between the actors. We need three queues, called in, ot and maxpos.

The missing piece of information for simulation of this dataflow graph are the firing rules (or equivalently the definition of productions and consumptions on each edge). A naive data flow model is shown in FIG. 4: actor1 (10) produces 8 values, which are correlated by actor2 (11), while the maximum is selected inside actor3 (12).

This would however mask the parallelism scaling operation inside the MATLAB description. For example, it was chosen to provide the 8 values of the in vector in a sequential way over a parallel bus. It is believed that the multi-rate SDF model therefore is not a good container for the annotated MATLAB description.

Another approach is a cyclostatic description. In this case we have a graph as in FIG. 5.

We see that the determination of production patterns involves examining the latencies of operations internal to the actor. This increases the complexity of the design script. It is simpler to perform a demand driven scheduling of all actors. The firing rule only has to examine the availability of input tokens.

The desired dataflow format as in FIG. 6 is thus situated in between the multirate SDF level and the cyclostatic SDF level. It is proposed to annotate consumptions and productions in the same way as it was written down in the matlab description:

8@1 is the production of actor1. It means: 8 samples are produced one at a time.

8@1 and 5@1 is the consumption and production of actor2 respectively.

5@1 and 1@1, 1@1 are the consumption and productions for actor3.

Data-flow Simulation

Given an annotated matlab description, a simulation can now be constructed by writing a high-level model for each actor, interconnecting these with queues and constructing a system schedule. OCAPI provides both a static scheduler and a demand-driven scheduler.

Out of this simulation, several statistics are gathered:

On each queue, put and get counts are observed, as well as signal statistics (minimum and maximum values). The signal statistics provide an idea of the required buswidths of communication busses.

The scheduler counts the firings per actor, and operation executions (+, −, *, . . . ) per actor. This profiling helps the designer in deciding cycle budgets and hardware operator allocation for each actor.

These statistics are gathered through a C++ operator overloading mechanism, so the designer gets them for free if he uses the appropriate C++ objects (schedule, queue and token class types) for simulation.

We are next interested in the detailed clock-cycle true behavior of the actors and the required storage and handshake protocol circuits on the communication busses. This is the topic of the next step, the actor definition.

Actor Definition

The actor definition is based on two elements:

Signal-flowgraph representation of behavior.

Time-verification of the system.

The two problems can be solved independently using the annotated MATLAB code as specification. In OCAPI:

The actor RT modeling proceeds in C++ and can be freely intermixed with high level descriptions regarding both operator wordlength effects and clock-cycle true timing.

The time-verification approach allows the system feasibility to be checked at all times by warning the designer for deadlock and/or causality violations of the communication.

Signal Flowgraph Definition

Within the OCAPI design flow, a class library was developed to simulate behavior at RT-level. It allows To express the behavior of an algorithm with arbitrary implementation parallelism by setting up an signal flow graph (SFG) data structure.

To simulate the behavior of an actor at a clock-cycle true level by interpreting this SFG data structure with instantiated token values.

To specify wordlength characteristics of operations regarding sign, overflow and rounding behavior. Through explicit modeling of the quantization characteristic rather than the bit-vector representation (as in SPW), efficient simulation runtimes are obtained.

To generate C++ code for this actor, and hence perform the clock cycle true simulation with compiled code.

To generate VHDL code for this actor, and synthesize an implementation with Synopsys DC.

To generate DSFG code for this actor, and synthesize an implementation with Cathedral-3. It was observed that Cathedral-3 performs a better job with relation to both critical path and area of the obtained circuits than Synopsys DC. The best synthesis results are obtained by first using Cathedral-3 to generate a circuit at gate level and then Synopsys-DC to perform additional logic optimization as a postprocessing.

An important observation was made regarding simulation speed. For equivalent descriptions at different granularities, the following relative runtimes were found:

1 for the MATLAB simulation.

2 for the untimed, high level C++ data flow description.

4 for the timed, fixed point C++ description (compiled code).

40 for the procedural, word-level VHDL description.

It is thus concluded that RT-modeling of systems within OCAPI is possible within half an order of magnitude of the highest level of description. VHDL modeling however, is much slower. Currently the figure of 40 times MATLAB is even considered an under-estimate. Future clock-cycle based VHDL simulators can only solve half of this problem, since they still use bit-vector based simulation of tokens rather then quantization based simulation.

Next, the modeling issues in C++ are shown in more detail. The C++ signal-flowgraph representation uses a signal data-type, that can be either a registered or else an immediate value. With this data-type, expressions are formed using the conventional scalar operations. (+, −, *, shifts and logical operations). Expressions are grouped together in a signal flowgraph. A signal flowgraph interfaces with the system through the data-flow simulation queues. Several signal-flowgraphs can be grouped together to a SFG-sequence. A SFG sequence is an expression of behavior that spans several cycles. The specification is done through a finite state machine model, for which transition conditions can be expressed. The concept of SFG modeling is pictured in FIG. 7.

The combination of different SFG's in combination with a finite state machine make up the clock-cycle true actor model. Within the actor, SFG communication proceeds through registered signals. Communication over the boundaries of an actor proceeds through simulation queues.

When the actor is specified in this way, and all signal wordlengths are annotated to the description, an automated path to synthesis is available. Several different SFG's can be assigned to one datapath. Synthesizable code is generated in such a way that hardware sharing between different sfg's is possible. A finite state machine (FSM) description is first translated to SFG format to generate synthesizable code in the same way. There is an implicit hierarchy available with this method: by assigning different FSM-SFG's to one datapath, an overall processor architecture is obtained that again has a mode port and therefore looks like a (multicycle) datapath. For macro control problems (such as acquisition/tracking algorithm switching in modems), this is a necessity.

Although the distance between the annotated MATLAB level and this RT-level SFG seems large, it is reasonable on the actor level. Consider for example

```
actor3 {
  % find correlation peak
  [max, maxpos] =   max   (ot) ;
      1@1   5
}
```

We are asked here to write time the max( ) operation with an SFG. actor2 has scaled the parallelism of ot to 5@1. A solution is presented in actual C++ code.

```
{
FB qin("qin") ;                        //input queue
FB q1out("qout") ;                     //output queue
FB q2out("qout") ;                     //output queue
FB start("start") ;                    //the start pin of the
                                         processor
clock ck ;
_sig currmax(ck,dfix(0)) ;             //registry holding current
                                         maximum
_sig maxpos(ck,dfix(0)) ;              //registry holding position
                                         of max
_sig currpos(ck,dfix(0)) ;             // current position
_sig inputvalue ;                      //holds input values
_sig maxout ;
_sig maxposout ;
_sig one(dfix(1)) ;                    //a constant
SFG sfg0, sfg1,sfg2 ;                  //we use 3 sfg's
sfg0.starts( ) ;                       //code after this is for sfg0
currmax = inputvalue ;
maxpos = one ;
currpos = one ;
                                       //next, give sfg0 a mode and
                                         an input queue
sfg0 <<"m0"<<ip(inputvalue,qin) ;
sfg1.starts( ) ;                       //code after this is for sfg1
                                       //this is a conditional
                                         assignment
currmax=(inputvalue>currmax).cassign (inputvalue, currmax);
maxpos = (inputvalue > currmax).cassign(currpos, maxpos) ;
currpos = currpos + 1 ;
sfg1 <<"m1"<<ip(inputvalue,qin) ;
sfg2.starts( ) ;                       //the last SFG
maxposout=(inputvalue>currmax).cassign (_sig (dfix(4)),maxpos);
maxout=(inputvalue>currmax).cassign (inputvalue, currmax) ;
sfg2 <<"m2"<< op(maxout,qout) << op(maxposout,q2out) ;
state s0("s0"), s1("s1"), s2("s2"), s3("s3") ;
s0 >> !cnd(start)       >>              s0 ;
s0 >> cnd(start)        >> sfg0         s1 ;
```

-continued

```
s1 >> allways          >> sfg1 >>       s2 ;
s2 >> allways          >> sfg1 >>       s3 ;
s3 >> allways          >> sfg2 >>       s0 ;
}
```

As an aid to interpret the C++ code, the equivalent behavior is shown in FIG. 8. The behavior is modeled as a 4-cycle description. Three SFG's (13,14,15) are needed, in addition to a 4-state controller (16). The controller is modeled as a Mealy machine.

The C++ description also illustrates some of the main contributions of OCAPI: register-transfer level aspects (signals, clocks, registers), as well as dataflow aspects simulation queues) are freely intermixed and used as appropriate. By making use of C++ operator overloading and classes, these different design concepts are represented in a compact syntax format. Compactness is a major design issue.

Having this specification, we have all information to proceed with the detailed architectural design of the actor. This is however only part of the system design solution: we are also interested in how to incorporate the cycle-true result in the overall system.

Time Verification

The introduction of time (clock cycles) in the simulation uses an expectation-based approach. It allows to use either a high level or else an SFG-type description of the actor, and simulate the complete system clock-cycle true. The simulation helps the designer in finding whether his 'high-level' description matches the SFG description, and secondly, whether the system is realizable.

A summary of the expectation based simulation is given in FIG. 10 and is used to illustrate the ideas mentioned below.

This is a different approach then when analysis is used (e.g. the evaluation of a compile-time schedule and token lifetimes) to force restrictions onto the actor implementation. This traditional approach gives the designer no clue on whether he is actually writing down a reasonable description.

Each token in the simulation is annotated with a time when it is created: the token age. Initial tokens are born at age 0, and grow older as they proceed through the dataflow graph. The unit of time is the clock cycle.

Additionally, each queue in the simulation holds a queue age (say, 'the present') that is used to check the causality of the simulation: a token entering a queue should not be younger than this boundary. A queue is only able to delay tokens (registers), and therefore can only work with tokens that are older than the queue age.

If such a consistency violation is detected, a warning message is issued and the token age is adapted to that of the queue. Otherwise, the time boundary of the queue is updated with the token age after the token is installed on the queue.

The queue age is steered by the actor that drives it. For each actor the designer formulates an iteration time. The iteration time corresponds the cycle budget that the designer expects to need for the detailed actor description. Upon each actor firing, the queues driven by the actor are aged with the iteration time.

At the same time, the actor operations also increase the age of the tokens they process. For normal operations, the resulting token age is equal to the maximum of the operand token ages. For registered signals (only present in SFG-level actor descriptions), the token age is increased by one.

Besides aging by operation, aging inside of the queues is also possible by attaching a travel delay to each queue.

Like the high-level actor description, a queue is also annotated with a number of expectations. These annotations reflect what the implementation of the queue as a set of communication busses should look like.

A communication bus contains one or more registers to provide intermediate storage, and optionally also a handshake-protocol circuit. A queue then maps to one or more (for parallel communication) of these communication busses.

The expectations for a simulation queue are:

The token concurrency, that expresses how many tokens of the same age can be present on one queue. To communicate a MATLAB vector annotated with 8@2 for example requires two communication busses. This is reflected in the high level queue model by setting the token concurrency to two.

In case the token concurrency is 1, it can be required that subsequent tokens are separated by a determined number of clock cycles. In combination with the travel delay, this determines how many registers are needed on a communication bus. This expectation is called the token latency.

Example implementations for different expectations are shown in FIG. 9.

When the token concurrency is different from one, the token latency cannot be bigger than one. If it would, then the actor that provides the tokens can be designed more effectively using hardware sharing, and thus reducing the token concurrency.

A summary of the expectation based simulation is put as follows. First, there are several implicit adaptations to token ages and queue ages.

An actor description increases the queue age upon each actor iteration with the iteration time.

A queue increases the age of communicated tokens with the travel delay.

An SFG description increases token ages through the operations. The token age after a register is increased by one, all other operations generate a token with age equal to the maximum of the operand ages.

The set of operations that modify the token age are referred to as token aging rules.

Next, a number of checks are active to verify the consistency of the simulation.

A token age cannot be younger (smaller) then a queue age.

The token concurrency on a queue cannot be exceeded.

The token latency on a queue cannot be exceeded.

A successful clock-cycle true simulation should never fail any of these checks. In the case of such success, the expectations on the queue can be investigated more closely to devise a communication bus for it. In this description we did not mention the use of handshake protocol circuits. A handshake protocol circuit can be used to synchronize tokens of different age at the input of an actor.

Implementation

The current library of OCAPI allows to describe a system in C++ by building on a set of basic classes.

A simulation queue class that transports a token class and allows to perform expectation-checks.

An SFG/FSM class that allows clock cycle true specification, simulation and code generation.

A token class that allows to simulate both floating point-type representation and fixed point type representation.

One can simulate the MATLAB data-vector data-type with C++ simulation queues. For the common MATLAB operations, one can develop a library of SFG descriptions that reflect different flavors of parallelism. For instance, a C++ version of the description

```
% input data
in = [1 2 1 3 3 4 1 2];
% spreading code
c = [1 -1 1 -1];
% correlate
ot = corr (in, c)
% find correlation peak
[max, maxpos] = max (ot) ;
``` looks, after scaling of the parallelism and defining the actor boundaries, like

```
FB in, ot, maxp ;
in.delay(1,0) ;          //iteration time, travel delay
ot.delay(1,0) ;
maxp.delay(4,0) ;
in.expect(1,1) ;         //travel time, concurrency,
                                 latency
ot.expect(1,1) ;
maxp.expect(1,4) ;
in = vector(1, 2, 1, 3, 3, 4, 1, 2) ;
ot = corr(8, 4, in, vector(1, -1, 1, -1))
maxp = maxpos(4, ot) ;
```

This C++ description contains all information necessary to simulate the system in mind at clock cycle true level and to generate the synthesizable code for the system and the individual actors.

Thus, the data-flow level has become transparent—it is not explicitly seen by the designer but rather it is implied through the expectations (pragma's) and the library.

EXAMPLE 2

Design of a 4-Tap Correlator Processor

An example of processor design is given next to experience hardware design when using OCAPI.

The task is to design a 4-tap correlator processor that evaluates a correlation value each two cycles. One coefficient of the correlation pattern needs to be programmable and needs to be read in after a control signal is asserted. The listing in FIG. 11 gives the complete FSMD model of this processor.

The top of the listing shows how types are declared in OCAPI. For example, the type T_sample is 8 bits wide and has 6 bits beyond the binary point.

For such a type declaration, a signed, wrap-around and truncating representation is assumed by default. This can be easily changed, as for instance in

```
// floating point
dfix T_sample;
//unsigned
dfix T_sample(8, 6, ns);
//unsigned, rounding
dfix T_sample(8, 6, ns, rd);
```

Below the type declarations we see coefficient declarations. These are specified as plain double types, since they will be automatically quantized when read in into the coefficient registers. It is possible to intermix existing C/C++ constructs and types with new ones.

Following the coefficients, the FSMD definition of the correlator processor is shown. This definition requires: the specification of the instruction set that is processed by this processor, and a specification of the control behavior of the processor. For each of these, OCAPI uses dedicated objects.

First, the instruction set is defined. Each instruction performs data processing on signals, which must be defined first. The definitions include plain signals (sample_in and corr_out), registers (accu), and register arrays (coef[ ] and sample[ ]).

Next, each of the instructions are defined. A definition is started by creating a SFG object. All signal expressions that come after such an SFG definition are considered to make up part of it. A SFG definition is closed simply by defining a new SFG object.

The first instruction, initialize_coefs, initializes the coefficient registers coef[ ]. The for loop allows to express the initialization in a compact way. Thus, the initialize_coefs instruction is also equivalent to

```
coef[0] = W(T_coef, hardwired_coef[0]);
coef[1] = W(T_coef, hardwired_coef[1]);
coef[2] = W(T_coef, hardwired_coef[2]);
coef[3] = W(T_coef, hardwired_coef[3]);
```

The second instruction programs the value of the first coefficient. The new value, coef_in, is read from an input port of the FSMD with the same name. Beyond this port, we are 'outside' of the timed FSMD description and use dataflow semantics, and communicate via queues.

The third and fourth instruction, correl_1 and correl_2 describe the two phases of the correlation. It is very easy to express complex expressions just by using C++ operators. Also, a cast operation is included that limits the precision of the intermediate expression result. Although this is for minor importance for simulation, it has strong influence on the hardware synthesis result.

The instruction read_sample shifts the data delay line. In addition to a for loop, an if expression is used to express the boundary value for the delay line. Use of simple C++ constructs such as these allow to express signal flow graph structure in a compact an elegant way. It is especially useful in parametric design.

The last instruction, read_control, reads in the control value that will decide whether the first correlation coefficient needs to be refreshed.

Below all SFG definitions, the control behavior of the correlator processor is described. An FSM with tree states is defined, using one initial state rst, and two normal states phase_1 and phase_2. Next, four transitions are defined between those three states. Each transition specifies a start state, the transition condition, a set of instructions to execute, and a target state. For a designer used to finite state machine specification, this is a very compact and efficient notation.

The transition condition always is always true, while a transition condition like cnd(load) will be true whenever the register load contains a one.

The resulting fsm description is returned to OCAPI by the last return statement. The simulator and code generator can now process the object hierarchy in order to perform semantical checks, simulation, and code generation.

The translation to synthesizable VHDL and Cathedral-3 code is automatic and needs no extra designer effort. The resulting circuit for datapath and controller is shown in FIG. 12. The hierarchy of the generated code that is provided by OCAPI is also indicated. Each controller and datapath are interlinked using a link cell. The link cell itself can be embedded into an automatically generated testbench or also in the system link cell that interconnects all components.

EXAMPLE 3

Design of Complex High Speed ASICs

The design of a 75 Kgate DECT transceiver is used as another example (FIG. 13).

The design consists of a digital radiolink transceiver ASIC, residing in a DECT base station (20) (FIG. 13). The chip processes DECT burst signals, received through a radio frequency front-end RF (21). The signals are equalized (22) to remove the multipath distortions introduced in the radio link. Next, they are passed to a wire-link driver DR (23), that establishes communication with the base station controller BSC (24). The system is also controlled locally by means of a control component CTL (25).

The specifications that come with the design of the digital transceiver ASIC in this system are as follows:

The equalization involves complex signal processing, and is described and verified inside a high level design environment such as MATLAB.

The interfacing towards the control component CTL and the wire-link driver DR on the other hand is described as a detailed clock-cycle true protocol.

The allowed processing latency is, due to the real time operation requirements, very low: a delay of only 29 DECT symbols (25.2 $\mu$seconds) is allowed. The complexity of the equalization algorithm, on the other hand, requires up to 152 data multiplies per DECT symbol to be performed. This implies the use of parallel data processing, and introduces a severe control problem.

The scheduled design time to arrive from the heterogeneous set of specifications to the verified gate level netlist, is 18 person-weeks.

The most important degree of freedom in this design process is the target architecture, which must be chosen such that the requirements are met. Due to the critical design time, a maximum of control over the design process is required. To achieve this, a programming approach to implementation is used, in which the system is modelled in C++. The object oriented features of this language allows to mix high-level descriptions of undesigned components with detailed clock-cycle true, bit-true descriptions. In addition, appropriate object modelling allows the detailed descriptions to be translated to synthesizable HDL automatically. Finally, verification testbenches can be generated automatically in correspondence with the C++ simulation.

The result of this design effort is a 75 Kgate chip with a VLIW architecture, including 22 datapaths, each decoding between 2 and 57 instructions, and including 7 RAM cells. The chip has a 194 die area in 0.7 CMOS technology.

The C++ programming environment allows to obtain results faster then existing approaches. Related to register transfer design environments such as, it will be shown that C++ allows to obtain more compact, and consequently less error prone descriptions of hardware. High level synthesis environments could solve this problem but have to fix the target architecture on beforehand. As will be described in the case of the DECT transceiver design, sudden changes in target architecture can occur due to hard initial requirements, that can be verified only at system implementation.

First, the system machine model is introduced This model includes two types of description: high-level untimed ones and detailed timed blocks. Using such a model, a simulation mechanism is constructed. It will be shown that the proposed approach outperforms current synthesis environments in code size and simulation speed. Following this, HDL code generation issues and hardware synthesis strategies are described.

System Machine Model

Due to the high data processing parallelism, the DECT transceiver is best described with a set of concurrent processes. Each process translates to one component in the final system implementation.

At the system level, processes execute using data flow simulation semantics. That is, a process is described as an iterative behavior, where inputs are read in at the start of an iteration, and outputs are produced at the end. Process execution can start as soon as the required input values are available.

Inside of each process, two types of description are possible. The first one is a high level description, and can be expressed using procedural C++ constructs. A firing rule is also added to allow dataflow simulation.

The second flavour of processes is described at register transfer level. These processes operate synchronously to the system clock. One iteration of such a process corresponds to one clock cycle of processing.

For system simulation, two schedulers are available. A dataflow scheduler is used to simulate a system that contains only untimed blocks. This scheduler repeatedly checks process firing rules, selecting processes for execution as their inputs are available.

When the system also contains timed blocks, a cycle scheduler is used instead. The cycle scheduler manages to interleave execution of multi-cycle descriptions, but can incorporate untimed blocks as well.

FIG. 14 shows the front-end processing of the DECT transceiver, and the difference between data-flow and cycle scheduling. At the top, the front-end processing is seen. The received signals are sampled by and A/D, and correlated with a unique header pattern in the header correlator HCOR. The resulting correlations are detected inside a header detector block HDET. A simulation with high level descriptions uses the dataflow scheduler. An example dataflow schedule is seen in the middle of the figure. The A/D high level description produces 3 tokens, which are put onto the interconnect communication queue. Next, the correlator high level description can be fired three times, followed by the detector processing.

When a cycle true description of the A/D and header correlator on the other hand is available, this system can be simulated with the cycle scheduler as shown on the bottom of the figure. This time, behavior of the A/D block and correlator block are interleaved. As shown for the HCOR block, executions can take multiple cycles to perform. The remaining high level block, the detector, contains a firing rule and is executed as required. Related to the global clock grid, it appears as a combinatorial function.

Detailed process descriptions reflect the hardware behavior of a component at the same level of the implementation. To gain simulation performance and coding effort, several abstractions are made.

Finite Wordlength effects are simulated with a C++ fixed point library. It has been shown that the simulation of these effects is easy in C++. Also, the simulation of the quantization rather than the bitvector representation allows significant simulation speedups The behavior is modelled with a mixed control/data processing description, under the form of a finite state machine coupled to a datapath. This model is common in the synthesis community. In high throughput telecommunications circuits such as the ones in the DECT transceiver ASIC, it most often occurs that the desired component architecture is known before the hardware description is made. The FSMD model works well for these type of components.

The two aspects, wordlength modelling and cycle true modelling, are available in the programming environment as separate class hierarchies. Therefore, fixed point modelling can be applied equally well to high level descriptions.

As an illustration of cycle true modelling, a part of the central VLIW controller description for the DECT transceiver ASIC is shown in FIG. 15. The top shows a Mealy type finite state machine (30). As actions, the signal flowgraph descriptions (31) below it are executed. The two states execute and hold correspond to operational and idle states of the DECT system respectively. The conditions are stored in registers inside the signal flowgraphs. In this case, the condition holdrequest is related to an external pin.

In execute state, instructions are distributed to the datapaths. Instructions are retrieved out of a lookup table, addressed by a program counter. When holdrequest is asserted, the current instruction is delayed for execution, and the program counter PC is stored in an internal register. During a hold, a nop instruction is distributed to the datapaths to freeze the datapath state. As soon as holdrequest is removed, the stored program counter holdpc addresses the lookup table, and the interrupted instruction is issued to the datapaths for execution.

Signals and Signal Flow Graphs

Signals are the information carriers used in construction of a timed description. Signals are simulated using C++ sig objects. These are either plain signals or else registered signals. In the latter case the signals have a current value and next value, which is accessed at signal reference and assignment respectively. Registered signals are related to a clock object clk that controls signal update. Both types of signals can be either floating point values or else simulated fixed point values.

Using operations, signals are assembled to expressions. By using the overloading mechanism as shown in FIG. 16, the parser of the C++ compiler is reused to construct the signal flowgraph data structure.

An example of this is shown in FIG. 17. The top of the figure shows a C++ fragment (40). Executing this yields the data structure (41) shown below it. It is seen that the signal flowgraph consists both of user defined nodes and operation nodes. Operation nodes keep track of their operands through pointers. The user defined signals are atomic and have null operand pointers.

The assignment operations use reversed pointers allowing to find the start of the expression tree that defines a signal.

A set of sig expressions can be assembled in a signal flow graph (SFG). In addition, the desired inputs and outputs of the signal flowgraph have to be indicated. This allows to do semantical checks such as dangling input and dead code detection, which warn the user of code inconsistency.

An SFG has well defined simulation semantics and represents one clock cycle of behavior.

Finite State Machines

After all instructions are described as SFG objects, the control behavior of the component has to be described. We use a Mealy-type FSM model to do this.

Again, the use of C++ objects allow to obtain very compact and efficient descriptions. FIG. 18 shows a graphical and C++-textual description of the same FSM. The correspondence is obvious. To describe an equivalent FSM in an event driven HDL, one usually has to follow the HDL simulator semantics, and for example use multi-process modelling. By using C++ on the other hand, the semantics can be adapted depending on the type of object processed, all within the same piece of source code.

Architectural Freedom

An important property of the combined control/data model is the architectural freedom it offers. As an example, the final system architecture of the DECT transceiver is shown in FIG. 19. It consists of a central (VLIW) controller (50), a program counter controller (51) and 22 datapath blocks. Each of these are modelled with the combined control/data processing shown above. They exchange data signals that, depending on the particular block, are interpreted as instructions, conditions or signal values. By means of these interconnected FSMD machines, a more complex machine is constructed.

It is now motivated why this architectural freedom is necessary. For the DECT transceiver, there is a severe latency requirement. originally, a dataflow target architecture was chosen (FIG. 20), which is common for this type of telecommunications signal processing. In such an architecture, the individual components are controlled locally and data driven. For example, the header detector processor signals a DECT header start (a correlation maximum), as soon as it is sure that a global maximum is reached.

Because of the latency requirement however, extra delay in this component cannot be allowed, and it must signal the first available correlation maximum as a valid DECT header. In case a new and better maximum arrives, the header detector block must then raise an exception to subsequent blocks to indicate that processing should be restarted. Such an exception has global impact. In a data driven architecture however, such global exceptions are very difficult to implement. This is far more easy in a central control architecture, where it will take the form of a jump in the instruction ROM. Because of these difficulties, the target architecture was changed from data driven to central control. The FSMD machine model allowed to reuse the datapath descriptions and only required the control descriptions to be reworked. This architectural change was done during the 18-week design cycle.

The Cycle Scheduler

Whenever a timed description is to be simulated, a cycle scheduler is used instead of a dataflow scheduler. The cycle scheduler creates the illusion of concurrency between components on a clock cycle basis.

The operation of the cycle scheduler is best illustrated with an example. In FIG. 21, the simulation of one cycle in a system with three components is shown. The first two, components 1 (60) and 2 (61), are timed descriptions constructed using fsm and sfg objects. Component 3 (62) on the other hand is decribed at high level using a firing rule and a behavior. In the DECT transceiver, such a loop of detailed (timed) and high level (untimed) components occurs for instance in the RAM cells that are attached to the datapaths. In that case, the RAM cells are described at high level while the datapaths are described at clock cycle true level.

The simulation of one clock cycle is done in three phases. Traditional RT simulation uses only two; the first being an evaluation phase, and the second being a register update phase.

The three phases used by the cycle scheduler are a token production phase, an evaluation phase and a register update phase.

The three-phase simulation mechanism is needed to avoid apparent deadlocks that might exist at the system level. Indeed, in the example there is a circular dependency in between components 1, 2, and 3, and a dataflow scheduler can no longer select which of the three components should be executed first. In dataflow simulation, this is solved by introducing initial tokens on the data dependencies. Doing so would however require us to devise a buffer implementation for the system interconnect, and introduce an extra code generator in the system.

The cycle scheduler avoids this by creating the required initial tokens in the token production phase. Each of the phases operates as follows.

[0] Each the start of clock cycle, the sfg descriptions to be executed in the current clock cycle are selected. In each fsm description, a transition is selected, and the sfg related to this transition are marked for execution.

[1] Token production phase. For each marked sfg, look into the dependency graph, and identify the outputs that solely depend on registered signals and/or constant signals. Evaluate these outputs and put the obtained tokens onto the system interconnect.

[2] (a) Evaluation phase (case a). In the second phase, schedule marked sfg and untimed blocks for execution until all marked sfg have fired. Output tokens are produced if they are directly dependent on input tokens for timed sfg descriptions, or else if they are outputs of untimed blocks.

[2] (b) Evaluation phase (case b). Outputs that are however only dependent on registered signals or constants will not be produced in the evaluation phase.

[3] Register update phase. For all registered signals in marked sfg, copy the next-value to the current-value.

The evaluation phase of the three-phase simulation is an iterative process. If a pre-set amount of iterations have passed, and there are still unfired components, then the system is declared to be deadlocked. This way, the cycle scheduler identifies combinatorial loops in the system.

Code Generation and Simulation Strategy

The clock-cycle true, bit-true description of system components serves a dual purpose. First, the descriptions have to be simulated in order to validate them. Next, the descriptions have also to be translated to an equivalent, synthesizable HDL description.

In view of these requirements, the C++ description itself can be treated in two ways in the programming environment. In case of a compiled code approach, the C++ description is translated to directly executable code. In case of an interpreted approach, the C++ description is preprocessed by the design system and stored as a data structure in memory.

Both approaches have different advantages and uses. For simulation, execution speed is of primary importance. Therefore, compiled code simulation is needed. On the other hand, HDL code generation requires the C++ description to be available as a data structure that can be processed by a code generator. Therefore, a code generator requires an interpreted approach.

We solve this dual goal by using a strategy as shown in FIG. 22. The clock-cycle true and bit-true description of the system is compiled and executed. The description uses C++ objects such as signals and finite state machine descriptions which translate themselves to a control/data flow data structure.

This data structure can next be interpreted by a simulator for quick verification purposes. The same data structure is also processed by a code generator to yield two different descriptions.

A C++ description can be regenerated to yield an application-specific and optimized compiled code simulator. This simulator is used for extensive verification of the design because of the efficient simulation runtimes. A synthesizable HDL description can also be generated to arrive at a gate-level implementation.

The simulation performance difference between these three formats (interpreted C++ objects, compiled C++, and HDL) is illustrated in table 1. Simulation results are shown for the DECT header correlator processor, and also the complete DECT transceiver ASIC.

The C++ modelling gains a factor of 5 in code size (for the interpreted-object approach) over RT-VHDL modeling. This is an important advantage given the short design cycle for the system. Compiled code C++ on the other hand provides faster simulation and smaller process size then RT-VHDL.

For reference, results of netlist-level VHDL and Verilog simulations are given.

TABLE 1

| Design | Size (Gates) | Type | Source Code (#lines) | Simulation Speed (cycles/s) | Process Size (Mb) |
|---|---|---|---|---|---|
| HCOR | 6K | C++(interpreted obj) | 230 | 69 | 3.8 |
| | | C++(compiled) | 1700 | 819 | 2.7 |
| | | VHDL (RT) | 1600 | 251 | 11.9 |
| | | VHDL (Netlist) | 77000 | 2.7 | 81.5 |
| DECT | 75K | C++(interpreted obj) | 8000 | 2.9 | 20 |
| | | C++(compiled) | 26000 | 60 | 5.1 |
| | | Verilog (Netlist) | 59000 | 18.3 | 100 |

Synthesis Strategy

Finally, the synthesis approach that was used for the DECT transceiver is documented. As shown in FIG. 1D, the clock-cycle true, bit-true C++ description can be translated from within the programming environment into equivalent HDL.

For each component, a controller description and a datapath description is generated, in correspondence with the C++ description. This is done because we rely on separate synthesis tools for both parts, each one optimized towards controller or else datapath synthesis tasks.

For datapath synthesis, we rely on the Cathedral-3 back-end datapath synthesis tools, that allow to obtain a bitparallel hardware implementation starting from a set of signal flow-graphs. These tools allow operator sharing at word level, and result in run times less than 15 minutes even for the most complex, 57-instruction data path of the DECT transceiver.

Controller synthesis on the other hand is done by logic synthesis such as Synopsys DC. For pure logic synthesis such as FSM synthesis, this tool produces efficient results. The combined netlists of datapath and controller are also post-optimized by Synopsys DC to perform gate-level netlist optimizations. This divide and conquer strategy towards synthesis allows each tool to be applied at the right place.

During system simulation, the system stimuli are also translated into testbenches that allow to verify the synthesis result of each component. After interconnecting all synthesized components into the system netlist, the final implementation can also be verified using a generated system testbench.

EXAMPLE 4

Design of a QAM Transmission System with OCAPI (FIG. 23)

A QAM transmission system, that includes a transmitter, a channel model, and a receiver is designed.

System Specification

A system specification in OCAPI is an executable model: an executable file, that can be run as a software program on a computer. The principle of executable specification, as it is called, is very important for system design. It allows one to check your specification using simulations. In this case, we are designing a QAM transmission system. A full communications system contains a transmitter, a channel model, and a receiver. The ensemble of the transmitter, channel model and receiver organized as an executable specification is also called an end-to-end executable specification. The term end-to-end clearly indicates that the simulation starts with a user message, and ends with a (received) user message. In between, the complete digital transmission is modeled, as shown in FIG. 23.

In this text, the complete transmission system will be developed. The development of a component in such a system is never a one-shot process. Rather, development proceeds through a design flow: a collection of subsequent design levels connected by 'natural' design tasks. For a modem, the typical design levels are:

a statistical level, to do high level explorations of algorithms. In OCAPI, this level is called the link level.

a functional level, to assemble selected algorithms into a single operational modem. In OCAPI, this level is called the algorithm level.

a structural level, to represent the modem as a machine that executes a functional description. In OCAPI, this level is called the architecture level. Each of these levels has an own set of requirements. Statistical requirements can be for example a bit error rate or a cell loss ratio. Functional requirements are for instance the set of modulation schemes to support. Finally, structural requirements are requirements like type of interfaces, or preselected architectures.

Arranging the requirements besides the design levels yields the design flow, as shown in FIG. 1B. The dashed box contains the levels that will be coded in C++-OCAPI. The upper level (the statistical one) is described in a language like Matlab. It is not included in this text: We will start from a complete functional specification. The functional specification is given herebelow in part A.

Design Flow in OCAPI-C++

Overall Design Flow

A design flow with OCAPI looks, from a high level point of view, as shown in FIG. 1C. The initial specification is an architecture model, constructed in C++. Through the use of refinement, we will construct an architecture model out of it. Next, relying on code generation, we obtain a synthesizable architecture model. This model can be converted to a technology-mapped architecture in terms of gates. OCAPI is concerned with the C++ layers of this flow, an in addition takes care of code generation issues.

Algorithmic Models

The algorithmic models in OCAPI use the dataflow computational model. The construction of this code by small examples selected out of Part B (below) is discussed.

First, we consider the construction of an actor. An actor is a subalgorithm out of a dataflow system model. In OCAPI, each actor is defined by one class. As an example of actor definition, we take the diffenc block out of the transmitter. The include file (3.3) defines a class diffenc (line 10) that inherits from a base class. This inheritance defines the class under definition as a dataflow actor. The dataflow actor defines a constructor, a run method and a reset method. The run method (line 25) is the method that is called when the actor should be executed. This method takes along parameters that include the name (name), the I/O ports (_sym 1, _symb2) and other attributes (_qpsk, _diff_mode). The type FB (Flow-Buffer) is the type of a FIFO queue. Looking at the implementation of run (??, line 26), we distinguish a firing rule in lines 29–30. The getsize( ) method of a queue returns the number of elements in that queue. The firing rule expresses that the run( ) method should return whenever there is no data available in the queue. Otherwise, processing continues as described beyond line 32 (This processing is the implementation of the spec as described in Part A.

A dataflow system is constructed out of such actors. The system code in 5.3 shows how the diffenc actor is instantiated (lines 57–61). Besides actors, the system code also creates interconnect queues (lines 42–48). By giving these as parameters in the constructor of actors, the required communication links are established. Besides the interconnection of actors, the system code also needs to create a scheduler. This scheduler will repeatedly test firing rules in the actors (by calling their run( ) method). The system scheduler that steers the differential encoder is shown on line 77 of 5.3. After this object is created, all dataflow actors that should be under control of it are "shifted into" it. The scheduler object has a method, run( ), that tries firing all of the actors associated with the schedule just once.

Architecture Models

An architecture model expresses the behavior of the algorithmic model in terms of operations onto hardware. The kind of hardware features that affect this depend of course on the target architectural style. OCAPI is intended for a bit-parallel, synchronous style. For this kind of style, two kinds of refinements are necessary: First, the data types need to be expressed in terms of fixed point numbers. Second, the execution needs to proceed in terms of clock cycles. The first kind of refinement is called fixed point modeling. The second kind is called cycle true modeling. These two refinements can be done in any order; for a complete architecture model, both are needed. We first give an example on how fixed point numbers are expressed in C++. Consider the ad block of the transmitter (3.2, line 24–27). The purpose of this block is to introduce a quantization effect, such as for instance would be encountered when the signal passes through an analog-digital or digital-analog converter. In this case, the high level algorithmic model is constructed with a fixed point number in order to perform this quantization. On line 32, an object of type dfix (called indfix) is created. This object represents a fixed point value. The constructor uses three parameters. The first, '0', provides an initial value. The following two (W and L) are parameters that represent the wordlength and fractional wordlength respectively. The operation of the ad block is as follows. When there is information in the input queue, the value read is assigned to the fixed point number indfix. At the moment of assignment, quantization happens, whether or not the input value was a floating point value (The FIFO buffers are actually passing along objects of type dfix, so that floating as well as fixed point numbers can be passed from one block to the other). A next example will show how cycle true modeling is done. We consider the derandomizer function of the receiver (6.4). First, looking at the algorithmic model (line 69–102), we see that the block reads two inputs (byte_in and syncro) and writes one output (byte_out). In between, it performs some algorithmic processing (line 89–97). The architecture model is shown in the define( ) function starting at line 116. The first few lines are type definitions and signal declarations. Next, four instructions are defined (line 143–179), and a controller which sequences these instructions is specified (line 184–195). The architecture model makes heavily use of macros to ease the job of writing code. All of these are explained above. The goal of the define( ) function is to define an object hierarchy consisting of signals, expressions, states, etc . . . that represents the cycle true behavior of a processor. At the top of the hierarchy is a finite state machine object. The member function fsm( ) (line 106) returns this object (which is a data member of the derandomizer class). The system integration of the derandomizer (5.3, line 169–176) is the same for the algorithmic and architecture model. The selection between algorithmic and architecture model is done by giving a system scheduler either a base object (as in line 186) or else the fsm object for simulation (as in line 206). Remember that the algorithmic model derives creates a class that derives from the base object; while an architecture model defines a finite state machine object.

Code Generation

Finally we indicate the output of the code generation process. When an architecture model is constructed, several code generators can be used. OCAPI currently can generate RT-VHDL code directly, or else also Cathedral-3 dsfg code. When the member function generate( ) of a system scheduler is called, Cathedral-3 code will be produced, along with the required system link cells. The member function vhdlook( ) on the other hand produces RT-VHDL code. In this example, we have used the vhdlook( ) method (5.2, line 401). We consider the derandomizer block in the receiver. The first place where this appears in the generated code is in the system netlist (6.13, line 70 and line 143). Next, we can find the definitions of the block itself: its entity declaration (6.14), the RTL code (6.15), and a mapping cell from the fixed-point VHDL type FX to the more common VHDL type std_logic (6.16). By using this last mapping cell, we can also hook up the VHDL code for derand in a generated testbench (6.17). This testbench driver reads stimuli recorded during the C++ simulation and feeds them into the VHDL simulation.

Part A: System Specification

System Contents

The end-to-end model of the QAM transmission system under consideration is shown in FIG. 23. It consists of four main components:

A byte generator GEN (201)

A transmitter TX. (203)

A channel model CHAN. (205)

A receiver RX. (207)

The byte generator generates a sequence of random bytes. These are modulated inside of the transmitter to a QAM signal. The channel model next introduces distortions in the signal, similar to those occurring in a real channel. Finally, the receiver demodulates the signal, returning a decoded byte sequence. If no bit errors occur, then this sequence should be the same as the one created by the byte generator.

Next, the detailed operation of the transmitter, the channel and the receiver is discussed. For the internal construction of a component, one might however still refer to FIG. 24.

Transmitter Specification

The Transmitter includes rnd: A randomizer, which transforms a byte sequence into a pseudorandom byte sequence. This is done because of the more regular spectral properties of a rando mized (or 'whitened') byte sequence.

tuple: A tuplelizer, which chops the transmitted bytes into QAM/QPSK symbols.

diffenc: A differential encoder which applies differential encoding to the symbols.

map: A QAM symbol mapper, which translates QAM symbols to I/Q pulse sequence s.

shape: A pulse shaper, which transforms the pulse sequences to a continous wave. In digital implementation, the temporal 'continuity' is achieved by applying oversampling.

da: Finally, there is a block which applies quantization to the signal. This block simulates the effect of a digital-to-analog converter.

The transmitter reads in a byte sequence, and randomizes this with a pseudorandom byte sequence. The sequence contains a synchronization word to align the receiver derandomizer to the transmitter randomizer. The pseudorandom sequence is generated by exoring a bitstream with a bitstream produced by a linear feedback shift register (LF SR). The LFSR produces a bitstream according to the polynomial $g(x)=1+x^5+x^6$. It next feeds the bytes to a tuplelizer that generates symbols out of the byte sequence according to the following scheme.

Given bits b7 b6 b5 b4 b3 b2 b1 b0,

| Bit position | QAM16 | QPSK |
|---|---|---|
| b7 | I symbol 0 | I[1]symbol 0 |
| b6 | Q symbol 0 | I[0]symbol 0 |
| b5 | I symbol 1 | Q[1]symbol 0 |
| b4 | Q symbol 1 | Q[0]symbol 0 |
| b3 | I symbol 2 | I[1]symbol 1 |
| b2 | Q symbol 2 | I[0]symbol 1 |
| b1 | I symbol 3 | Q[1]symbol 1 |
| b0 | Q symbol 3 | Q[0]symbol 1 |

The symbols values are next fed to the differential encoder that generates a diff encoded symbol sequence:
i=(((~(a^b)) & (a^glbIstate))|((a^b) & (b^glbQstate))) &1;
q=(((~(a^b)) & (b^glbQstate))|((a^b) & (a^glbIstate))) &1;
with i and q the output msbs of the differentially encoded symbol; glbIstate, glbQstate the previous values of i and q; and a and b the inputs msbs of the input symbol. The lsbs are left untouched (only for qam16) The differentially encoded symbol sequence is next mapped to the actual symbol value using the following constellation for QPSK.

| QVal/Ival | -3 | +3 |
|---|---|---|
| +3 | 2 | 0 |
| -3 | 3 | 1 |

For QAM16, the following constellation will be used

| QVal/Ival | -3 | -1 | 1 | +3 |
|---|---|---|---|---|
| +3 | 11 | 9 | 2 | 3 |
| +1 | 10 | 8 | 0 | 1 |
| -1 | 14 | 12 | 4 | 6 |
| -3 | 15 | 13 | 5 | 7 |

After mapping, the resulting complex sequence is pulse shaped. A RRC shaping filter with oversampling n=4 is taken, with the rolloff factor set at r=0.3. After pulse shaping, the sequence is upconverted to fc=fs/4 in the multiplexer block (included in the shaper)

Channel Model Specification

The Channel Model contains

FIR filter with programmable taps. The filter is used to simulate linear distortions such as multipath effects.

Noise injection block. The incoming signal is fed into a 20 tap filter. The second, third, fourth and 21th tap of the filter are programmable. Next a noise signal is added to the sequence. The noise distribution is gaussian;

$X1=\text{sqrt}(-2\ \ln*(U1))*\cos(2*pi*U2)$ $X2=\text{sqrt}(-2\ \ln*(U1))*\sin(2*pi*U2)$ U1, U2 are independent and uniform [0,1],
X1 and X2 are independent and N(0,1)
Receiver Specification
The Receiver includes

| lmsff | A feed forward, T/4 spaced LMS Equalizer. |
|---|---|
| demap | A demapper, translating a complex signal back to a QAM symbol. |
| detuple | A detupler, glueing individual symbols back to bytes. |
| derand | A derandomizer, translating the pseudonoise sequence back to an unrandomized sequence. |

It is not difficult to see that this signal processing corresponds to the reverse processing that was applied at the transmitter. The incoming signal is fed into an equalizer block. The 4 tap oversampled FF equalizer is initialized with a downconverting RRC sequence. This way, the equalizer will act at the same time as a matched filter, a symbol timing recovery loop, a phase recovery loop, and an intersymbol-interference removing device. It is a simple solution at the physical synchronization problem in QAM.

The equalizer is initialized as follows. Given the complex RRC

| | tap0 | tap1 | tap2 | tap3 |
|---|---|---|---|---|
| I | i0 | i1 | i2 | i3 |
| Q | q0 | q1 | q2 | q3 | then the LMS should be initialized with

| | tap0 | tap1 | tap2 | tap3 |
|---|---|---|---|---|
| I | i0 | 0 | -i2 | 0 |
| Q | 0 | q1 | 0 | -q3 |

The coefficient adaption algorithm of the equalizer is of the Least Mean Square type. This algorithm is decision directed; such algorithms are able to do tracking in a synchronization loop, but not to do acquisition (initialization) of the same loops. For simplicity in this example, we will however make abstraction of this acquisition problem. Next, the inverse operations of the transmitter are performed: the demodulated complex signal is converter to a QAM symbol in the demapper. The resulting QAM symbol stream is differentially decoded and assembled to a byte sequence in the detupler. The differential decoding proceeds according to a=(((~(i^q)) & (i^glbIstate))|((i^q) & (q^glbQstate))) &1;
b=(((~(i^q)) & (q^glbQstate))|((i^q) & (i^glbIstate))) &1;

Finally, the pseudorandom encoding of the sequence is removed in the derandomizer.

Part B: C++ code of the QAM system

3    Transmitter Code

3.1   tx/ad.h

```
1 // ad.h
2 // All rights reserved  --   Imec 1998
3 // @(#)ad.h1.2 03/20/98
4
5 #infdef AD_H
6 #define AD_H
7
8 #include "qlib.h"
9
10 class ad : public base{
11   FB   *in;
12   FB   *ot;
13   double*W;
14   double*L;  ;
15
16 public:
17    ad(char *name, FB & _in,FB & _ot, double&   _W,double &_L);
18    int run();
19    int reset();
20 };
21
22 #endif
```

3.2 tx/ad.cxx

```
1  // ad.cxx
2  // All rights reserved  --  Imec 1998
3  // @(#)ad.cxx  1.4 03/31/98
4
5  #include "ad.h"
6
7  ad::ad(char*name,
8         FB & _in,
9         FB & _ot,
10        double & _W,
11        double & _L): base(name)
12  {
13    in = _in.asSource(this);
14    ot = _ot.asSink(this);
15    W  = &_W;
16    L  = &_L;
17  }
18
19  int ad::reset() {
20    //return to initial state
21    return  1;
22  }
23
24  intad::run() {
25
26    //firing rule
27    if(in->getSize() < 1) {
28      return  0;
29    }
```

```
30
31    //core functionality
32    dfix indfix(0,(int)(*W),(int)(*L));
33      indfix= in->get( ) ;      // inputting+ quantization assignment
34    ot->put(indfix) ;       // outputing
35
36    return  1;
37 }
38
```

3.3  tx/diffenc.h

```
1 // diffenc.h
2 // All rights reserved  --   Imec 1998
3 // @(#)diffenc.h    1.7 98/03/31
4
5#infdef   DIFFENC_H
6#define   DIFFENC_H
7
8#include   "qlib.h"
9
10 class diffenc: public base{
11
12  FB     *symb1;
13  FB     *symb2;
14  double *qpsk;
15  double *diff _mode;
16  int    iState;
17  int    qState;
18
19 public:
```

```
20   diffenc(char *name,
21        FB & _symb1,
22        FB & _symb2,
23        double &_qpsk,
24        double &_diff_mode);
25   int run();
26   int reset();
27 };
28
29#endif
```

3.4  tx/diffenc.cxx

```
1 // diffenc.cxx
2 // All rights reserved  --  Imec 1998
3 // @(#)diffenc.cxx 1.8 98/03/31
4
5#include "diffenc.h"
6
7 diffenc::diffenc(char*name,
8         FB & _symb1,
9         FB & _symb2,:
10                double & _qpsk,
11         double &_diff _mode): base(name)
12 {
13   symb1    = _symb1.asSource(this);
14   symb2    = _symb2.asSink(this);
15   qpsk     = &_qpsk;
16   diff_mode= &_diff_mode;
17   reset();
18 }
19
```

174

```
20 int diffenc::reset() {
21    iState= 0;
22    qState= 0;
23    return 1;
24 }
25
26 int diffenc::run() {
27
28    //firing rule
29    if(symbl->getSize() < 1)
30      return 0;
31
32    //core func
33    intsymb = (int)Val(symbl->get( ) ) ;
34
35    if((int)*diff _mode) {
36       int a = ((int)*qpsk) ? (symb>> 1) & 1 : (symb>> 3) & 1 ;
// get msb's only
37       int b = ((int)*qpsk) ? (symb>> 0) & 1 : (symb>> 2) & 1 ;
38
39            int i = ((("(a^b)) & (a^iState))|(a(^b) &b(^qState))) &1; // encodemsb
40            int q = ((("(a^b)) & (b^qState))|(a(^b) &a(^iState))) &1;
41
42       iState= i;
43       qState= q;
44
45         symb = ((int)*qpsk)?(i<< 1)|q : (i<< 3)|(q<< 2)|(symb& 3);
```

```
46   }
47
48   symb2->put(symb);
49   return 1;
50  }
51
```

3.5 tx/map.h

```
1  //----------------------------------------------------------
2  // COPYRIGHT
3  // =========
4  //
5  // Copyright1996 IMEC, Leuven,Belgium
6  //
7  // Allrights reserved.
8  //
9  //----------------------------------------------------------
10 // Module:
11 //     MAP
12 //
13 // Purpose:
14 //     Mapping of QAM16 constellations to symbols and back
15 //
16 // Author:
17 //     Patrick Schaumont
18 //----------------------------------------------------------
19
20 #infdef  MAP_H
21 #define  MAP_H
22
```

```
23 #include "qlib.h"
24
25 class map : public base{
26    double *qpsk;
27
28    FB * sIn;
29    FB * qOut;
30    FB * iOut;
31
32    dfix immediateQ(dfix v);
33    dfix immediateI(dfix v);
34
35 public:
36    map(char *name, FB& _sIn,FB & _iOut, FB& _qOut,double &_qpsk);
37    int run();
38
39 };
40
41 #endif
```

3.6 tx/map.cxx

```
1 //-----------------------------------------------------------
2 //   COPYRIGHT
3 //   =========
4 //
5 //   Copyright1996 IMEC, Leuven,Belgium
6 //
7 //   Allrights reserved.
8 //
9 //-----------------------------------------------------------
```

```
10 // Module:
11 //      MAP
12 //
13 // Purpose:
14 //      Mapping of QAM16 constellationsto symbolsand back
15 //
16 // Author:
17 //      Patrick Schaumont
18 //-------------------------------------------------
19
20
21 #include  "map.h"
22
23 // #    #    ##    #####
24 // ## ##   #  #    #    #
25 // #### #  #  #    #
26 // #    # ######   #####
27 // #    # #    #       #
28 // #    # #    #       #
29
30
31 // QAM16
32 static double vQMap16[]={
33    ( 0.0),
34    (+1 .0), (+1.0), (+3.0), (+3.0),
35    (-1 .0), (-3.0), (-1.0), (-3.0),
36    (+1 .0), (+3.0), (+1.0), (+3.0),
37    (-1 .0), (-3.0), (-1.0), (-3.0)
38 };
39
40 static double vIMap16[] = {
41    ( 0.0),
```

```
42    (+1 .0), (+3.0), (+1.0), (+3.0),
43    (+1 .0), (+1.0), (+3.0), (+3.0),
44    (-1 .0), (-1.0), (-3.0), (-3.0),
45    (-1 .0), (-1.0), (-3.0), (-3.0)
46 };
47
48 // QPSK
49 static double vQMap4[]={
50    ( 0.0),
51    (+3 .0), (-3.0), (+3.0), (-3.0),
52 };
53 static double vIMap4[] = {
54    ( 0.0),
55    (+3 .0), (+3.0), (-3.0), (-3.0),
56 };
57
58    map::map(char*name, FB&    _sIn,FB  &  _iOut,   FB& _qOut,double& _qpsk) : base(name) {
59       sIn = & _sIn;
60       qOut = & _qOut;
61       iOut= & _iOut;
62       qpsk= & _qpsk;
63 }
64
65 dfix map::immediateQ(dfixv) {
66    if((int)*qpsk) {
67       return  dfix(vQMap4[(int)Val(v+1) ] ) ;
68    } else{
69       return  dfix(vQMap16[(int)Val(v+1) ] ) ;
70    }
71 }
72
```

```
73 dfix map::immediateI(dfixv) {
74     if((int)*qpsk) {
75         return  dfix(vIMap4[(int)Val(v+1) ] ) ;
76     } else{
77         return  dfix(vIMap16[(int)Val(v+1) ] ) ;
78     }
79 }
80
81 intmap::run() {
82     if(sIn->getSize() < 1)
83         return  0;
84     dfix v = sIn->get();
85     *iOut << immediateI(v);
86     *qOut << immediateQ(v);
87     return  1;
88 }
89
```

3.7 tx/rnd.h

```
1 // rnd.h
2 // All rights reserved --   Imec1998
3 // @(#)rnd.h    1.5 03/31/98
4
5 #infdef   RND_H
6 #define   RND_H
7
8 #include "qlib.h"
9
10 #define   SYNCPERIOD 54
11 #define   SYNCWORD1 0x00
12 #define   SYNCWORD2 0x55
```

180

```
13 #define   SYNCWORD3 0x00
14 #define   SYNCWORD4 0x55
15
16 class rnd : public base{
17   FB     *input;
18   FB     *output;
19   int    synccntr;
20
21 public:
22   rnd(char *name, FB& _input, FB& _output);
23   int run();
24   int reset();
25 };
26
27 #endif
```

3.8 tx/rnd.cxx

```
1 // rnd.cxx
2 // All rights reserved -- Imec 1998
3 // @(#)rnd.cxx 1.6 03/20/98
4
5 #include "rnd.h"
6
7 int glbRandom = 1;
8
9 int glbRandState;
10
11 rnd::rnd(char *name,
12      FB & _input,
13      FB & _output) :base(name)
14 {
```

```
15    input = _input.asSource(this);
16    output= _output.asSink(this);
17    synccntr= 0;
18    reset();
19 }
20
21
22 #define BIT(k, n)   ((k>> (n-1)) & 1)
23 #define MASK(k, n) (k & ((1<< (n+1))-1))
24
25 int randbit() {
26    int r;
27
28    r= BIT(glbRandState,  5) ^ BIT(glbRandState, 6 );
29    glbRandState= MASK(r | (glbRandState<< 1) , 6);
30
31    if(glbRandom)
32      return  r;
33    else
34      return  0;
35 }
36
37
38    //    ======================================MEMBER FUNCTIONS
39
40 int rnd::reset() {
41    //return to initial state
42    glbRandState= (1<<   7) -1;
43    return  1;
44 }
45
```

```
46 int rnd::run() {
47    //firing rule
48    if(input->getSize() < 1) {
49      return  0;
50    }
51
52
53    //core func
54    int i;
55    int outbyte = 0;
56    int inbyte = (int)Val(input->get( ) ) ;
57    for (i=7; i>=0; i--) {
58       outbyte= (outbyte<<1) | (randbit( ) ^(inbyte>>i &
1));
59    }
60    synccntr++;
61    if(synccntr == SYNCPERIOD) {
62      //   cerr << "*** INFO:randomizer sends SYN\n";
63      output->put(outbyte);
64      output->put(SYNCWORD1);
65      output->put(SYNCWORD2);
66      output->put(SYNCWORD3);
67      output->put(SYNCWORD4);
68      synccntr= 0;
69      reset();
70    }
71    else {
72      output->put(outbyte);
73    }
74 return  1;
75 }
76
```

3.9 tx/shape.h

```
1 // shape.h
2 // All rights reserved --  Imec 1998
3 // @(#)shape.h 1.3 03/18/98
4
5 #infdef  SHAPE_H
6 #define  SHAPE_H
7
8 #include  "qlib.h"
9
10 #define  MAXLEN 33
11
12 class shape : public base{
13   FB  * i_in;
14   FB  * q_in;
15   FB  * s_out;
16   double c[MAXLEN] ; // RC coefficients
17
18 public:
19   shape(char *name, FB& _i_in, FB& _q_in, FB& _s_out);
20   int run();
21   int run_old();
22   int reset();
23   void makecoeffs();
24 };
25
26 #endif
```

3.10 tx/shape.cxx

184

```
1  // shape.cxx
2  // All rights reserved -- Imec 1998
3  // @(#)shape.cxx   1.7  06/26/98
4
5  #include "shape.h"
6
7  shape::shape(char *name,
8         FB & _i_in,
9         FB & _q_in,
10        FB & _s_out) :base(name)
11 {
12    i_in  = _i_in.asSource(this);
13    q_in  = _q_in.asSource(this);
14    s_out = _s_out.asSink(this);
15    makecoeffs( ) ;//RRC coeff generation
16    reset();
17 }
18
19 int shape::reset() {
20    //return to initial state
21    while(i_in->getSize() >0)
22       i_in->pop();
23    while(q_in->getSize() >0)
24       q_in->pop();
25
26    return 1;
27 }
28
29 void  shape::makecoeffs() {
30    c[0] = 2.725985e-02;
31    c[1] = 2.079339e-01;
32    c[2] = 4.002601e-01;
```

```
33    c[3] = 5.241213e-01;
34    c[4] = 5.241213e-01;
35    c[5] = 4.002601e-01;
36    c[6] = 2.079339e-01;
37    c[7] = 2.725985e-02;
38  }
39
40  int shape::run() {
41    int i ,j;
42  #define   NF 8
43  #define   SPS 4
44
45    static double deli[NF] ;
46    static double delq[NF] ;
47
48    if((i_in->getSize() <1) ||
49       (q_in->getSize() <1)) {
50      return  0;
51    }
52
53    for (j = 1; j <= SPS; j++) {
54
55      for (i = NF-1; i>=  1; i--) {
56        deli[i] = deli[i-1] ;
57        delq[i] = delq[i-1] ;
58      }
59      if(j == 1) {
60        deli[0] = Val(i_in->get( ) ) ;
61        delq[0] = Val(q_in->get( ) ) ;
62      }
63      else{
64        deli[0] =0;
```

186

```
65      delq[0] = 0;
66    }
67
68    double acci = 0;
69    double accq = 0;
70    for(i = 0; i < NF; i++) {
71      acci += deli[i]*c[i] ;
72      accq += delq[i]*c[i] ;
73    }
74
75    switch (j) {
76      case 1: s_out->put(acci);break;
77      case 2: s_out->put(-accq);break;
78      case 3: s_out->put(-acci);break;
79      case 4: s_out->put(accq);break;
80    }
81
82  } //end for j
83
84  return 1;
85 }
86
87
88
89 //  5.9502848187909857e-03
90 //  7.1303339418111898e-03
91 // -9.0376125958858652e-04
92 // -1.2842591240125096e-02
93 // -1.6560488829370935e-02
94 // -3.1424796453581099e-03
95 //  2.5114519782671950e-02
96 //  4.0465840802261004e-02
```

187

```
 97 //  2.8302892670230756e-02
 98 // -1.9056064640367836e-02
 99 // -7.6814040516083981e-02
100// -9.7464875081018337e-02
101// -3.7506670742425155e-02
102//  1.1136091774729967e-01
103//  3.0772091871906165e-01
104//  4.7526468799142091e-01
105//  5.4107108989550989e-01
106//  4.7526467788525789e-01
107//  3.0772090304860350e-01
108//  1.1136090307335493e-01
109// -3.7506679314098741e-02
110// -9.7464876235465986e-02
111// -7.6814036683689066e-02
112// -1.9056059903703605e-02
113//  2.8302895170883653e-02
114//  4.0465840334864417e-02
115//  2.2511449901436539e-02
116// -3.1424813892788860e-03
117// -1.6560489169667160e-02
118// -1.2842590440175973e-02
119// -9.0376032591496101e-04
120//  7.1303342199545879e-03
121//  5.9502844100395589e-03
122
```

3.11  tx/tuplelize.h

```
1 // tuplelize.h
2 // All rights reserved -- Imec 1998
3 // @(#)tuplelize.h 1.4 98/03/31
```

```
 4
 5
 6 #infdef   TUPLELIZE_H
 7 #define   TUPLELIZE_H
 8
 9 #include  "qlib.h"
10
11 class tuplelize : public base{
12   FB      *byte;
13   FB      *symb;
14   double  *qpsk;
15
16 public:
17   tuplelize(char* name,
18             FB & _byte,
19             FB & _symb,
20             double &_qpsk);
21   int run();
22   int reset();
23 };
24
25 #endif
```

3.12    tx/tuplelize.cxx

```
1 // tuplelize.cxx
2 // All rights reserved-- Imec 1998
3 // @(#)tuplelize.cxx    1.698/03/31
4
5 #include "tuplelize.h"
6
7
```

189

```
 8 tuplelize::tuplelize(char *name,
 9            FB & _byte,
10            FB & _symb,
11               double &_qpsk) :base(name)
12 {
13   byte = _byte.asSource(this);
14   symb = _symb.asSink(this);
15   qpsk = &_qpsk;
16 }
17
18//----------------------------------------
19
20 int tuplelize::reset() {
21   return  1;
22 }
23
24 int tuplelize::run() {
25
26   //firing rule
27   if(byte->getSize() < 1)
28     return  0;
29
30   //core func
31   int us, msk, sym;
32
33   if((int)*qpsk) {
34     us= 2; msk = 0x03;
35   } else{
36     us= 4; msk = 0x0F;
37   }
38
39   int tuple = (int)Val(byte->get( ) ) ;
```

```
40
41    for (int k = 1; k<=  8/us;k++) {
42      sym = (tuple >> (8-us) ) & msk;
43      tuple= (tuple << us) &  0xff;
44      symb->put(sym);
45    }
46
47    return 1;
48 }
49
50
51
```

4    Channel Model Code

4.1   chan/fir.h

```
1 // fir.h
2 // All rights reserved  --   Imec 1998
3 // @(#)fir.h    1.2 03/31/98
4
5 #infdef   FIR_H
6 #define   FIR_H
7
8 #define   NRTAPS 20
9
10 #include   "qlib.h"
11
12 class fir : public base{
13   FB      *input;
14   FB      *output;
```

```
15    double x[NRTAPS] ; // filtertaps: 0,1,...,NRTAPS-1
16    double *t1, *t2, *t3, *t20;
17
18 public:
19    fir (char *name,FB &  _input,FB & _output,
20         double &_t1, double &_t2,double &_t3, double &_t20)
;
21    int run();
22    int reset();
23 };
24
25#endif
```

4.2 chan/fir.cxx

```
1 // fir.cxx
2 // All rights reserved  --   Imec 1998
3 // @(#)fir.cxx 1.3 03/31/98
4
5#include "fir.h"
6
7 fir::fir(char *name,
8   FB & _input,
9   FB & _output,
10      double  &_t1,  double   &_t2,double   &_t3,  double &_t20):base(name)
11 {
12    input = _input.asSource(this);
13    output= _output.asSink(this);
14
15    for(int i=0; i<NRTAPS; i++) {
16      x [i] =0;
```

```
17  }
18    t1 = &_t1;
19    t2 = &_t2;
20    t3 = &_t3;
21    t20= &_t20;
22  }
23
24 int fir::reset() {
25    //return to initial state
26    for(int i=0; i<NRTAPS; i++) {
27      x [i] =0;
28    }
29    return 1;
30  }
31
32 int fir::run() {
33    //firing rule
34    if(input->getSize() < 1) {
35      return 0;
36    }
37
38    dfix in = input->get();
39
40    int i;
41    for (i=NRTAPS-1; i>=1; i--) {
42      x [i] =x[i-1] ;
43    }
44    x[0] =Val(in);
45
46    //core func
47      double out = x[0] + x[1]*(*t1) +x[2]*(*t2) + x[3]*(*t3) + x[20]*(*t20);
```

```
48    output->put(out);
49
50 return  1;
51 }
52
53

4.3  chan/noise.h

1 // noise.h
2 // All rights reserved  --  Imec 1998
3 // @(#)noise.h 1.2 03/20/98
4
5#infdef   NOISE_H
6#define   NOISE_H
7
8#include   "qlib.h"
9#include   "pseudorn.h"
10
11 class noise: public base{
12   FB  * in;
13   FB  * out;
14    double *n;
15    pseudorn RN;
16
17 public:
18    noise (char *name, FB & in,FB & out, double & _n);
19    int reset();
20    int run();
21 };
22
23#endif
```

4.4 chan/noise.cxx

```
1 // noise.cxx
2 // All rights reserved   --   Imec 1998
3 // @(#)noise.cxx    1.3 03/20/98
4
5 #include   "noise.h"
6 #include   <math.h>
7
8 noise::noise(char *name,FB & _in,FB & _out, double & _n) :
   base(name) {
9    in = _in.asSource(this);
10   out= _out.asSink(this);
11   n= &_n;
12 }
13
14
15 int noise::run() {
16    //firing rule
17    if(in->getSize() < 1) {
18      return  0;
19    }
20
21    //core function
22    double U1 = (double)  (RN.out())/(double)PRNMAX + 1/(double) PRNMAX;
23    double U2 = (double)  (RN.out())/(double)PRNMAX + 1/(double) PRNMAX;
24
25    double X =  sqrt(-2.*log(U1)) *cos(2.*M_PI*U2);
```

4.5 chan/pseudorn.h

```
1 // pseudorn.h
2 // All rights reserved -- Imec 1998
3 // @(#)pseudorn.h  1.2 03/31/98
4
5 #infdef  pseudorn_H
6 #define  pseudorn_H
7
8 #define  MULT    0x015a4e35L
9 #define  INCR    1
10 #define  PRNMAX  32767    // =2^15-1
11
12 #include <time.h>
13
14 class pseudorn {
15    long seed;
16    unsigned range;
17 public:
18    pseudorn() {
19       range= PRNMAX;
20       seed= time(0);
21    }
22    pseudorn(unsigned s, unsigned r) {
23       seed= s;
```

(from previous section:)
```
26
27  out->put(Val(in->get()), +X*(*n) ) ;
28
29  return 1;
30
31 }
```

196

```
24      range= r;
25    }
26    pseudorn(unsigned r) {
27      range= r;
28      seed = time(0);
29    }
30    unsigned out(void ) {
31      seed= MULT * seed+ INCR;
32      return  ((unsigned) (seed>> 16) & 0x7fff) % range;
33    }
34    long getSeed() {return  seed;}
35    void  setSeed(long s) {seed= s;}
36  };
37
38
39 #include   "qlib.h"
40
41 class pseudorn _gen: publicbase {
42    pseudorn RN;
43    FB *out;
44 public:
45    pseudorn_gen(char *name, FB&_out) :
46      base(name),
47      RN(255) {
48      out= _out.asSink(this);
49    }
50    int run() {
51      out->put(RN.out( ) ) ;
52      return  1;
53    }
54  };
55
```

```
56 #endif
57
58
```

4.6 chan/pseudorn.cxx

```
 1 // pseudorn.cxx
 2 // All rights reserved  --  Imec 1998
 3 // @(#)pseudorn.cxx1.1 03/17/98
 4
 5 #include  "pseudorn.h"
 6
 7 // inlinedstuff
 8
```

5 System Code

5.1 driver/driver.h

```
 1 #infdef   DRIVER_H
 2 #define   DRIVER_H
 3
 4 // @(#)driver.h1.2 98/03/20
 5
 6 #include  "qlib.h"
 7 #include  "Callback2wRet.h"
 8
 9 class interpreter{
10 public:
11    interpreter ( ) ;
12    void   add    (sysgen &s              ) ;
```

```
13    void    observe(double &v,char *name);
14        void        obsAttr(Callback2wRet  <  int,double,int>
cb,int,char
      *name);
15    friend  interpreter  &   operator<<(interpreter  &p
,sysgen &s);
16    friend interpreter  &  operator<<(interpreter &p  ,  clk
&c);
17    void  go       (int argc,char **argv);
18 };
19
20
21
22
23
24#endif
```

5.2  driver/driver.cxx

```
1#include  "tcl.h"
2#include  <iostream.h>
3
4#define  MAKE_WISH
5
6#ifdef MAKE_WISH
7#include  "tk.h"
8#endif
9
10 // @(#)driver.cxx  1.3 98/03/27
11
12#include  "qlib.h"
13#include  "qtb.h"
```

199

```
14 #include   "driver.h"
15 #include   "Callback2wRet.h"
16
17 //-----------interpreter OCAPI-related datastructures---
   -----//
18
19 Callback2wRet<int,double,int>functorlist[100];
20 int numfunctors= 0;
21
22 int graphLines= 0;
23
24 FBQ (trace0);
25 FBQ (trace1);
26 FBQ (trace2);
27 FBQ (trace3);
28 FBQ (trace4);
29 FBQ (trace5);
30 FBQ (trace6);
31 FBQ (trace7);
32 dfbfix *traces[8] ;
33 dfbfix *tracedqueue[8] ;
34
35 Tcl_HashTable queue_hash;
36
37 #define    IF_SUFFIX(A)         if((strlen(r->name()) >
   strlen(A)) &&
     (!strcmp(r->name() +strlen(r->name()) - strlen(A) ,A)))
38
39
40 void  create_queue_hash() {
41    Tcl_InitHashTable(&queue_hash,TCL_STRING_KEYS);
42
```

```
43    dfbfix *r;
44    for(r = listOfFB; r; r=, r->nextFB()) {
45      int present;
46      IF_SUFFIX("_mark")
47        continue;
48      IF_SUFFIX("_stim")
49        continue;
50      Tcl_SetHashValue(Tcl_CreateHashEntry(&queue_hash,r-
        >name(),&present) ,(char *) r);
51    }
52   }
53
54 // next are created by the interpreter object itself
55 Tcl_HashTable sched_hash;
56 Tcl_HashTable doubles_hash;
57 Tcl_HashTable attr_hashfunc;
58 Tcl_HashTable attr_hashint;
59
60 clk* glbClk;// global (single)clock
61
62//---------------------------------------------------------
---//
63  int  ListQueue(ClientData,  Tcl_Interp*interp,intargc,
char
    **argv) {
64    if((argc > 2)) {
65      interp->result= "Usage:_listq_?queue?\n";
66      return TCL_ERROR;
67    }
68
69    char *match = 0;
70    if(argc == 2) {
```

201

```
71    match = argv[1] ;
72  }
73
74  if(match) {
75             Tcl_HashEntry*p= Tcl_FindHashEntry(&queue_hash,argv[1] ) ;
76      if(p != 0) {
77         Tcl_AppendElement(interp,          (d(fbfix*)
                Tcl_GetHashValue(p))-
                >name( ) ) ;
78      }
79  } else{
80      Tcl_HashSearch k;
81             Tcl_HashEntry    *p=        Tcl _FirstHashEntry(&queue_hash,k&) ;
82      while (p != 0) {
83         Tcl_AppendElement(interp, ((dfbfix *)
                Tcl_GetHashValue(p))->name( ) ) ;
84         p = Tcl_NextHashEntry(&k);
85      }
86  }
87
88  return TCL_OK;
89 }
90
91 //-----------------------------------------------------//
92 int GetQueue(ClientData , Tcl _Interp * interp,int argc,char
        **argv) {
93    if(argc != 2) {
94       interp->result= "Usage:_getq_queue\n";
```

```
 95    return TCL_ERROR;
 96  }
 97
 98                   Tcl_HashEntry*p         =
Tcl_FindHashEntry(&queue_hash,argv[1] ) ;
 99   if(p != 0) {
100      dfbfix *q = (dfbfix *) Tcl_GetHashValue(p);
101      while (q->getSize()) {
102         strstream N;
103         N << Val(q->get()) <<ends;
104         Tcl_AppendElement(interp,N.str( ) ) ;
105      }
106   }
107
108   return TCL_OK;
109 }
110
111 //------------------------------------------------------------//
112 intPutQueue(ClientData , Tcl _Interp * interp,int argc,char
      **argv) {
113   if(argc != 3) {
114      interp->result= "Usage:_putq_queue_value\n";
115      return TCL_ERROR;
116   }
117
118                   Tcl_HashEntry         *p         =
Tcl_FindHashEntry(&queue_hash,argv[1] ) ;
119   if(p != 0) {
120      double v;
121      sscanf(argv[2] ,"%lf",v&);
```

```
122    dfbfix *q = (dfbfix *) Tcl_GetHashValue(p);
123    q->put(v);
124  }
125
126  return TCL_OK;
127 }
128
129 //------------------------------------------------------------//
130   int   TraceQueue(ClientData,   Tcl   _Interp   *
interp,intargc, char
     **argv) {
131
132  if((argc != 1)&&(argc!= 3 )) {
133                                    interp->result=
"Usage:_traceq_?traceq_queuename?\n";
134   return TCL_ERROR;
135  }
136
137  if(argc == 1) {
138    intk;
139    for(k=0; k<8; k++) {
140      strstream N;
141      N << traces[k]->name() <<"_";
142      if(tracedqueue[k] !=0)
143   N << tracedqueue[k]->name();
144    N << ends;
145      Tcl_AppendElement(interp,N.str( ) ) ;
146    }
147  } else{
148                                 Tcl_HashEntry     *p=
Tcl_FindHashEntry(&queue_hash,argv[2] );
```

204

```
149    dfbfix *q = 0;
150    if(p != 0) {
151      q = (dfbfix *) Tcl_GetHashValue(p);
152    } else {
153      return TCL_OK;
154    }
155
156    int num;
157    for (num=0; num < 8;num++) {
158      if(!strcmp(argv[1] ,traces[num]->name()))
159    break;
160    }
161
162    if(num > 7)
163      return TCL_OK;
164
165    if(tracedqueue[num] !=0) {
166      tracedqueue[num]->asDup(nilFB);
167    }
168
169    tracedqueue[num] =q;
170    q->asDup(*traces[num] ) ;
171  }
172  return TCL_OK;
173 }
174
175 //-------------------------------------------------------//
176 intReadQueue(ClientData , Tcl_Interp * interp,intargc,
char
     **argv) {
177  if(argc != 2) {
```

```
178      interp->result= "Usage:_readq_queue\n";
179    return  TCL_ERROR;
180  }
181
182                Tcl_HashEntry         *p        =
   Tcl_FindHashEntry(&queue_hash,argv[1] );
183    if(p != 0) {
184      dfbfix *q = (dfbfix *) Tcl_GetHashValue(p);
185      int k;
186      for(k=0; k<q->getSize( ); k++) {
187        strstream N;
188        N << Val((*q)[k]) << ends;
189        Tcl_AppendElement(interp,N.str( ) );
190      }
191  }
192
193    return  TCL_OK;
194  }
195
196  //-----------------------------------------------------//
197  int PlotQueue(ClientData, Tcl_Interp * interp,intargc, char
       **argv) {
198    inti;
199    if(argc < 2) {
200      interp->result= "Usage:_plotq_queue_?...?\n";
201      return TCL_ERROR;
202    }
203
204    char *f = tmpnam(NULL);
205    ofstream PLOTBUF(f);
```

206

```
206
207 //------- headers
208 PLOTBUF << "TitleText:_";
209  for(i=1; i<argc; i++) {
210                              Tcl_HashEntry       *p=
    Tcl_FindHashEntry(&queue_hash,argv[i]);
211    if(p != 0)
212       PLOTBUF << ((dfbfix *) Tcl_GetHashValue(p))->name()
    <<"_";
213  }
214 PLOTBUF << "\n";
215
216 PLOTBUF << "BackGround:_Black\n";
217 PLOTBUF << "ForeGround:_White\n";
218 PLOTBUF << "XUnitText:__Sample\n";
219 PLOTBUF << "BoundBox:___True\n";
220 PLOTBUF << "0.Color:____Yellow\n";
221 PLOTBUF << "LabelFont:__-adobe-helvetica-*-r-*-*-16-*-
    *-*-*-*-
    *-*\n";
222 PLOTBUF << "Markers:____True\n";
223  if( !graphLines)
224    PLOTBUF << "NoLines:____True\n";
225
226 //------- data
227  for(i=1; i<argc; i++) {
228 PLOTBUF << "\n";
229                              Tcl_HashEntry       *p=
    Tcl_FindHashEntry(&queue_hash,argv[i]);
230    if(p != 0) {
231       int j;
```

```
232     PLOTBUF << "\""<< (( dfbfix*) Tcl_GetHashValue(p))-
        >name()           ,
        <<"\"\n";
233     for   (j=0;   j<((dfbfix*)   Tcl_GetHashValue(p))-
        >getSize();
        j++) {
234     PLOTBUF     <<    j     <<    "_"<<    ((dfbfix
        *)Tcl_GetHashValue(p))-
        >getIndex(j) <<"\n";
235     }
236   }
237 }
238 PLOTBUF.close();
239
240 system(strapp(strapp("xgraph_",f),"_&"));
241 return  TCL_OK;
242}
243
244 //-----------------------------------------------------------
----//
245 int ScatQueue(ClientData, Tcl _Interp * interp,intargc,
char
    **argv) {
246  int i;
247  if(argc != 3) {
248     interp->result= "Usage:_scatq_queuex_queuey\n";
249    return  TCL_ERROR;
250  }
251
252 ofstream PLOTBUF(".plotbuf");
253
254 //------- headers
```

```
255 PLOTBUF << "TitleText:_";
256 for(i=1; i<argc; i++) {
257             Tcl_HashEntry          *p=
Tcl_FindHashEntry(&queue_hash,argv[i]);
258    if(p != 0)
259        PLOTBUF << ((dfbfix *) Tcl_GetHashValue(p))->name()
<<"_";
260 }
261 PLOTBUF << "\n";
262
263 PLOTBUF << "BackGround:_Black\n";
264 PLOTBUF << "ForeGround:_White\n";
265 PLOTBUF << "XUnitText:__Sample\n";
266 PLOTBUF << "BoundBox:___True\n";
267 PLOTBUF << "0.Color:____Yellow\n";
268 PLOTBUF << "LabelFont:__-adobe-helvetica-*-r-*-*-16-*-
*-*-*-*-
    *-*\n";
269 PLOTBUF << "Markers:____True\n";
270 if( !graphLines)
271    PLOTBUF << "NoLines:____True\n";
272
273 //------- data
274 PLOTBUF << "\n";
275             Tcl_HashEntry      *      p1      =
Tcl_FindHashEntry(&queue_hash,argv[1]) ;
276             Tcl_HashEntry      *      p2      =
Tcl_FindHashEntry(&queue_hash,argv[2]) ;
277    if((p1 != 0)&&(p2 != 0)) {
278        int j;
279        int max = ((dfbfix *) Tcl_GetHashValue(p1))-
>getSize();
```

```
280      if(((dfbfix *) Tcl_GetHashValue(p2))->getSize()
         <max) {
281         max = (((dfbfix *) Tcl_GetHashValue(p2))->getSize(
            ));
282      }
283      for(j=0; j<max; j++) {
284         PLOTBUF << ((dfbfix *) Tcl_GetHashValue(p1))-
            >getIndex(j)
285                 << "_"
286                 << ((dfbfix *) Tcl_GetHashValue(p2))-
            >getIndex(j)<<"\n";
287      }
288   }
289   PLOTBUF.close();
290
291   system("xgraph_.plotbuf_&");
292   return TCL_OK;
293 }
294
295 //-------------------------------------------------
    ---//
296 int StatQueue(ClientData, Tcl _Interp*interp,intargc,
    char
        **argv) {
297   if(argc > 2) {
298      interp->result= "Usage:_statq_?queue?\n";
299      return TCL_ERROR;
300   }
301
302   char *match = 0;
303   if(argc == 2) {
304      match = argv[1] ;
```

```
305  }
306
307  dfbfix *r;
308  for(r = listOfFB; r; r= r->nextFB()) {
309    IF_SUFFIX("_mark")
310      continue;
311    IF_SUFFIX("_stim")
312      continue;
313    if( !match || (s!trcmp(r->name( ),match))) {
314      strstreamN;
315      N << *r << ends;
316      Tcl_AppendElement(interp,N.str( ) ) ;
317    }
318
319  }
320
321  return  TCL_OK;
322 }
323
324 //--------------------------------------------------------
----//
325 int ClearQueue(ClientData, Tcl _Interp*interp,intargc, char
     **) {
326  if(argc > 1) {
327     interp->result= "Usage:_clearq\n";
328     return  TCL_ERROR;
329  }
330
331  dfbfix *r;
332  for(r = listOfFB; r; r= r->nextFB())
333    while (r->getSize() >0 )
```

211

```
334     r->pop();
335
336  return  TCL_OK;
337 }
338
339 //--------------------------------------------------
----//
340    int    ListSchedule(ClientData,Tcl   _Interp*interp,
intargc, char
       **argv) {
341  if((argc > 2)) {
342     interp->result= "Usage:_lists_?schedule?\n";
343   return  TCL_ERROR;
344 }
345
346  char *match = 0;
347  if(argc == 2) {
348    match   = argv[1] ;
349 }
350
351  if(match) {
352          Tcl_HashEntry   *p=    Tcl_FindHashEntry(&sched
_hash,argv[1]);
353     if(p != 0) {
354     Tcl_AppendElement(interp, ((sysgen *)
         Tcl_GetHashValue(p))->getname( ) );
355   }
356 } else{
357    Tcl_HashSearchk;
358       Tcl_HashEntry * p=   Tcl _FirstHashEntry(&sched
_hash,k&);
359   while (p != 0) {
```

212

```
360    Tcl_AppendElement(interp,              ((sysgen*)
       Tcl_GetHashValue(p))-
       >getname( ));
361    p = Tcl_NextHashEntry(&k);
362    }
363 }
364
365 return TCL_OK;
366 }
367
368 //------------------------------------------------
   --//
369 int RunSchedule(ClientData, Tcl _Interp*interp,intargc,
char
      **argv) {
370
371 if((argc != 3)) {
372                                        interp->result=
"Usage:_runs_schedule_clock_iterations\n";
373    return TCL_ERROR;
374 }
375
376    Tcl_HashEntry   *p  =  Tcl_FindHashEntry(&sched
_hash,argv[1] ) ;
377 if(p != 0) {
378    unsigned v;
379    sscanf(argv[2] ,"%d",&v);
380    sysgen *sys = (sysgen *) Tcl_GetHashValue(p);
381
382    while (v--)
383      sys->run(*glbClk);
384
```

```
385  }
386
387  return TCL_OK;
388  }
389
390  //---------------------------------------------//
391  int  VhdlSchedule(ClientData,Tcl _Interp *interp, intargc, char
     **argv) {
392
393  if((argc != 2)) {
394    interp->result= "Usage:_vhdls_schedule\n";
395    return TCL_ERROR;
396  }
397
398      Tcl_HashEntry*p  =  Tcl_FindHashEntry(&sched_hash,argv[1] ) ;
399  if(p != 0) {
400    sysgen *sys = (sysgen *) Tcl_GetHashValue(p);
401    sys->vhdlook();
402  }
403
404  return TCL_OK;
405  }
406
407  //---------------------------------------------//
408    int   ListParameter(ClientData,Tcl_Interp*interp,int argc, char
     **argv) {
409  if((argc > 2)) {
```

214

```
410     interp->result= "Usage:_listp_?parameter?\n";
411     return  TCL_ERROR;
412   }
413
414   char *match = 0;
415   if(argc == 2) {
416     match = argv[1] ;
417   }
418
419   if(match) {
420                       Tcl_HashEntry           *p=
Tcl_FindHashEntry(&doubles_hash,argv[1]);
421     if(p != 0) {
422
Tcl_AppendElement(interp,Tcl_GetHashKey(&doubles_hash,p));
423     }
424   } else{
425     Tcl_HashSearchk;
426                               Tcl_HashEntry           *p=
Tcl_FirstHashEntry(&doubles_hash,k&);
427     while (p != 0) {
428
Tcl_AppendElement(interp,Tcl_GetHashKey(&doubles_hash,p));
429       p = Tcl_NextHashEntry(&k);
430     }
431   }
432
433   return  TCL_OK;
434 }
435 //--------------------------------------------
---//
```

215

```
436  int SetParameter(ClientData,Tcl _Interp *interp,
intargc, char
     **argv) {
437  if((argc != 3)) {
438      interp->result= "Usage:_setp_parameter_value\n";
439      return TCL_ERROR;
440  }
441
442              Tcl_HashEntry       *p        =
Tcl_FindHashEntry(&doubles_hash,argv[1]);
443  if(p != 0) {
444      double v;
445      sscanf(argv[2] ,"%lf",&v);
446      double *q = (double *) Tcl_GetHashValue(p);
447      *q = v;
448  }
449
450  return TCL_OK;
451}
452
453 //------------------------------------------------
---//
454  int ReadParameter(ClientData,Tcl_Interp *interp,int
argc, char
     **argv) {
455  if(argc != 2) {
456      interp->result= "Usage:_readp_parameter\n";
457      return TCL_ERROR;
458  }
459
460              Tcl_HashEntry       *p        =
Tcl_FindHashEntry(&doubles_hash,argv[1]);
```

216

```
461    if(p != 0) {
462      double *q = (double *) Tcl_GetHashValue(p);
463      strstreamN;
464      N << *q << ends;
465      Tcl_AppendElement(interp,N.str( ) ) ;
466    }
467
468    return  TCL_OK;
469 }
470
471 //-------------------------------------------------------//
472 int  ListAttribute(ClientData,Tcl _Interp *interp,int argc,char
        **argv) {
473    if((argc > 2)) {
474      interp->result= "Usage:_lista_?attribute?\n";
475      return TCL_ERROR;
476    }
477
478    char *match = 0;
479    if(argc == 2) {
480      match = argv[1] ;
481    }
482
483    if(match) {
484                       Tcl_HashEntry          *p= Tcl_FindHashEntry(&attr_hashfunc,argv[1]);
485      if(p != 0) {
486        Tcl_AppendElement(interp,Tcl_GetHashKey(&attr_hashfunc,p));
487      }
```

```
488  } else{
489     Tcl_HashSearch k;
490         Tcl_HashEntry *p= Tcl _FirstHashEntry(&attr_hashfunc,&k);
491     while (p != 0) {
492        Tcl_AppendElement(interp,Tcl_GetHashKey(&attr_hashfunc,p));
493        p = Tcl_NextHashEntry(&k);
494     }
495  }
496
497  return TCL_OK;
498 }
499
500 //----------------------------------------------------//
501   int   SetAttribute(ClientData,Tcl_Interp   *interp, int argc, char
         **argv) {
502   if((argc != 3)) {
503      interp->result= "Usage:_set a_attribute_value\n";
504      return TCL_ERROR;
505   }
506
507                        Tcl_HashEntry         *pf= Tcl_FindHashEntry(&attr_hashfunc,argv[1]);
508                        Tcl_HashEntry         *pi= Tcl_FindHashEntry(&attr_hashint,argv[1]);
509
510   if(pf != 0) {
511      int n = (int) Tcl_GetHashValue(pi);
512      double v;
```

```
513     sscanf(argv[2] ,"%lf",&v);
514     //call member func
515     functorlist[(int)Tcl_GetHashValue(pf)](n,v);
516   }
517
518   return   TCL_OK;
519 }
520
521 //-------------------------------------------------
   -----//
522   int    SetLineStyle(ClientData,Tcl_Interp   *interp,
intargc, char
      **argv) {
523   if((argc != 2)) {
524      interp->result= "Usage:_lines_1/0\n";
525      return  TCL_ERROR;
526   }
527
528   int v;
529  sscanf(argv[1] ,"%d", &v);
530   if(v != 0)
531      graphLines= 1;
532   else
533      graphLines= 0;
534
535   return  TCL_OK;
536 }
537
538 //-----------------------------------------------
//
539 int Testbenches(ClientData, Tcl_Interp *interp,intargc, char
```

```
        **argv) {
540     if((argc != 2)) {
541        interp->result= "Usage:_testb_1/0\n";
542        return  TCL_ERROR;
543     }
544
545     int v;
546     sscanf(argv[1] ,"%d", &v);
547     if(v != 0)
548        qtb::glbDisableTestbenches=0;
549     else
550        qtb::glbDisableTestbenches=1;
551
552     return  TCL_OK;
553 }
554
555 //-------------------------------------------------------//
556 int OCAPIHelp(ClientData, Tcl_Interp *interp,int, char **) {
557     Tcl_AppendElement(interp,"Available_OCAPI-related_commands:\n");
558     Tcl_AppendElement(interp,"listq_?queue_name?___  List_queue(s)\n");
559     Tcl_AppendElement(interp,"statq_?queue_name?___  Queue(s)_statistics\n");
560     Tcl_AppendElement(interp,"readq_queue_name___
```

220

```
            Return _queue_contents\n");
561
     Tcl_AppendElement(interp,"getq__queue_name_____
     _
        Return _and_empty_queue_contents\n");
562
     Tcl_AppendElement(interp,"putq__queue_name_value_____
     _
        Add_value_to_queue\n");
563  Tcl_AppendElement(interp,"plotq_queue_name_?...?_____
     _____
        Display_queue_contents_graphically\n");
564  Tcl_AppendElement(interp,"scatq_queue_name_queue_name_
     _____
        Display_queue_contents_graphically\n");
565  Tcl_AppendElement(interp,"traceq_?tracenum_queue_name?
     _____
        Trace_writes_to_the_queue\n");
566  Tcl_AppendElement(interp,"clearq_____
     _____
        Clears_contents_of_queues\n");
567
     Tcl_AppendElement(interp,"lists_?schedule_name?_____
     _
        List_available_schedules\n");
568
     Tcl_AppendElement(interp,"runs_schedule_name_iter_____
     _
        Runs_iter_iterations_of_a_schedule\n");
569
     Tcl_AppendElement(interp,"vhdls_schedule_name_____
     _
```

```
                            221
            Dumps_VHDL_code_for_a_schedule\n");
    570   Tcl_AppendElement(interp,"listp_?parameter_name?_____

List_parameters\n");
    571   Tcl_AppendElement(interp,"setp_parameter_name_value___

List_parameters\n");
    572   Tcl_AppendElement(interp,"readp_parameter_name_____

Return _Variable_Contents\n");
    573
    Tcl_AppendElement(interp,"lista_?attribute_name?_____

List_attributes\n");
    573   Tcl_AppendElement(interp,"seta_attribute_name_value___

Set_attribute\n");
    574   Tcl_AppendElement(interp,"lines_1/0_____

Turns_on/off_line_drawing\n");
    575   Tcl_AppendElement(interp,"testb_1/0_____

Disables_test_benches\n");
    577   return  TCL_OK;
    578 }
    579
    580 //-----------------------------------------------------
    //
    581 // intialization and command definition
    582 int AppInit(Tcl _Interp *interp) {
    583
    584   if( Tcl_Init(interp) ==TCL_ERROR)
```

```
585    return TCL_ERROR;
586
587#ifdef MAKE_WISH
588    if(Tk_Init(interp) ==TCL_ERROR)
589       return TCL_ERROR;
590#endif
591
592    create_queue_hash();
593
594    Tcl_CreateCommand(interp,"listq",ListQueue,     NULL, NULL);
595    Tcl_CreateCommand(interp,"statq",StatQueue,     NULL, NULL);
596    Tcl_CreateCommand(interp,"readq",ReadQueue,     NULL, NULL);
597    Tcl_CreateCommand(interp,"getq", GetQueue,      NULL, NULL);
598    Tcl_CreateCommand(interp,"putq", PutQueue,      NULL, NULL);
599    Tcl_CreateCommand(interp,"plotq",PlotQueue,     NULL, NULL);
600    Tcl_CreateCommand(interp,"scatq",ScatQueue,     NULL, NULL);
601    Tcl_CreateCommand(interp,"traceq",TraceQueue,   NULL, NULL);
602    Tcl_CreateCommand(interp,"clearq",ClearQueue,   NULL, NULL);
603
604    Tcl_CreateCommand(interp,"lists",ListSchedule,  NULL, NULL);
605    Tcl_CreateCommand(interp,"runs", RunSchedule,   NULL, NULL);
```

223

```
606    Tcl_CreateCommand(interp,"vhdls",VhdlSchedule,  NULL, NULL);
607
608    Tcl_CreateCommand(interp,"listp",ListParameter,NULL, NULL);
609    Tcl_CreateCommand(interp,"setp", SetParameter, NULL, NULL);
610    Tcl_CreateCommand(interp,"readp",ReadParameter,NULL, NULL);
611
612    Tcl_CreateCommand(interp,"lista",ListAttribute,NULL, NULL);
613    Tcl_CreateCommand(interp,"seta", SetAttribute, NULL, NULL);
614
615    Tcl_CreateCommand(interp,"testb",Testbenches,   NULL, NULL);
616    Tcl_CreateCommand(interp,"lines",SetLineStyle,  NULL, NULL);
617    Tcl_CreateCommand(interp,"OCAPI",OCAPIHelp,     NULL, NULL);
618
619    return  TCL_OK;
620 }
621
622
623 //-------------------------------------------------//
624
625 interpreter & operator<<( interpreter &p, sysgen &s ) {
626    p.add(s);
627    return  p;
```

```
628 }
629
630 interpreter & operator<<( interpreter &p, clk &ck) {
631   glbClk= &ck;
632   return p;
633 }
634
635 void  interpreter::observe(double &v,char *name) {
636   int present;
637   Tcl_SetHashValue(Tcl_CreateHashEntry(&doubles_hash,name,
       &present),(char*) &v);
638 }
639
640                                                         void
  interpreter::obsAttr(Callback2wRet<int,double,int>f,int
    n, char *name) {
641   int present;
642   functorlist [numfunctors++]=f;
643   if(numfunctors>100) {
644     cerr<< "***_ERROR:_max_num_functors_exceeded\n";
645     exit(0);
646   }
647   Tcl_SetHashValue(Tcl_CreateHashEntry(&attr_hashfunc,name,
       &present),(char *)numfunctors-1);
648   Tcl_SetHashValue(Tcl_CreateHashEntry(&attr_hashint,name,
       &present),(char *)n);
649 }
650
651 interpreter::interpreter() {
```

```
652    Tcl _InitHashTable(&sched_hash,TCL_STRING_KEYS);
653    Tcl _InitHashTable(&doubles_hash,TCL_STRING_KEYS);
654    Tcl _InitHashTable(&attr_hashfunc,TCL_STRING_KEYS);
655    Tcl _InitHashTable(&attr_hashint,TCL_STRING_KEYS);
656    numfunctors= 0;
657    traces[0] = &trace0;   tracedqueue[0] = &nilFB;
658    traces[1] = &trace1;   tracedqueue[1] = &nilFB;
659    traces[2] = &trace2;   tracedqueue[2] = &nilFB;
660    traces[3] = &trace3;   tracedqueue[3] = &nilFB;
661    traces[4] = &trace4;   tracedqueue[4] = &nilFB;
662    traces[5] = &trace5;   tracedqueue[5] = &nilFB;
663    traces[6] = &trace6;   tracedqueue[6] = &nilFB;
664    traces[7] = &trace7;   tracedqueue[7] = &nilFB;
665}
666
667 void   interpreter::add(sysgen &s) {
668   int present;
669   Tcl_SetHashValue(Tcl_CreateHashEntry(&sched_hash,s.get name(),
       &present),(char *) &s);
670}
671
672 void   interpreter::go(intargc,char **argv) {
673#ifdef MAKE_WISH
674    Tk_Main(argc,argv, AppInit);
675#else
676    Tcl_Main(argc,argv, AppInit);
677#endif
678
679}
680
681
```

5.3 driver/sys.cxx

```
1  // sys.cxx
2  // All rights reserved -- Imec 1998
3  // @(#)sys.cxx 1.5 98/03/31
4
5  #include "qlib.h"
6  #include "hshake.h"
7  #include "driver.h"
8  #include "sys.h"
9
10 double glbQPSK       = 0. ; // for QPSK -> 1
11 double glbDiff       = 0. ; // for Diff Enc-> 1
12 double glbT1         = 0. ;
13 double glbT2         = 0. ;
14 double glbT3         = 0. ;
15 double glbT20        = 0. ;
16 double glbNoiseLevel = 0. ;
17 double glbADWbits    = 10. ;
18 double glbADLbits    = 6. ;
19
20 int main(int argc, char **argv) {
21
22   LOADTYPES( ../rx/TYPEDEF);
23
24   //global synchronous clock
25   clkck;
26
27 //-----------------------------------------------------------
28 //
29 //byte source
```

227

```
30    //
31    FBQ( tx_bytes ) ;
32    pseudorn_gen GEN_RN("gen_rx",
33              tx_bytes);
34
35    sysgen GEN("GEN");
36    GEN << GEN_RN;
37
38    //-------------------------------------------------
      -----
39    //
40    //transmitter
41    //
42    FBQ( tx_rnd_bytes) ;
43    FBQ(tx_symbols   ) ;
44    FBQ( tx_dif_symbols);
45    FBQ( tx_ival    ) ;
46    FBQ( tx_qval    ) ;
47    FBQ( tx_sig     ) ;
48    FBQ( tx_sig_quant) ;
49
50    rnd       TX_RND   ("tx_derandm",
51              tx_bytes,
52              tx_rnd_bytes);
53    tuplelize TX_TUPLE("tx_tuple",
54              tx_rnd_bytes,
55              tx_symbols,
56              glbQPSK);
57    diffenc   TX_DIFFE("tx_diffe",
58              tx_symbols,
59              tx_dif_symbols,
60              glbQPSK,
```

```
61              glbDiff);
62  map     TX_MAP   ("tx_map",
63              tx_dif_symbols,
64              tx_ival,
65              tx_qval,
66              glbQPSK);
67  shape   TX_SHAPE("tx_shape",
68              tx_ival,
69              tx_qval,
70              tx_sig);
71  ad      TX_AD    ("tx_ad",
72              tx_sig,
73              tx_sig_quant,
74              glbADWbits,
75              glbADLbits);
76
77   sysgen TX("TX");
78  TX << TX_RND;
79  TX << TX_TUPLE;
80  TX << TX_DIFFE;
81  TX << TX_MAP;
82  TX << TX_SHAPE;
83  TX << TX_AD;
84
85  //---------------------------------------------------
86  //
87  //channel
88  //
89  FBQ( chan_isi);
90  FBQ(chan_out);
91
```

```
 92   fir     CHAN_FIR("chan_fir",
 93           tx_sig_quant,
 94           chan_isi,
 95           glbT1,
 96           glbT2,
 97           glbT3,
 98           glbT20);
 99
100   noise   CHAN_NOISE("chan_noise",
101           chan_isi,
102           chan_out,
103           glbNoiseLevel);
104
105   sysgen CHAN("CHAN");
106 CHAN << CHAN_FIR;
107 CHAN << CHAN_NOISE;
108
109 //--------------------------------------------------------
110 //
111 //receiver
112 //
113 FBQ(rx_constel_mode);
114 FBQ(rx_lms_i);
115 FBQ(rx_lms_q);
116 FBQ(rx_symtype);
117   lmsff RX_LMSFF("lmsff",
118           ck,
119           rx_constel_mode,
120           chan_out,
121
122           rx_lms_i,
```

```
       123         rx_lms_q,
       124         rx_symtype          ,
       125      );
       126
  5    127 RX_LMSFF.setAttr (lmsff::FWLENGTH,   8         ) ;
       128 RX_LMSFF.setAttr (lmsff::STEP_PAR,   4         ) ;
       129 RX_LMSFF.setAttr (lmsff::P0,         -0.2*2.0);
       130 RX_LMSFF.setAttr (lmsff::P1,         0.7*2.0);
       131 RX_LMSFF.setAttr (lmsff::P2,         0.7*2.0);
  10   132 RX_LMSFF.setAttr (lmsff::P3,         -0.2*2.0);
       133 RX_LMSFF.setAttr (lmsff::REF,        3.0       ) ;
       134 RX_LMSFF.setAttr (lmsff::INIT                  ) ;
       135 RX_LMSFF.setAttr (lmsff::SPS_PAR,    4         ) ;
       136
  15   137 FBQ(rx_symtype_at);
       138 FBQ( rx_diff_mode);
       139 FBQ(rx_symbol);
       140    demap RX_DEMAP("demap",
       141         ck,
  20   142         rx_symtype,
       143         rx_diff_mode,
       144         rx_lms_i,
       145         rx_lms_q,
       146
  25   147         rx_symtype_at,
       148         rx_symbol
       149      ) ;
       150
       151 RX_DEMAP.setAttr (demap::DEBUGMODE,0);
  30   152 RX_DEMAP.setAttr (demap::REF,3.0);
       153
       154 FBQ( rx_syncro);
```

```
155 FBQ( rx_byte _rnd);
156   detupleRX_DETUPLE("detuple",
157          ck,
158          rx_symbol,
159          rx_symtype _at,
160
161          rx_byte _rnd,
162          rx_syncro
163          ) ;
164
165 RX_DETUPLE.setAttr (detuple:D:EBUGMODE,0);
166
167 FBQ( rx_byte_out);
168 FBQ( rx_sync_out);
169   derandRX_DERAND("derand",
170          ck,
171          rx_byte_rnd,
172          rx_syncro,
173
174          rx_byte_out,
175          rx_sync_out
176          ) ;
177
178 RX_DERAND.setAttr (derand::DEBUGMODE,0     ) ;
179 RX_DERAND.setAttr (derand::SEED,       0x3f);
180 RX_DERAND.setAttr (derand::BYPASS,     0    ) ;
181
182   sysgen RX_UT("RX_UT");
183 RX_UT << RX_LMSFF;
184 RX_UT << RX_DEMAP;
185 RX_UT << RX_DETUPLE;
186 RX_UT << RX_DERAND;
```

```
187
188 //-----------------------clocktrue definition
189   handshake hsk1("h1",ck);
190   handshake hsk2("h2",ck);
191   handshake hsk3("h3",ck);
192
193   rx_lms_i.sethandshake(hsk1);
194   rx_symbol.sethandshake(hsk2);
195   rx_byte_rnd.sethandshake(hsk3);
196
197 RX_LMSFF   .define();
198 RX_DEMAP   .define();
199 RX_DETUPLE.define();
200 RX_DERAND  .define();
201
202   sysgen RX_TI("RX_TI");
203   RX_TI  << RX_LMSFF  .fsm();
204   RX_TI  << RX_DEMAP  .fsm();
205   RX_TI  << RX_DETUPLE.fsm();
206   RX_TI  << RX_DERAND .fsm();
207
208 //--- iopad definition
209   dfix T_byte(0,8,0);
210   RX_TI.inpad(chan_out,      T(T_sample_lms));
211   RX_TI.inpad(rx_diff_mode,  T_bit);
212   RX_TI.inpad(rx_constel_mode,T_bit);
213   RX_TI.outpad(rx_byte_out,  T_byte);
214   RX_TI.outpad(rx_sync_out,  T_bit);
215
216 //--- insert clear registersstate
217 RX_LMSFF   .fsm().clear_regs();
218 RX_DEMAP   .fsm().clear_regs();
```

232

```
219 RX_DETUPLE.fsm().clear_regs();
220 RX_DERAND .fsm().clear_regs();
221
222 //---- testbench generator for this clocktrue model
223 RX_LMSFF  .fsm().tb _enable();
224 RX_DEMAP  .fsm().tb _enable();
225 RX_DETUPLE.fsm().tb _enable();
226 RX_DERAND .fsm().tb _enable();
227 RX_TI          .tb _enable();
228 RX_TI          .generate();
229
230 //------------------------------------------------------
231 //
232 //interpreter
233 //
234  interpreter P;
235 P << GEN;
236 P << TX;
237 P << CHAN;
238 P << RX_UT;
239 P << RX_TI;
240 P << ck;
241
242 P.observe(glbQPSK      ,"QPSK"      ) ;
243 P.observe(glbT1        ,"T1"        ) ;
244 P.observe(glbT2        ,"T2"        ) ;
245 P.observe(glbT3        ,"T3"        ) ;
246 P.observe(glbT20       ,"T20"       ) ;
247 P.observe(glbNoiseLevel,"NoiseLevel");
248 P.observe(glbADWbits   ,"ADWbits"   ) ;
249 P.observe(glbADLbits   ,"ADLbits"   ) ;
```

```
250 P.observe(glbDiff      ,"DiffEnc"   ) ;
251
252 P.ATTRIBUTE(lmsff  ,RX_LMSFF   ,FWLENGTH ,lmsff_fwlen) ;
253 P.ATTRIBUTE(lmsff  ,RX_LMSFF   ,STEP_PAR ,lmsff_step) ;
254 P.ATTRIBUTE(lmsff  ,RX_LMSFF   ,P0       ,lmsff_p0   ) ;
255 P.ATTRIBUTE(lmsff  ,RX_LMSFF   ,P1       ,lmsff_p1   ) ;
256 P.ATTRIBUTE(lmsff  ,RX_LMSFF   ,P2       ,lmsff_p2   ) ;
257 P.ATTRIBUTE(lmsff  ,RX_LMSFF   ,P3       ,lmsff_p3   ) ;
258 P.ATTRIBUTE(lmsff  ,RX_LMSFF   ,INIT     ,lmsff_init) ;
259 P.ATTRIBUTE(derand,RX_DERAND  ,SEED      ,derand_seed) ;
260 P.ATTRIBUTE(derand,RX_DERAND  ,BYPASS    ,derand_bypass);
261
262 P.go(argc,argv);
263
264}
265
```

5.4 driver/sys.h

```
1#infdef   SYS_H
2#define   SYS_H
3
4
5 // @(#)sys.h   1.3 98/03/27
6
7#include "Callback2wRet.h"
8
9#define ATTRIBUTE(CLASS,INST,PARM,NAME) \
10    obsAttr(make_callback((Callback2wRet<int,double,int>0
      *),
      &INST,CLASS::setAttr),CLASS::PARM,#NAME)
11
```

```
12
13                                       //
P.obsAttr(make_callback((Callback2wRet<int,double,int> *)0,
&RX_LMSFF,lmsff::setAttr),lmsff::FWLENGTH,"lmsff_fwlen");
14
15#define DEBUGQ(A)   FBQ(A)  ;FBQ(db_##A)  ;A.asDup(db_##A);
16
17#include "../tx/rnd.h"
18#include "../tx/tuplelize.h"
19#include "../tx/diffenc.h"
20#include "../tx/map.h"
21#include "../tx/shape.h"
22#include "../tx/ad.h"
23#include "../chan/fir.h"
24#include "../chan/noise.h"
25#include "../rx/lmsff.h"
26#include "../rx/demap.h"
27#include "../rx/detuple.h"
28#include "../rx/derand.h"
29
30#endif
```

6 Receiver Code

6.1 rx/demap.h

```
1//-----------------------------------------------------------
2 // COPYRIGHT
```

236

```
3 //   =========
4 //
5 //   Copyright 1996 IMEC, Leuven,Belgium
6 //
7 //   All rights reserved.
8 //
9 //------------------------------------------------------
10 // Module:
11 //      MAP
12 //
13 // Purpose:
14 //   Mapping of QAM16/QPSK constellations to symbols
@(#)demap.h
        1.5 98/03/30
15 //
16 // Author:
17 //      Patrick Schaumont/ Radim Cmar
18//-------------------------------------------------------
19
20#infdef DEMAP_H
21#define DEMAP_H
22
23#include "qlib.h"
24#ifdef I2C
25#include "i2c_master.h"
26#include "i2c_slave.h"
27#endif
28#include "macros.h"
29#include "typedefine.h"
30
```

```
31 class demap : public base{
32 public:
33
34   clk& _ck;
35 #ifdef I2C
36    i2c_slave _slave;
37 #endif
38   PRT(symtype_in);
39   PRT(diff_mode);
40   PRT(i_in);
41   PRT(q_in);
42   PRT(symtype_out);
43   PRT(symbol_out);
44   ctlfsm _fsm;
45
46 public:
47   enum {DEBUGMODE, REF};
48   enum {QAM16, QPSK};
49   int debug_mode;
50   double ref;
51
52   demap(char *name,
53         clk& clk,
54         _PRT(symtype_in),
55         _PRT(diff_mode),
56         _PRT(i_in),
57         _PRT(q_in),
58         _PRT(symtype_out),
59         _PRT(symbol_out) );
60
61   ~demap();
62   int setAttr(int Attr, double v=0);
```

```
63    int decide(dfix constel, dfixest);
64    int run();
65    void define();
66    ctlfsm & fsm();
67#ifdef I2C
68    i2c_slave&slave();
69#endif
70
71 };
72
73#endif
```

6.2  rx/demap.cxx

```
1//------------------------------------------------------------
2 // COPYRIGHT
3 // ========
4 //
5 // Copyright1996 IMEC, Leuven,Belgium
6 //
7 // Allrights reserved.
8 //
9//------------------------------------------------------------
10 // Module:
11 //    MAP
12 //
13 // Purpose:
14 //    Mapping of QAM16/QPSKconstellations to symbols
@(#)demap.cxx 1.8 98/0*
*4/07
```

```
15 //
16 // Author:
17 //     Radim Cmar
18//-------------------------------------------------
    ----
19
20
21 #include "demap.h"
22 #include "trans.h"
23
24 // QAM16
25 static int vIQMap16[4] [4] = {
26   { 15,14, 10, 11},
27   { 13,12,  8,  9},
28   { 5 ,  4,  0,  2},
29   { 7 ,  6,  1,  3}};
30
31 // QPSK
32 static int vIQMap4[2] [2] = {
33   { 3,2}, {1, 0}};
34
35 demap::demap(char *name,
36              clk& clk,
37              _PRT(symtype_in),
38              _PRT(diff_mode),
39              _PRT(i_in),
40              _PRT(q_in),
41              _PRT(symtype_out),
42              _PRT(symbol_out)
43            ) : base(name),
44     _ck(clk),
45 #ifdef I2C
```

```
46    _slave(strapp(name,"_i2c_host")),
47#endif
48    IS_SIG(symtype_in,T_bit),
49    IS_SIG(diff_mode,T_bit),
50    IS_SIG(i_in,T_float),
51    IS_SIG(q_in,T_float),
52    IS_REG(symtype_out,_ck, T_bit),
53    IS_REG(symbol_out,_ck, T_float)
54 {
55    IS _IP(symtype_in);
56    IS _IP(diff_mode);
57    IS _IP(i_in);
58    IS _IP(q_in);
59    IS_OP(symtype_out);
60    IS_OP(symbol_out);
61
62    debug_mode= 0;
63 }
64
65 demap::"demap() {
66 }
67
68 int demap::setAttr(intAttr,double v) {
69    switch(Attr) {
70    case REF:
71       ref= v; break;
72    case DEBUGMODE:
73       debug_mode = (int) v; break;
74    }
75    return 1;
76 }
77
```

241

```
78 //------------------------------------------------------
   ---                          '
79
80 int demap::run() {
81
82    int thissym;
83    int ik, qk;
84    int n_ik,n_qk;
85    static int ik_at= 1;
86    static int qk_at= 1;
87
88    if( (FBID(i_in).getSize() <1) ||
89        (FBID(q_in).getSize() <1) ||
90        (FBID(symtype_in).getSize() <1) ||
91        (FBID(diff_mode).getSize() <1)
92      )
93      return 0;
94
95    dfix vi = FBID(i_in).get();
96    dfix vq = FBID(q_in).get();
97    dfix constel = FBID(symtype_in).get();
98    dfix diffdec= FBID(diff_mode).getIndex(0);
99
100   int indi = decide(constel,vi);
101   int indq = decide(constel,vq);
102
103   if( constel== QAM16) {
104      thissym= vIQMap16[indi][indq] ;
105   } else{
106      thissym=  vIQMap4[indi][indq] ;
107   }
108   int thissym0 = thissym;
```

```
109
110          ,
111  if( diffdec== 1) {
112      if(constel == QAM16) {
113          ik = (thissym>>  3) &1;
114          qk = (thissym>>  2) &1;
115                                                          n_ik=
((("(ik^qk))&(ik^ik_at))|((ik^qk)&(qk^qk_at)))&1;
116                                                          n_qk=
((("(ik^qk))&(qk^qk_at))|((ik^qk)&(ik^ik_at)))&1;
117          ik_at= ik;
118          qk_at= qk;
119          thissym = (n_ik<<3 ) + (n_qk<< 2) + (thissym &
3);
120
121      } else {
122          ik = (thissym>>  1) &1;
123          qk = (thissym      ) & 1;
124                                                          n_ik=
((("(ik^qk))&(ik^ik_at))|((ik^qk)&(qk^qk_at)))&1;
125                                                          n_qk=
((("(ik^qk))&(qk^qk_at))|((ik^qk)&(ik^ik_at)))&1;
126          ik_at= ik;
127          qk_at= qk;
128          thissym = (n_ik<<1 ) + (n_qk    ) ;
129      }
130  }
131
132  if(debug_mode)
133  cout<< "_constel:_"<<constel
134      << "_i:_"<<vi
135      << "_q:_"<<vq
```

```
136         << "_thissym0:_"<<thissym0
137         << "_ik:_"<<ik
138         << "_qk:_"<<qk
139         << "_n_ik:_"<<n_ik
140         << "_n_qk:_"<<n_qk
141         << "_thissym:_"<<thissym<<endl;
142
143  FBID(symbol_out) << (thissym);
144  FBID(symtype_out) << (constel);
145
146   return  1;
147 }
148
149 int demap::decide(dfix constel,dfix est) {
150   double c = ref/3;
151   if(constel== QAM16) {
152     if(est > dfix(2*c))
153       return  3;
154     else if (est > dfix(0))
155       return  2;
156     else if (est > dfix(-2*c))
157       return  1;
158     else
159       return  0;
160  } else{
161     if(est > dfix(0.))
162       return  1;
163     else
164       return  0;
165 }
166 }
167
```

```
168//---------------------------------------------------------
   ----                          ,
169
170 ctlfsm & demap::fsm() {
171   return _fsm;
172 }
173
174 #ifdef I2C
175 i2c_slave & demap::slave() {
176   return _slave;
177 }
178 #endif
179
180 void demap::define() {
181   int i;
182
183   dfixT_2bit(0,2,0,dfix::tc);
184   dfixT_cnt(0,3,0,dfix::ns) ;      // symbol counter upto 4
185   dfixT_symb(0,4,0,dfix::ns) ;     // symbol type 0..15
186
187 PORT_TYPE(i_in,T(T_sample_demap) );//user type
188 PORT_TYPE(q_in,T(T_sample_demap) );//user type
189 PORT_TYPE(symbol_out,T_symb);
190
191 FSM(_fsm);
192   INITIAL(rst);
193 STATE(phase1);
194 STATE(phase2);
195 STATE(phase3);
196
197 SIGCK(constelqam, _ck, T_bit);
```

245

```
198 SIGCK(diffdecod, _ck, T_bit);
199 SIGCK(i_inp,_ck, T(T_sample_demap));
200 SIGCK(q_inp,_ck, T(T_sample_demap));
201 SIGW(indi, T_2bit);
202 SIGW(indq, T_2bit);
203 SIGCK(start_frame,_ck, T_bit);
204 _sigarraymaps16("maps",16, &_ck, T_symb);
205 _sigarraymaps4("maps",4 , &_ck,T_symb);
206 SIGW(symb0, T_symb);
207 SIGW(symb1, T_symb);
208 SIGW(ik, T_bit);
209 SIGW(qk, T_bit);
210 SIGW(ik _1,T_bit);
211 SIGW(qk_1, T_bit);
212 SIGCK(ik_at,_ck, T_bit);
213 SIGCK(qk_at,_ck, T_bit);
214 SIGW(ak, T_bit);
215 SIGW(bk, T_bit);
216
217 #ifdef I2C
218   for(i = 0; i < 16; i++)
219     _slave.put(&maps16[i] ) ;
220   for(i = 0; i < 4; i++)
221     _slave.put(&maps4[i] ) ;
222 #endif
223
224
225 SFG(demap_allways);
226   GET(diff_mode);
227   diffdecod= diff_mode;
228
229
```

```
230 SFG(demap_reset);
231   for(i = 0; i < 16; i++)
232     maps16[i] = W(T_symb,vIQMap16[i/4] [i%4] ) ;
233   for(i = 0; i < 4; i++)
234     maps4[i] = W(T_symb,vIQMap4[i/2] [i%2] ) ;
235
236   setv(start_frame,0);
237   setv(ik_at,0);
238   setv(qk_at,0);
239
240
241 SFG(demap_qam16);
242   double c = ref/3;
243     indi= (i_inp<= C(i_inp,-2*c) )c.assign(C(indi,0),
244         (i_inp<= C(i_inp,0.0) )c.assign(C(indi,1),
245
(i_inp<=C(i_inp,+2*c))c.assign(C(indi,2),C(indi,3))));
246
247     indq= (q_inp<= C(q_inp,-2*c) )c.assign(C(indq,0),
248         (q_inp<= C(q_inp,0.0) )c.assign(C(indq,1),
249
(q_inp<=C(q_inp,+2*c))c.assign(C(indq,2),C(indq,3))));
250
251
symb0=((indi==W(T_2bit,0))&(indq==W(T_2bit,0))).cassign(maps16[
0],
252
((indi==W(T_2bit,0))&(indq==W(T_2bit,1))).cassign(maps16[1],
253   ((indi==W(T_2bit,0))&(indq==W(T_2bit,2))).cassign(maps
16[2],
254   ((indi==W(T_2bit,0))&(indq==W(T_2bit,3))).cassign(maps
16[3],
```

247

```
255
    ((indi==W(T_2bit,1))&(indq==W(T_2bit,0))).cassign(maps16[4]
    ,
    256
5   ((indi==W(T_2bit,1))&(indq==W(T_2bit,1))).cassign(maps16[5]
    ,
    257
    ((indi==W(T_2bit,1))&(indq==W(T_2bit,2))).cassign(maps16[6]
    ,
    258
    ((indi==W(T_2bit,1))&(indq==W(T_2bit,3))).cassign(maps16[7]
    ,
    259
    ((indi==W(T_2bit,2))&(indq==W(T_2bit,0))).cassign(maps16[8]
15  ,
    260
    ((indi==W(T_2bit,2))&(indq==W(T_2bit,1))).cassign(maps16[9]
    ,
    261
    ((indi==W(T_2bit,2))&(indq==W(T_2bit,2))).cassign(maps16[10
    ],
    262
    ((indi==W(T_2bit,2))&(indq==W(T_2bit,3))).cassign(maps16[11
    ],
    263
    ((indi==W(T_2bit,3))&(indq==W(T_2bit,0))).cassign(maps16[12
    ],
    264
    ((indi==W(T_2bit,3))&(indq==W(T_2bit,1))).cassign(maps16[13
30  ],
```

248

```
265         ((indi==W(T_2bit,3))&(indq==W(T_2bit,2))).cassign(maps16[14
    ],
266
    maps16[15]
267         ))))))))))));
268
269     ik_1= (start_frame).cassign(W(T_bit,0)i,k_at);
270     qk_1= (start_frame).cassign(W(T_bit,0)q,k_at);
271
272     ik = cast(T_bit,symb0>> W(T_cnt,3) ) ;
273     qk = cast(T_bit,symb0>> W(T_cnt,2) ) ;
274     ak = (("(ik ^ qk)) & (ik ^ ik_1) ) | ((ik^qk) & (qk^ qk_1));
275     bk = (("(ik ^ qk)) & (qk ^ qk_1) ) | ((ik^qk) & (ik^ ik_1));
276     ik_at=ik;
277     qk_at=qk;
278
279     symb1 = (symb0 &W (T_symb,3) ) |
280                 ((cast(T_symb,ak)   <<W(T_symb,3))   &W (T_symb,8) ) |
281                 ((cast(T_symb,bk)   <<W(T_symb,2))   &W (T_symb,4) ) ;
282     symbol_out= (diffdecod).cassign(symb1,symb0);
283
284
285 SFG(demap_qpsk);
286                 indi=   (i_inp<   C(i_inp,0)
    )c.assign(C(indi,0),C(indi,1) ) ;
287                 indq=   (q_inp<   C(q_inp,0)
    )c.assign(C(indq,0),C(indq,1) ) ;
```

```
288
289 symb0=((indi==W(T_2bit,0))&(indq==W(T_2bit,0)))
        .cassign(maps4[0],
290
    ((indi==W(T_2bit,0))&(indq==W(T_2bit,1))).cassign(maps4[1],
291
    ((indi==W(T_2bit,1))&(indq==W(T_2bit,0))).cassign(maps4[2],
292
    maps4[3]
293     ))) ;
294
295     ik_1= (start_frame).cassign(W(T_bit,0),ik_at);
296     qk_1= (start_frame).cassign(W(T_bit,0),qk_at);
297
298     ik= cast(T_bit,symb0>> W(T_bit,1) ) ;
299     qk = cast(T_bit,symb0);
300     ak = (("(ik ^ qk)) & (ik^ ik_1) ) | ((ik^qk) & (qk^ qk_1));
301     bk = (("(ik ^ qk)) & (qk^ qk_1) ) | ((ik^ qk) & (ik^ ik_1));
302     ik_at=ik;
303     qk_at=qk;
304
305     symb1 = ((cast(T_symb,ak) <<W(T_symb,1)) &W(T_symb,2) ) |
306             (cast(T_symb,bk) &W(T_symb,1) ) ;
307     symbol_out= (diffdecod).cassign(symb1,symb0);
308
309
310 SFG(demap_in);
311 GET(i_in);
312 GET(q_in);
```

```
313   GET(symtype_in);
314     i_inp=i_in;
315     q_inp=q_in;
316     constelqam= "symtype_in;
317     symtype_out= symtype_in;
318
319   SFG(demap_out);
320     PUT(symbol_out);
321     PUT(symtype_out);
322
323
324 //------------------------------------------------
325
326   DEFAULTDO(demap_allways);
327   AT (rst) ALLWAYS
328     DO(demap_reset)
329     GOTO(phase1);
330
331   AT (phase1)ALLWAYS
332     DO(demap_in)
333     GOTO(phase2);
334
335   AT (phase2)ON (_cnd(constelqam))
336     DO(demap_qam16)
337     GOTO(phase3);
338
339   AT (phase2)ON ( !_cnd(constelqam))
340     DO(demap_qpsk)
341     GOTO(phase3);
342
343   AT (phase3)ALLWAYS
344     DO(demap_out)
```

```
345    GOTO(phase1);
346
347
348#ifdef I2C
349    _slave.attach(_fsm,*state_phase2,_ck);
350#endif
351
352    _fsm.setinfo(verbose);
353    ofstream F0("demap_trans0.dot");
354    F0<<_fsm;
355    F0.close();
356
357    transform TRANSF(_fsm);
358 TRANSF.fsm_handshake1(_ck);
359
360    ofstream F("demap_trans.dot");
361 F <<   _fsm;
362 F .close();
363    _fsm.setinfo(silent);
364
365 FSMEXP(typeName( ) ) ;
366}
367
```

6.3    rx/derand.h

```
1//-------------------------------------------------------
       ----
2 //   COPYRIGHT
3 //   =========
4 //
5 //   Copyright 1996 IMEC, Leuven,Belgium
```

```
 6 //
 7 // All rights reserved.
 8 //
 9//-------------------------------------------------------
----
10 // Module:
11 //    PRBS
12 //
13 // Purpose:
14 //    De-randomises data usinga 6-bit or 15-bit
15 //    Pseudo Random Binary Sequence.   @(#)derand.h1.2 98/03/30
16 //
17 // Author:
18 //    r cmar
19 //
20//-------------------------------------------------------
----
21
22#include "qlib.h"
23#ifdef  I2C
24#include "i2c_master.h"
25#include "i2c_slave.h"
26#endif
27#include "macros.h"
28#include "typedefine.h"
29
30#infdef DERAND_H
31#define DERAND_H
32
33 class derand : public base
34 {
```

```
35
36  public:
37     clk & _ck;
38 #ifdef I2C
39     i2c_slave _slave;
40 #endif
41     PRT(byte_in);
42     PRT(syncro);
43     PRT(byte_out);
44     PRT(sync_out);
45     ctlfsm_fsm;
46
47     enum {SEED, BYPASS,DEBUGMODE};
48
49     derand(char *name,
50            clk& clk,
51            _PRT(byte_in),
52            _PRT(syncro),
53            _PRT(byte_out),
54            _PRT(sync_out)
55     ) ;
56
57     setAttr(int Attr, double v=0);
58     int run();
59     void define();
60     ctlfsm & fsm();
61 #ifdef I2C
62     i2c_slave &slave();
63 #endif
64
65  public:
66     int bypass;
```

```
67    int seed;
68    int debug;
69 };
70
71 #endif
```

6.4 rx/derand.cxx

```
1 //-------------------------------------------------------
2 // COPYRIGHT
3 // ========
4 //
5 // Copyright 1996 IMEC, Leuven,Belgium
6 //
7 // Allrights reserved.
8 //
9 //-------------------------------------------------------
10 // Module:
11 //   PRBS
12 //
13 // Purpose:
14 //   De-randomises data usinga 6-bit or 15-bit
15 //   Pseudo Random Binary Sequence.@(#)derand.cxx1.8 98/04/07
16 //
17 // Authors:
18 //   r cmar
19 //
20 //-------------------------------------------------------
```

```
21
22 #include "derand.h"
23 #include "trans.h"
24
25 derand::derand(char *name,
26              clk& clk,
27              _PRT(byte_in),
28              _PRT(syncro),
29              _PRT(byte_out),
30              _PRT(sync_out)
31              ) : base(name),
32   _ck(clk),
33 #ifdef I2C
34   _slave(strapp(name,"_i2c_host")),
35 #endif
36   IS_SIG(byte_in,T_8bit),
37   IS_SIG(syncro,T_bit),
38   IS_REG(byte_out,clk,T_8bit),
39   IS_REG(sync_out,clk,T_bit)
40 {
41   IS_IP(byte_in);
42   IS_IP(syncro);
43   IS_OP(byte_out);
44   IS_OP(sync_out);
45
46   bypass= 0;
47   seed= 0x3f;
48   debug= 0;
49 }
50
51 //-------------------------------------------------------------
```

256

```
52
53 int derand::setAttr(int Attr,double v)
54 {
55   switch(Attr)
56   {
57     case SEED:
58       seed= (int)v; break;
59     case BYPASS:
60       bypass = (int)v; break;
61     case DEBUGMODE:
62       debug = (int)v; break;
63   }
64   return 1;
65 }
66
67//----------------------------------------------------------
68
69 int derand::run()
70 {
71   static unsigned shiftreg= 0;
72
73 #define BiT(k, n)   ((k>> (n-1)) & 1)
74 #define MaSK(k, n)  (k & ((1<< (n+1))-1))
75
76                              if((FBID(byte_in).getSize()<1)||F(BID(syncro).getSize()<1))
77     return 0;
78
79   dfix data _in=FBID(byte _in).get();
80   dfix sync  = FBID(syncro).get();
81
```

```
82   unsigned data = unsigned(data_in.Val( ) ) ;
83
84   if(bypass == 0) {
85
86     if(sync == dfix(1))
87       shiftreg= seed;
88
89     unsigned mask = 0;
90     int xbit;
91     for(int k=0; k<8; k++) {
92       xbit    = BiT(shiftreg,5) ^ BiT(shiftreg,6 );
93       shiftreg= MaSK(xbit | (shiftreg<< 1) ,6);
94       mask    = (mask<< 1) |xbit;
95     }
96
97     data ^= mask;
98   }
99
100 FBID(byte_out) <<dfix((double)(data) ) ;
101 return   1;
102}
103
104//-------------------------------------------------------
     -----
105
106 ctlfsm & derand::fsm() {
107   return _fsm;
108}
109
110#ifdef I2C
111 i2c_slave & derand::slave() {
112   return _slave;
```

258

```
113 }
114 #endif
115
116 void derand::define() {
117
118   dfix T_byte(0,8,0,dfix::ns);
119   dfix T_sreg(0,16,0,dfix::ns);
120   dfix T_num(0,4,0,dfix::ns) ;   // to express constants 0..15
121
122   PORT_TYPE(byte_in,T_byte) ;    // 8 bits
123   PORT_TYPE(byte_out,T_byte) ;   // 8 bits
124
125   SIGW(mask, T_byte) ;           // 8 bits
126   SIGCK(shiftreg, _ck, T_sreg) ; // 16 bits
127   SIGCK(seed, _ck, T_sreg) ;     // 16 bits
128   SIGCK(bypass, _ck, T_bit);
129   _sigarray xbits("xbits",8+1, T_bit);
130   _sigarray shifts("shifts",8+1,T_sreg);
131   _sigarray masks("masks",8+1, T_byte);
132
133 #ifdef I2C
134   _slave.put(&seed);
135   _slave.put(&bypass);
136 #endif
137
138   FSM( _fsm);
139     INITIAL(rst);
140   STATE(phase1);
141   STATE(phase2);
142
143   SFG( rnd_reset);
```

```
144    byte_out=W(T_byte,0);
145    seed    = W(T_sreg,0x3f);
146    sync_out=W(T_bit,0);
147    bypass  = W(T_bit,0);
148    shiftreg= W(T_sreg,0);
149
150
151 SFG(rnd_read);
152   GET(byte_in);
153   GET(syncro);
154
155
156 #define BIT(s,k)   cast(T_bit,s>> W(T_num,k-1))
157 #define MASK(s,n)  (s& W (T_sreg,(1<< (n+1))-1))
158
159 SFG(rnd_prbs6);
160
161                         shifts[0] =        (syncro==W
    (T_bit,1)).cassign(seed,shiftreg);
162
163   masks[0] =W(T_byte,0);
164   for(int k=0; k<8; k++) {
165      xbits[k] = BIT(shifkt]s,5) ^BIT(shifts[k],6);
166   shifts[k+1]=MASK((cast(T_sreg,xbits[k])&W(T_sreg,1))|
    shifts[k]W<<(T_num,1)),6);
167   masks[k+1]=(masks[k]<<W(T_byte,1))|
    (cast(T_byte,xbits[k])&W(T_byte,1));
168   }
169   shiftreg= shifts[8] ;
170 mask = masks[8] ;
171
172   byte_out= (bypass).cassign(byte_in,byte_in^mask);
```

260

```
173    sync_out=W(T_bit,1);
174                        ,
175
176 SFG( rnd _write);
177    PUT(byte_out);
178    PUT(sync_out);
179    sync_out=W(T_bit,0);
180
181
182//--------------------------------------------
    ----
183
184 AT (rst)ALLWAYS
185   DO( rnd_reset)
186   GOTO(phase1);
187
188 AT (phase1)ALLWAYS   //state << cond <<sfg    <<sfg        <<state
189   DO(rnd_read)    //phase1<<allways<<rnd_read <<rnd_prb6<< phase2
190   DO(rnd_prbs6)
191   GOTO(phase2);
192
193 AT (phase2)ALLWAYS
194   DO rnd_write)
195   GOTO(phase1);
196
197#ifdef I2C
198   _slave.attach(_fsm, *state_phase2,_ck);
199#endif
200
201   _fsm.setinfo(verbose);
```

```
202    ofstream F0("derand_trans0.dot");
203    F0<< _fsm;
204    F0.close();
205
206    transform TRANSF(_fsm);
207    TRANSF.fsm_handshake1(_ck);
208
209    ofstream F("derand_trans.dot");
210    F << _fsm;
211    F .close();
212    _fsm.setinfo(silent);
213
214    FSMEXP(typeName( ) ) ;
215  }
216
```

6.5 rx/detuple.h

```
1  //---------------------------------------------------------------
2  //   COPYRIGHT
3  //   =========
4  //
5  //   Copyright 1996 IMEC, Leuven,Belgium
6  //
7  //   All rights reserved.
8  //
9  //---------------------------------------------------------------
10 // Module:
11 //      TUPLE
12 //
```

262

```
13 // Purpose:
14 //header detection + detuplelization @(#)detuple.h 1.2 8/03/30
15 //
16 // Author:
17 //     Radim Cmar
18//--------------------------------------------------------------
19
20#infdef DETUPLE_H
21#define DETUPLE_H
22
23#include "qlib.h"
24#include "macros.h"
25#include "typedefine.h"
26
27 class detuple : public base{
28 public:
29
30   clk& _ck;
31   PRT(symbol);
32   PRT(symtype);
33   PRT(byte);
34   PRT(syncro);
35   ctlfsm_fsm;
36
37   int debug_mode;
38
39 public:
40   enum {DEBUGMODE};
41   enum {QAM16, QPSK};
42
```

```
43      detuple(char *name,
44              clk& clk,
45              _PRT(symbol),
46              _PRT(symtype),
47              _PRT(byte),
48              _PRT(syncro)
49              ) ;
50
51      ~detuple();
52      int setAttr(intAttr, doublev=0);
53      int run();
54      void define();
55      ctlfsm & fsm();
56  };
57
58#endif
```

6.6  rx/detuple.cxx

```
1 //--------------------------------------------------------
2 //  COPYRIGHT
3 //  =========
4 //
5 //  Copyright 1996 IMEC, Leuven,Belgium
6 //
7 //  All rights reserved.
8 //
9 //--------------------------------------------------------
10 // Module:
11 //      TUPLE
```

```
12 //
13 // Purpose:
14 //header  detection + detuplelization  @(#)detuple.cxx1.3 98/04/07
15 //
16 // Author:
17 //      Radim Cmar
18 //------------------------------------------------------------
19
20
21 #include "detuple.h"
22 #include "trans.h"
23
24 detuple::detuple(char *name,clk& clk,
25            _PRT(symbol),
26            _PRT(symtype),
27            _PRT(byte),
28            _PRT(syncro)
29        ) : base(name),
30   _ck(clk),
31   IS_SIG(symbol,T_4bit),
32   IS_SIG(symtype,T_bit),
33   IS_REG(byte,_ck, T_8bit),
34   IS_REG(syncro,_ck, T_bit)
35 {
36   IS_IP(symbol),
37   IS_IP(symtype);
38   IS_OP(byte);
39   IS_OP(syncro);
40
41   debug_mode= 0;
```

```
42  }
43
44
45  detuple::"detuple() {
46  }
47
48
49  int detuple::setAttr(intAttr,double v) {
50    switch(Attr) {
51    case DEBUGMODE:
52      debug_mode = (int)v; break;
53    }
54    return 1;
55  }
56
57
58  static int QAM16_sync[] = {0,0,5,5,0,0,5,5 };
59         static    int    QPSK_sync[       ]=       {
    0,0,0,0,1,1,1,1,0,0,0,0,1,1,1,1};
60  static int QAM16_headlen= 8 ;
61  static int QPSK_headlen=  16;
62
63
64  int detuple::run() {
65    int i;
66
67    static int tuplcnt=  0;
68    static int corrcnt=  0;
69    static int sync = 0;
70    static dfix oldstype=  0;
71    static dfix corrarr[16] ;
72    static dfix tuplarr[4] ;
```

266

```
73
74    int headlen;
75    int symbcount;
76    dfix tuple;
77
78                              if((FBID(symbol).getSize()
  <1)||(FBID(symtype).getSize() <1))
79      return 0;
80
81    dfix symb = FBID(symbol).get();
82    dfix stype = FBID(symtype).get();
83
84    if(stype == QAM16){   //length of header depends on
                              QAM16/QPSK constel
85       headlen= QAM16_headlen;
86       symbcount= 2;
87    }
88    else{
89       headlen= QPSK_headlen;
90       symbcount= 4;
91    }
92
93    if( corrcnt== headlen) {
94
95       int equal = 1;                      // search for
   header
96       for(i = 0; i < headlen;i++) {
97          if(stype == QAM16)
98             equal = equal &( corrarr[i]  ==QAM16_sync[headlen-
   1-i]);
99          else
```

```
100        equal = equal &( corrarr[i] ==QPSK_sync[headlen-
1-i]);
101     }
102
103     if(equal) {                                    // header appeared
104
105        if(stype == QAM16)   //flush tuplarr (evenif not complete)
106        tuple = tuplarr[0] + tuplarr[1]*16;
107        else
108
tuple=tuplarr[0]+tuplarr[1]*4+tuplarr[2]*16+tuplarr[3]*64;
109        FBID(byte) << (tuple);
110        FBID(syncro) << (sync);
111
112        sync = 1;                                   // indicates start of frame
113        corrcnt= 1;
114        tuplcnt= 0;
115     }
116     else{                                          // normal processing
117
118        if(tuplcnt== symbcount) {
119        if (stype== QAM16)
120        tuple = tuplarr[0] +tuplarr[1]*16;
121        else
122
tuple=tuplarr[0]+tuplarr[1]*4+tuplarr[2]*16+tuplarr[3]*64;
123        FBID(byte) << (tuple);
124        FBID(syncro) << (sync);
125
```

```
126        sync = 0;
127        tuplcnt = 1;
128      }
129    else
130        tuplcnt++;
131    }
132 }
133 else
134   corrcnt++;
135
136 for(i = symbcount-1; i> 0 ;i--)
137     tuplarr[i] =tuplarr[i-1] ;
138 tuplarr[0] =corrarr[headlen-1]; //shift out the oldest symbol
139
140 for(i = headlen-1; i> 0 ;i--)    // shift in new symbol
141     corrarr[i] =corrarr[i-1] ;
142 corrarr[0] =symb;
143
144 if( oldstype!= stype) {    // QPSK/QAM16 change
145     corrcnt= 0;
146     tuplcnt= 0;
147 }
148 oldstype= stype;
149
150 return  1;
151}
152
153
154// -----------------------------------------------------------
155
```

```
156 ctlfsm & detuple::fsm() {
157   return _fsm;
158 }
159
160 void  detuple:d:efine() {
161   int i;
162
163   int headlen_qam = 8;
164   int headlen _qpsk= 16;
165   int symbcount_qam = 2;
166   int symbcount_qpsk=  4;
167 #define max(a,b) ((a>  b) ?a : b)
168
169   dfix T_cnt(0,5,0,dfix: :ns) ;        // symbol counter upto 32
170   dfix T_symb(0,4,0,dfix: :ns) ;       // symbol type 0..15
171   dfix T_tuple(0,8,0,dfix:n:s);
172
173 FSM( _fsm);
174   INITIAL(rst);
175 STATE(phase1);
176 STATE(phase2);
177 STATE(phase3);
178 STATE(phase4);
179
180 SIGCK(qamtype,  _ck,  T_bit);
181 SIGCK(old_qamtype,  _ck,  T_bit);
182 SIGCK(symbol _reg,_ck,  T_symb);
183
184 SIGCK(iniphase,  _ck,  T_bit);
185 SIGCK(correlated,  _ck,  T_bit);
186 SIGCK(tuple_ready,_ck,  T_bit);
```

```
187
188  SIGCK(corrcnt, _ck, T_cnt);
189  SIGCK(tuplcnt, _ck, T_cnt);
190
191  SIGCK(byte, _ck, T_tuple);
192  SIGW(tuple_qam,  T_tuple);
193  SIGW(tuple_qpsk, T_tuple);
194
195  _sigarray      tuplarr("tarr",max(symbcount_qam,
        symbcount_qpsk),
              &_ck,T_symb);
196  _sigarray      corrarr("carr",max(headlen_qam,
        headlen_qpsk),
              &_ck,T_symb);
197      _sigarray   ref("ref",   max(headlen_qam,headlen
       _qpsk)T,_symb);
198           _sigarray    equal("equal",max(headlen_qam,
        headlen_qpsk),
              T_bit);
199
200  //----------------------------------------------------
      -----
201
202  SFG( tupler_reset);
203     setv(corrcnt,0);
204     setv(tuplcnt,0);
205     setv(old_qamtype,1);
206     setv(syncro,0);
207
208  SFG( tupler_read);
209     GET(symbol);
210     GET(symtype);
```

```
211    symbol_reg=symbol;
212    qamtype = ~symtype;
213
214
215 SFG( tupler_test);
216            iniphase=   ((qamtype)   &   (corrcnt!=
W(T_cnt,headlen_qam)))
217                       | (("qamtype)  &(corrcnt!=
W(T_cnt,headlen_qpsk)));
218
219
tuple_ready=(qamtype).cassign(tuplcnt==W(T_cnt,symbcount_qa
m),
220
tuplcnt==W(T_cnt,symbcount_qpsk));
221
222
223 SFG( tupler _corr);
224   for(i= 0; i < max(headlen_qam,headlen_qpsk);i++) {
225     int iqam  = (headlen_qam-1-i< 0) ? 0 : headlen_qam-
1-i;
226     int iqpsk = headlen _qpsk-1-i;
227                                         ref[i]     =
(qamtype).cassign(W(T_symb,QAM16_sync[iqam] ) ,
228                       W(T_symb, QPSK_sync[iqpsk]
) ) ;
229     if(i == 0)
230       equal[i] = (corrarr[i] ==ref[i] ) ;
231     else
232       equal[i] = equal[i-1] & (corrarr[i] ==ref[i] ) ;
233   }
234   correlated=(qamtype).cassign(equal[headlen_qam-
```

272

```
        1],equal[headlen_qpsk-1]);
235
236
237
238 SFG(tupler_compose);
239     tuple_qam= (cast(T_tuple,tuplarr[0]) &W(T_tuple,15))
240             |((cast(T_tuple,tuplarr[1])W&(T_tuple,15))<<W(T_cnt,4));
241
242     tuple_qpsk=(cast(T_tuple,tuplarr[0] & W(T_tuple,3))
243             |((cast(T_tuple,tuplarr[1])&  W(T_tuple,3))<<W(T_cnt,2))
244             |  ( (cast(T_tuple,tuplarr[2])&  W(T_tuple,3))<<W(T_cnt,4))
245             |  ( (cast(T_tuple,tuplarr[3])& W(T_tuple,3))<<W(T_cnt,6));
246
247     byte= (qamtype).cassign(tuple_qam,tuple_qpsk);
248
249     tuplcnt= (correlated).cassign(W(T_cnt,0-1),
250             (tuple_ready).cassign(W(T_cnt,1-1),
251             tuplcnt));
252
253     corrcnt= (correlated).cassign(W(T_cnt, 1-1),
254             corrcnt);
255
256
257 SFG(tupler_out);
258 PUT(byte);
259 PUT(syncro);
260  syncro= correlated;
```

```
261
262                            ,
263 SFG(tupler_shiftin );
264     for(i = 1; i < max(symbcount_qam,symbcount_qpsk)
        ;i++)
265       tuplarr[i] =tuplarr[i-1] ;
266     tuplarr[0]=(qamtype).cassign(corrarr[headlen_qam-
          1],corrarr[headlen_qpsk-1] ) ;
267
268     for(i = max(headlen_qam,headlen_qpsk)-1;i> 0 ;i--)
269       corrarr[i] =corrarr[i-1] ;
270     corrarr[0] =symbol_reg;
271
272
273
274 SFG( tupler_finish_qam);
275     corrcnt= (old_qamtype!= qamtype).cassign(W (T_cnt,0),
276                                    (corrcnt==    W
        (T_cnt,headlen_qam)).cassign(corrcnt,
277          corrcnt+ W (T_cnt,1) ) ) ;
278     tuplcnt= (old_qamtype!= qamtype).cassign(W (T_cnt,0),
279          (correlated).cassign(W(T_cnt,0),
280                               (corrcnt    !=W
        (T_cnt,headlen_qam)).cassign(tuplcnt,
281
        (tuplcnt==W(T_cnt,symbcount_qam)).cassign(W(T_cnt,1),
282          tuplcnt+ W (T_cnt,1) ) ) ) ;
283     old_qamtype= qamtype;
284
285 SFG( tupler_finish_qpsk);
286     corrcnt= (old_qamtype!= qamtype).cassign(W (T_cnt,0),
```

274

```
287                            (corrcnt==W(T_cnt,headlen
   _qpsk)).cassign(corrcnt,
288            corrcnt+ W (T_cnt,1) ) ) ;
289   tuplcnt= (old_qamtype!= qamtype).cassign(W (T_cnt,0),
290            (correlated).cassign(W(T_cnt,0),
291                                   (corrcnt    !=W
   (T_cnt,headlen_qpsk)).cassign(tuplcnt,
292
   (tuplcnt==W(T_cnt,symbcount_qpsk)).cassign(W(T_cnt,1),
293            tuplcnt+ W (T_cnt,1) ) ) ) ) ;
294   old_qamtype= qamtype;
295
296 //-----------------------------------------------------
   ---
297
298 AT (rst)ALLWAYS
299   DO(tupler_reset)
300   GOTO(phase1);
301
302 AT (phase1)ALLWAYS
303   DO(tupler_read)
304   DO( tupler_test)
305   DO( tupler_corr)
306   GOTO(phase2);
307
308 AT (phase2)ON (_cnd(iniphase)||(_!cnd(correlated)&&
    !_cnd(tuple_ready)))
309   GOTO(phase4);
310
311 AT (phase2)ON ( !_cnd(iniphase) && _cnd(correlated))
312   DO(tupler_compose)
313   GOTO(phase3);
```

```
314
315 AT (phase2)ON ( !_cnd(iniphase) && _cnd(tuple_ready) &&
    !_cnd(correlated) )
316   DO(tupler_compose)
317   GOTO(phase3);
318
319 AT (phase3)ALLWAYS
320   DO(tupler_out)
321   GOTO(phase4);
322
323 AT (phase4)ON (_cnd(qamtype))
324   DO(tupler_shiftin)
325   DO(tupler_finish_qam)
326   GOTO(phase1);
327
328 AT (phase4)ON (!_cnd(qamtype))
329   DO(tupler_shiftin)
330   DO(tupler_finish_qpsk)
331   GOTO(phase1);
332
333 _fsm.setinfo(verbose);
334 ofstream F0("detuple_trans0.dot");
335 F0<< _fsm;
336 F0.close();
337
338   transform TRANSF(_fsm);
339 TRANSF.fsm_handshake1(_ck);
340
341   ofstream F("detuple_trans.dot");
342 F << _fsm;
343 F .close();
344 _fsm.setinfo(silent);
```

6.7 rx/lmsff.h

```
1
2 // Author:Radim Cmar
3 // Purpose:ADAPTIVE EQUALIZER(LMS)  @(#)lmsff.h    1.4  98/03/30
4
5 #infdef LMS_H
6 #define LMS_H
7
8 #include "qlib.h"
9 #ifdef I2C
10 #include "i2c_master.h"
11 #include "i2c_slave.h"
12 #endif
13 #include "macros.h"
14 #include "typedefine.h"
15
16 class lmsff: public base{
17
18 public:
19    clk & _ck;
20 #ifdef I2C
21    i2c_slave _slave;
22 #endif
23    PRT(constel_mode);
```

(preceding context)
```
345
346 FSMEXP(typeName( ) ) ;
347
348 }
349
```

```
24  PRT(in_sample);
25  PRT(out_i);
26  PRT(out_q);
27  PRT(symtype);
28  ctlfsm _fsm;
29
30  int constel _type; //QAM16or QPSK
31  intSPS;      // samples per symbol
32  intCPS;      // cycles per sample
33  intNF;       // forward taps
34  intSTEP;     // step adaptation constant
35  double p0,p1,p2,p3;
36  double ref;
37
38 public:
39      enum { SPS_PAR, FWLENGTH,STEP_PAR, INIT, P0,P1,P2,P3,REF };
40  enum { QAM16, QPSK };
41
42  lmsff(char *name,
43         clk & clk,
44         _PRT(constel_mode),
45         _PRT(in_sample),
46         _PRT(out_i),
47         _PRT(out_q),
48         _PRT(symtype)
49         );
50
51  int setAttr(int Attr, double v=0);
52  int run();
53  void define();
54  ctlfsm &fsm();
```

```
55 #ifdef I2C
56    i2c_slave &slave();
57 #endif
58
59    //untimed mode
60    dfix decide(dfix constel, dfix est);
61    dfix coefi[111] ;
62    dfix coefq [111] ;
63    dfix sample[111] ;
64
65 };
66
67 #endif
```

6.8   rx/lmsff.cxx

```
 1
 2 // Author:Radim Cmar
 3 //  Purpose:ADAPTIVE   EQUALIZER(LMS)  @(#)lmsff.cxx  1.18 98/04/07
 4
 5 #include "lmsff.h"
 6 #include <math.h>
 7 #include "trans.h"
 8
 9 lmsff::lmsff(char *name,
10         clk & clk,
11         _PRT(constel_mode),
12         _PRT(in_sample),
13         _PRT(out_i),
14         _PRT(out_q),
15         _PRT(symtype)
```

```
16          ) : base(name),
17          _ck(clk),
18#ifdef I2C
19          _slave(strapp(name,"_i2c_host")),
20#endif
21          IS_SIG (constel_mode, T_bit),
22          IS_SIG (in_sample, T_float),
23          IS_REG  (out_i, _ck, T_float),
24          IS_REG  (out_q, _ck, T_float),
25          IS_REG  (symtype, _ck, T_bit)
26  {
27      IS_IP(constel_mode);
28      IS_IP(in_sample);
29      IS_OP(out_i);
30      IS_OP(out_q);
31      IS_OP(symtype);
32
33      SPS = 4;
34      STEP = 4;
35      NF = 8;
36      ref= 3.0;
37  }
38
39 int lmsff::setAttr(int Attr,double v) {
40      switch(Attr) {
41      case SPS_PAR :      // parametrizable only for untimed model
42          SPS = (int) v;
43          break;
44      case FWLENGTH :
45          NF = (int) v;
46          break;
```

```
47    case STEP_PAR :
48      STEP = (int) v;
49      break;
50    case P0:
51      p0 = v;
52      break;
53    case P1:
54      p1 = v;
55      break;
56    case P2:
57      p2 = v;
58      break;
59    case P3:
60      p3 = v;
61      break;
62    case REF:
63      ref= v;
64      break;
65    case INIT :
66      cerr<< "***_INFO:_LMSFF_equalizer_reset\n";
67      for(int i=0; i < NF; i++) {
68        sample[i] = dfix(0);
69        coefi[i] = dfix(0);
70        coefq[i] = dfix(0);
71      }
72      int offs = (NF-4)/2;
73      coefq[offs+ 0] = p0;
74      coefi[offs+ 1] = p1;
75      coefq[offs+ 2] = p2;
76      coefi[offs+ 3] = p3;
77      break;
78  }
```

```
 79    return 1;
 80  }
 81
 82 //---------------------------------------------------
    -
 83
 84 int lmsff::run() {
 85    int i;
 86    dfix acci,accq, equali, equalq,esti, estq, erri,errq;
 87
 88    if((FBID(in_sample).getSize()<SPS)||
       (FBID(constel_mode).getSize()1<))
 89       return 0;
 90
 91    dfix constel= FBID(constel_mode).getIndex(0);
 92    dfix step = 1.0/pow(2.0,STEP);
 93
 94    // ---ff filtering---
 95    acci= 0;
 96    accq= 0;
 97    for(i = 0; i < NF ; i++) {
 98       acci= acci + sample[i] * coefi[i] ;
 99       accq= accq + sample[i] * coefq[i] ;
100    }
101    equali= acci;
102    equalq= accq;
103
104    // ---output----
105    FBID(out_i) << (equali);
106    FBID(out_q) << (equalq);
107    FBID(symtype) << (constel);
108
```

282

```
109 // ---slicing---
110 esti= decide(constel, equali);
111 estq= decide(constel, equalq);
112
113 // ---error evaluation---
114 erri= esti - equali;
115 errq= estq - equalq;
116
117 // ---coefficient adaptation---
118 for(i = 0; i < NF; i++) {
119   coefi[i] =coefi[i] + step* erri * sample[i] ;
120   coefq[i] =coefq[i] + step* errq * sample[i] ;
121 }
122
123 // ---reading in samples---
124 for(i = NF-1; i>=  SPS; i--)
125   sample[i] =sample[i-SPS] ;
126 for(i = SPS-1; i>=  0; i--)
127   sample[i] =FBID(in_sample).get();
128
129 return  1;
130 }
131
132 dfix lmsff::decide(dfix constel,dfix est) {
133   double c = ref/3;
134   if( constel== QAM16) {
135     if(est > dfix(2*c))
136       return dfix(3*c);
137     else if (est > dfix(0))
138       return dfix (1*c);
139     elseif (est > dfix(-2*c))
140       return dfix (-1*c);
```

```
141    else
142        return dfix (-3*c);
143  } else{
144    if(est > dfix (0.))
145        return dfix (3*c);
146    else
147        return dfix (-3*c);
148  }
149 }
150
151 //-----------------------------------------------------------
     -----
152
153 ctlfsm & lmsff::fsm() {
154    return_fsm;
155 }
156
157 #ifdef I2C
158 i2c_slave &lmsff::slave() {
159    return _slave;
160 }
161 #endif
162
163
164 #define CC(a)  cast(accu _type,a)
165  void    adder_tree(_sigarray & ops,int  l,   int   h,
_sig&res) {
166    if(h-l+1 > 5) {
167      cerr<< "lmsff_error:_maximum_5_operands_suported\n";
168      exit(1);
169  }
170    dfix& accu_type= res.Rep()->getVal();
```

```
171 switch(h-l+1) {
172   case 0: res = C(res,0) ;break;
173   case 1: res = CC(ops[l] );break;
174   case 2: res = CC(ops[l] +ops[l+1] ) ;break;
175    case 3: res = CC(ops[l] +ops[l+1]) + CC(ops[l+2] );break;
176    case 4: res = CC( ops[l] +ops[l+1] ) + CC( ops[l+2] +ops[l+3] ) ;break;
177     case 5: res = CC( ops[l] +ops[l+1] ) + CC(CC(ops[l+2]
                          + ops[l+3] ) +CC(ops[l+4] ) ) ;break;
178 }
179 }
180
181 void balance_coefs2(int numcoefs,int numcycles,int* l,int* h){
182   int i,j,k;
183
184   int orig_numcycles=numcycles;
185   if(numcoefs < numcycles)
186     numcycles= numcoefs;
187
188   int paral = numcoefs/numcycles;
189   int incs= numcoefs-( numcoefs/numcycles) *numcycles;
190
191   for(k = 1; k <= numcycles;k++)
192     l[k] = (k-1)*paral;
193
194   for(i = 1; i <= incs; i++)
195     for(j = i+1; j<= numcycles;j++)
196       l[j]++;
197
```

```
198  for(k = 1; k <= numcycles-1;k++)
199    h [k] =l[k+1]-1;
200  h[numcycles] =numcoefs-1;
201
202  for(k = numcycles+1; k<= orig_numcycles;k++) {
203    l[k] =0;
204    h [k] = -1;
205  }
206
207  if(1) {
208    cout<< "lmsff_info:_filter_balancing\n";
209    for(k = 1; k <= orig _numcycles;k++)
210      cout<< l[k] << ":"<< h [k] <<"_";
211    cout<< endl;
212  }
213 }
214
215
216 void  lmsff::define() {
217
218   if(NF < 6) {
219     cerr<< "lmsff_error:_minimum_6_coefs_required\n";
220     exit(1);
221   }
222
223   int i,k,p;
224
225   //SPS .... samples per symbolparameter
226   //CPS .... cycles per sample(every CPS-phase read sample)
227   //NCYC ... cycle budget in the loop
228   // F _max _delay...extra delay line positions due to
```

286

```
       read_sample within filtering
229 SPS = 4;
230 CPS = 2;
231  int F_max_delay = 7;
232  int NCYC = SPS*CPS;
233
234  //==distribute filtering operation slices into NCYC-2 cycles=
235
236  int l_f[i1100] ;
237  int h_f[i1100] ;
238  int l_upd[100] ;
239  int h_upd[100] ;
240
241  //budget is fixed : 8-2=6cycles
242  //let's have 8 coefs
243  //can be more elaborate(e.g. interleaved slicing)
244   int start_fil = 1 //for filtering to know to store first time
245  int end_fil = 6 ; //for filtering to know to store to I_equal
246 l_fil[1]=0;l_fil[2]=2;l_fil[3]=4;l_fil[4]=5;l_fil[5]=6;l_fil[6]=7;
247 h_fil[1]=1;h_fil[2]=3;h_fil[3]=4;h_fil[4]=5;h_fil[5]=6;h_fil[6]=7;
248 l_upd[1]=0;l_upd[2]=2;l_upd[3]=4;l_upd[4]=5;l_upd[5]=6;l_upd[6]=7;
```

```
249  h_upd[1]=1;h_upd[2]=3;h_upd[3]=4;h_upd[4]=5;h_upd[5]=6;h_upd[6]=7;
250    //was example what input we need for parametrizable filter
       definition
251
252    balance_coefs2(NF,6,l_fil,h_fil);
253    balance_coefs2(NF,6,l_upd,h_upd);
254
255    // =======definition of signals=======
256
257    PORT_TYPE(in _sample,T(T_sample_lms));
258    PORT_TYPE(out_i,T(T_sample_lms));
259    PORT_TYPE(out_q,T(T_sample_lms));
260
261    dfix T_step(0,5,0,dfix::ns)  ;// shifts 0-> 31
262
263    _sigarray Fi_coef("Fi_coef",NF,&_ck,T(T_Fcoef_lms));
264    _sigarray Fq_coef("Fq_coef",NF,&_ck,T(T_Fcoef_lms));
265    _sigarray I_sample("I_sample",NF+F_max_delay,
              &_ck,T(T_sample_lms));
266    _sigarray Fi_mult ("Fi_mult",NF,T(T_accu_lms));
267    _sigarray Fq_mult ("Fq_mult",NF,T(T_accu_lms));
268    _sig Fi_sum("Fi_sum",T (T_accu_lms));
269    _sig Fq_sum("Fq_sum",T (T_accu_lms));
270    _sigarray fm _i("fm_i",NF,T(T_accu_lms));
271    _sigarray fm_q("fm_q",NF ,T(T_accu_lms));
272    _sigarray fmult_i("fmult_i",NF,T(T_Fcoef _lms));
273    _sigarray fmult_q("fmult_q",NF,T(T_Fcoef _lms));
274    SIGCK(I_accu,_ck, T(T_accu_lms));
275    SIGCK(Q_accu, _ck, T(T_accu_lms));
```

```
276 SIGW(I_equal, T(T_accu_lms));
277 SIGW(Q_equal, T(T_accu_lms));
278 SIGCK(I_error,_ck, T(T_accu_lms));
279 SIGCK(Q_error,_ck, T(T_accu_lms));
280 SIGW( I_slice,T(T_equal _lms));
281 SIGW(Q_slice, T(T_equal _lms));
282 SIGCK(step, _ck, T_step);
283 SIGCK(constel, _ck, T_bit);
284
285#ifdef I2C
286   _slave.put(&step);
287   for(i = 0; i < NF; i++)
288     _slave.put(&Fi_coef[i] ) ;
289   for(i = 0; i < NF; i++)
290     _slave.put(&Fq_coef[i] ) ;
291#endif
292
293
294 //------------------ definitionof states--------------
295
296   cfsm= &_fsm;            // controller handle
297
298   int phi;
299   state* loop_cycle[100] ;
300   state* rst_cycle;
301
302   rst_cycle=new state;     // define the state
303 * rst_cycle <<"rst";       // name the state
304 * cfsm<< deflt(*rst_cycle);// assign the state to the
                                 controller
305
```

```
306   for(phi = 1; phi<= NCYC ;phi++) {
307     loop_cycle[phi] =newstate;
308   * loop_cycle[phi] <<strapp("cycle_",phi);
309   * cfsm<< *loop_cycle[phi] ;
310   }
311
312 //----------------- definition of sfg's---------------
    ----
313
314   sfg* _lms_filt[100] ;
315   sfg* _lms _update _coefs[100] ;
316
317
318 SFG( lms_read_allways);
319   GET(constel_mode);
320    constel= constel_mode;
321
322
323 SFG( lms_initialize_coefs);
324    int offs= (NF-4)/2;
325    Fq_coef[offs+0] =W (T(T_Fcoef_lms),p0);
326    Fq_coef[offs+1] =W (T(T_Fcoef_lms),0);
327    Fq_coef[offs+2] =W (T(T_Fcoef_lms),p2);
328    Fq_coef[offs+3] =W (T(T_Fcoef_lms),0);
329
330    Fi_coef[offs+0] =W (T(T_Fcoef_lms),0);
331    Fi_coef[offs+1] =W (T(T_Fcoef_lms),p1);
332    Fi_coef[offs+2] =W (T(T_Fcoef_lms),0);
333    Fi_coef[offs+3] =W (T(T_Fcoef_lms),p3);
334
335    for(i = 0; i < NF; i++) {
336      if((i < offs) && (i> offs+3)) {
```

```
337      Fi_coef[i] =W(T(T_Fcoef_lms),0) ;
338      Fq_coef[i] =W(T(T_Fcoef_lms),0) ;
339    }
340  }
341
342
343 SFG( lms_reset);
344   for(i = 0; i < NF+F_max_delay;i++) {
345     I_sample[i] =W(T(T_sample_lms)0,);
346   }
347   setv(I_error,0);
348   setv(Q_error,0);
349   setv(step,STEP);
350
351
352 //-------------- FILTER(1.cycle to 8.cycle) --------*---
353  int delay = 0; int cnt= 0 ;
354  int L,H;
355
356  //no filtering in 1st clockcycle
357  cnt++;if (cnt == CPS) { cnt= 0; delay++; }
358
359
360  for(p = 1; p <= NCYC-2;p++) {
361   REGISTER_SFG(lms_filt,p);
362    cnt++; if (cnt== CPS) {cnt = 0; delay++; }
363
364    //---- filter feedforward
365    L =  l_fil[p];H= h_fil[p] ;
366 for (k = L; k<=  H; k++)
```

291

```
367     Fi_mult[k]=cast(T(T_accu_lms),Fi_coef[k]I*_sample[k+delay]);
368     if(H >= 0) adder_tree(Fi_mult,L,H,Fi_sum);
369
370     for (k = L; k<=  H; k++)
371     Fq_mult[k]=cast(T(T_accu_lms),Fq_coef[k]*I_sample[k+delay]);
372     if(H >= 0) adder_tree(Fq_mult,L,H,Fq_sum);
373
374
375     //---- sum I over start_ff-> end_ff
376     if(p == start_fil) {
377         I_accu= Fi_sum;
378         Q_accu = Fq_sum;
379     }
380     else if ((p > start_fil)&&(p< end_fil)){
381         I_accu= I_accu+ Fi_sum;
382         Q_accu = Q_accu+  Fq_sum;
383     }
384     else if (p == end_fil){
385         I_accu= I_accu+ Fi_sum;
386         Q_accu = Q_accu+  Fq_sum;
387         I_equal= I_accu+ Fi_sum;
388         Q_equal = Q_accu+ Fq_sum;
389     }
390 }   //end for
391
392 //compensate for 1 clockcycle vacancy
393 cnt++;if (cnt == CPS) { cnt= 0; delay++; }
394
```

292

```
395
396 //--------------- UPDATE(1.cycle to 8.cycle) --------
397     int   STEPSAFE  =  4;  //  safety  region  for downshifting
398     for(p = 1; p <= NCYC-2;p++) {
399     REGISTER_SFG(lms_update_coefs,p);
400        cnt++; if (cnt== CPS) {cnt = 0; delay++; }
401
402        L = l_upd[p] ;H=h_upd[p] ;
403        for (k=L; k<= H; k++)
404          {
405                                                         fm_i[k] =cast(T(T_accu_lms),I_sample[k+delay]*I_error);
406            vshr(fmult_i[k] ,fm_i[k],step,STEPSAFE);
407            Fi_coef[k] =Fi_coef[k] + fmult_i[k] ;
408
409
fm_q[k]=cast(T(T_accu_lms),I_sample[k+delay]*Q_error);
410            vshr(fmult_q[k],fm_q[k],step,STEPSAFE);
411            Fq_coef[k] =Fq_coef[k] +fmult_q[k] ;
412          }
413     }
414
415 SFG(lms_outready);
416    out_i=cast(T(T_sample_lms) ,I_equal);
417    out_q= cast(T(T_sample_lms) ,Q_equal);
418    symtype= constel;
419
420
421 //------------------SLICER---------------------
422 SFG( lms_slice_and_error);
```

293

```
423    double c = ref/3;
424    I_equal=I_accu;
425    Q_equal= Q_accu;
426
427    I_slice =(constel==W(T_bit,0) )c.assign(
428
429                                        (I_equal>
       C(I_equal,+2*c)).cassign(C(I_slice,+3*c),
430                                        (I_equal>
       C(I_equal,0*c)).cassign(C(I_slice,+1*c),
431         (I_equal> C(I_equal,-2*c)).cassign(C(I_slice,-
       1*c),
432                                        C(I_slice,-
       3*c))))
433         ,
434                                        (I_equal>
       C(I_equal,0*c)).cassign(C(I_slice,+3*c),
435                                        C(I_slice,-
       3*c))
436         ) ;
437
438    Q _slice= (constel==W (T_bit,0) )c.assign(
439
440                                        (Q_equal    >
       C(Q_equal,+2*c)).cassign(C(Q_slice,+3*c),
441              (Q_equal  >  C(Q_equal,0*c)).cassign(
       C(Q_slice,+1*c),
442         (Q_equal > C(Q_equal,-2*c)).cassign(C(Q_slice,-
       1*c),
443                                        C(Q_slice,-
       3*c))))
444         ,
```

294

```
445                      (Q_equal  >   C(Q_equal,0*c)).cassign(
C(Q_slice,+3*c),           ,
446                                              C(Q_slice,-3*c))
447      );
448
449      I_error=cast(T(T_accu_lms) , I_slice)-I_equal;
450      Q_error=cast(T(T_accu_lms) , Q_slice)-Q_equal;
451
452
453 //-------------------IO definition-----------------------
454 SFG(lms_in);
455   GET(in_sample);
456   I_sample[0] =in_sample;
457   for(i = NF+F_max_delay-1;i > 0; i--) {
458      I_sample[i] =I_sample[i-1] ;
459   }
460
461 SFG(lms_out);
462   PUT(out_i);
463   PUT(out_q);
464   PUT(symtype);
465
466
467 //=======define the fsmfor fixed 8 cycle timebudget========
468
469   DEFAULTDO(lms_read_allways);
470 * rst_cycle ALLWAYS
471       DO(lms_reset)
472       DO(lms_initialize_coefs)
```

```
                                        295
        473          << *loop_cycle[1] ;
        474                             ,
        475    * loop_cycle[1]ALLWAYS
        476          DO(lms_in)
 5      477          << *_lms_update_coefs[1]
        478          << *loop_cycle[2] ;
        479
        480    * loop_cycle[2]ALLWAYS
        481          << *_lms_filt[1]
10      482          << *_lms_update_coefs[2]
        483          << *loop_cycle[3] ;
        484
        485    * loop_cycle[3]ALLWAYS
        486          DO(lms_in)
15      487          << *_lms_filt[2]
        488          << *_lms_update_coefs[3]
        489          << *loop_cycle[4] ;
        490
        491    * loop_cycle[4]ALLWAYS
20      492          << *_lms_filt[3]
        493          << *_lms_update_coefs[4]
        494          << *loop_cycle[5] ;
        495
        496    * loop_cycle[5]ALLWAYS
25      497          DO(lms_in)
        498          << *_lms_filt[4]
        499          << *_lms_update_coefs[5]
        500          << *loop_cycle[6] ;
        501
30      502    * loop_cycle[6]ALLWAYS
        503          << *_lms_filt[5]
        504          << *_lms_update_coefs[6]
```

296

```
505        << *loop_cycle[7] ;
506                         ,
507  * loop_cycle[7]ALLWAYS
508       DO(lms_in)
509       << *_lms_filt[6]   // filtering finished-> ready to output
510       DO(lms_outready)
511       << *loop_cycle[8] ;
512
513  * loop_cycle[8]ALLWAYS
514       DO(lms_out)
515       DO(lms_slice_and_error)
516       << *loop_cycle[1] ;
517
518
519#ifdef I2C
520     _slave.attach(_fsm, *loop_cycle[1],_ck);
521#endif
522
523    _fsm.setinfo(verbose);
524    ofstream F0("lmsff_trans0.dot");
525    F0 << _fsm;
526    F0 .close();
527
528    transform TRANSF(_fsm);
529    TRANSF.fsm_handshake1(_ck);
530
531    ofstream F("lmsff_trans.dot");
532    F << _fsm;
533    F .close();
534    _fsm.setinfo(silent);
535
```

```
536   FSMEXP(typeName( ) ) ;
537                               ,
538}
539

6.9  rx/macros.h

1 // @(#)macros.h1.1 98/01/22
2
3 #infdef MACROS_H
4 #define MACROS_H
5
6 // #define max(a,b) (a>  b) ?a : b
7
8 #include "qlib.h"
9
10 extern dfix T_bit;
11 extern dfix T_2bit;
12 extern dfix T_4bit;
13 extern dfix T_8bit;
14 extern dfix T_float;
15
16 extern dfix T_Cshift; // type for constant shifter
17 extern dfix* overcast;
18 extern dfix ycast;
19 extern strstream* gstr;
20
21
22 #define PRT(v)          FB       & __##v; _sigv
23 #define _PRT(v)         FB       & __##v
24 #define IS_SIG(v,t)              __##v(_##v) ,v(#v,t)
25 #define IS_REG(v,c,t)            __##v(_##v) ,v(#v,c,t)
```

```
26#define GET(v)            IN (v, __##v)
27#define PUT(v)           · OUT(v, __##v)
28#define IS_OP(v)           __##v.asSink (this)
29#define IS_IP(v)           __##v.asSource(this)
30#define FBID(v)            __##v
31
32#define C(y, x) W((y).Rep()->getVal( ),x)
33#define acast(y, x)  cast((y).Rep()->getVal(), ##x)
34
35#define setv(y,x) y =W (y.Rep()->getVal( ),x);
36
37#define REGISTER_SFG(s,i) _##s[i] =new sfg;           \
38                         _##s[i]->next= glbListOfSfg;  \
39                         glbListOfSfg = _##s[i] ;      \
40                                       * _##s[i]
<<strapp(strapp(#s,"_"),i); \
41                         _##s[i]->starts( ) ;          \
42                         csfg= _##s[i]
43
44#define PORT_TYPE(v,t) v.Rep()->dupVal(t); \
45                      if (v.Rep()->isregister())v.Rep()->dupRegVal(t)
46
47#define         DSIGW(s,n,w)                      s[n]
=new_sig(strapp(strapp(#s,"_"),n),w)
48
49//---------- constant right-shift(division) ----------
50//------------------------------------------------
51#define shr(y, x, b) \
52              overcast=  new   dfix(0,   x.Rep()->getVal().TypeW()+b,x.Rep()-
```

```
                                >getVal().TypeL()+b) ; \
53      ycast.duplicate(y.Rep()->getVal()); \
54      y= cast (ycast, cast(*overcast,x) >> W(T_Cshift,b) ) ; \
55      delete overcast;
56
57//--------- constant left-shift(multiplication) ---------
58//-----------------------------------------------------------
59#define shl(y, x, b) \
60      if(x.Rep()->getVal().isFix()) \
61                      overcast=    new    dfix(0,x    .Rep()-
   >getVal().TypeW()+b,x.Rep()-
            >getVal().TypeL( ) ) ; \
62      else\
63        overcast= new dfix(0); \
64      ycast.duplicate(y.Rep()->getVal( ) ) ; \
65      y= cast (ycast, cast(*overcast,x) << W(T_Cshift,b) ) ; \
66      delete overcast;
67
68//---------- variable shifters with safety region--------
69//------------------------------------------------------------
70 //
71 // description vshl(y,x,e,b):=:y = x<<e (with 'b' as a safety
            region)
72 //
73#define vshl(y, x, e, b) \
```

```
74             overcast=   new   dfix(0,   x.Rep()-
>getVal().TypeW()+b,x.Rep()-
       >getVal().TypeL( ) ) ; \
75    y= acast (y, cast(*overcast,x) << e ) ; \
76    delete overcast;
77
78#define vshr(y, x, e, b) \
79    if(x.Rep()->getVal().isFix()) \
80             overcast=   new   dfix(0,x   .Rep()-
>getVal().TypeW()+b,x.Rep()-
       >getVal().TypeL()+b) ; \
81    else\
82      overcast= new dfix(0); \
83    y= acast (y, cast(*overcast,x) >> e ) ; \
84    delete overcast;
85
86
87#endif
88
```

6.10   rx/macros.cxx

```
1#include "macros.h"
2
3 dfix T_bit(0,1,0,dfix::ns);
4 dfix T_2bit(0,2,0,dfix::tc);
5 dfix T_4bit(0,4,0,dfix::ns);
6 dfix T_8bit(0,8,0,dfix::ns);
7 dfix T_float(0);
8
9 dfix T_Cshift(0,4,0,dfix:n:s);//type for constantshifter
0..15
```

```
10 dfix* overcast;
11 dfix ycast;
12 strstream* gstr;

6.11    rx/typedefine.cxx

1#include "typedefine.h"
2
3#include <fstream.h>
4
5 typedefine glbTypes;
6
7 typedefine::typedefine() {
8    numt= 0;
9 }
10
11 void  typedefine::load(char *_name) {
12    ifstream IF(_name);
13
14    if(IF.fail()) {
15       cerr<<"***_ERROR:_typedefine:_cannot_open_file_"<<_name<<"\n";
16       exit(0);
17    }
18
19    while(!IF.eof() && !IF.f a(i)l) {
20       char buf[100] ;
21       IF >> buf;
22
23       if(!strlen(buf))
24          continue;
```

```
25
26      if(buf[0] == '/' && buf[1] == '/') {
27        int endoftype = 0;
28        while (!endoftype) {
29   char c;
30   IF.get(c);
31        endoftype= (c == '\n' ) ;
32        }
33        continue;
34      } else {
35        name[numt] = new char[strlen(buf) +1] ;
36        strcpy(name[numt] ,buf);
37        int i;
38        for (i=0; i<numt; i++)
39        if(!strcmp(name[i],buf)) {
40                                                      cerr<<
"***_ERROR:_typedefine:_type_"<<buf<<"_defined_twice\n";
41          exit(0);
42      }
43                                                         int
W,L,repr=dfix::tc,overflow=dfix:e:rr,truncate=dfix:f:l;
44
45      IF >> buf;
46      W = atoi(buf);
47       if(W == 0) {
48      cerr<<"***_ERROR:_typedefine:_bad_W_for_type_"
<<name[numt] "<<\n";
49      exit(0);
50       }
51
52      int endcom = 0;
53
```

```
54      IF >> buf;
55      L = atoi(buf);
56       if(buf[strlen(buf)-1] = = ' ; ' ) {
57   endcom = 1;
58    buf[strlen(buf)-1] =0;
59      }
60      while (1) {
61    if(endcom)
62      break;
63
64      IF >> buf;
65
66       if(buf[strlen(buf)-1] = = ' ; ' ) {
67      endcom = 1;
68      buf[strlen(buf)-1] =0 ;
69      }
70
71      if( !strcmp(buf,"ns"))
72       repr = dfix::ns;
73      else if (!strcmp(buf,"tc"))
74       repr = dfix::tc;
75      else if ( !strcmp(buf,";"))
76       break;
77      else if ( !endcom) {
78   cerr<< "***_ERROR:_typedefine:_"<<name[numt]"<<:_bad_repr_"<<buf<<"\n";
79       exit(0);
80      }
81
82
83    if(endcom)
84      break;
```

```
85
86    IF >> buf;
87
88    if(buf[strlen(buf)-1] = = ' ; ' ) {
89      endcom = 1;
90      buf[strlen(buf)-1] =0 ;
91    }
92
93    if( !strcmp(buf,"wp"))
94      overflow = dfix::wp;
95    elseif ( !strcmp(buf,"st"))
96      overflow = dfix::st;
97    elseif ( !strcmp(buf,"er"))
98      overflow = dfix::err;
99    elseif ( !strcmp(buf,";"))
100     break;
101   elseif ( !endcom) {
102     cerr<<"***_ERROR:_typedefine:_"<<name[numt]<<:
          _bad_ovf_"<<buf<<"\n";
103     exit(0);
104   }
105
106   if(endcom)
107     break;
108
109   IF >> buf;
110
111   if(buf[strlen(buf)-1] = = ' ; ' ) {
112     endcom = 1;
113     buf[strlen(buf)-1] =0 ;
114   }
115
```

```
116     if( !strcmp(buf,"rd"))
117       truncate = dfix::rd;
118     elseif ( !strcmp(buf,"fl"))
119       truncate = dfix::fl;
120     elseif ( !strcmp(buf,";"))
121       break;
122     elseif ( !endcom) {
123                                         cerr<< "***_ERROR:_typedefine:_"<<name[numt]"<<:_bad_rnd_"**<<buf<<"\n";
124       exit(0);
125     }
126
127     if(endcom)
128       break;
129
130     int endoftype = 0;
131     while ( !endoftype) {
132       char c;
133       IF.get(c);
134       endoftype = (c== '\n ' ) ;
135     }
136   break;
137   }
138
    types[numt].duplicate(dfix(0,W,L,repr,overflow,truncate));
139
140     numt++;
141     if(numt >= MAXT) {
142   cerr<< "***_ERROR:_typedefine_has_too_much_types._increase_MAXT\n";
143     exit(0);
```

306

```
144       }
145     }
146   }
147 }
148
149 void typedefine::list() {
150   int i;
151
152   for(i=0; i<numt; i++) {
153     cout.width(20);
154     cout<< name[i] ;
155
156     cout.width(5);
157     cout<< types[i].TypeW();
158
159     cout.width(5);
160     cout<< types[i].TypeL();
161
162     cout.width(4);
163     if(types[i].TypeSign() ==dfix::ns)
164       cout << "ns";
165     else
166       cout << "tc";
167
168     cout.width(4);
169     if(types[i].TypeOverflow() ==dfix::wp)
170       cout << "wp";
171     elseif (types[i].TypeOverflow() ==dfix::st)
172       cout << "st";
173     else
174       cout << "err";
175
```

```
176    cout.width(4);
177    if(types[i].TypeRound() ==dfix::fl)
178      cout << "fl";
179    else
180      cout << "rd";
181
182    cout<< "\n";
183  }
184 }
185
186 static dfix dummy(0);
187
188 dfix &typedefine::find(char *_name) {
189   int i;
190   if( !numt)
191     return dummy;
192   for(i=0; i<numt; i++)
193     if( !strcmp(name[i] ,_name))
194       return types[i] ;
195     cerr<<"***_WARNING:_typedefine:
           _type_"<<_name<<"_was_not_found\n";
196   return dummy;
197 }
198
199 dfix &typedefine::find(char *_name, dfix& v) {
200   int i;
201   if( !numt)
202     return v;
203   for(i=0; i<numt; i++)
204     if( !strcmp(name[i] ,_name))
205       return types[i] ;
206   cerr<< "***_WARNING:_typedefine:
```

```
        _type_"<<_name<<"_was_not_found\n";
207     return v;
208 }
209
```

6.12 rx/typedefine.h

```
1 #infdef TYPEDEFINE_H
2 #define TYPEDEFINE_H
3
4 #define MAXT 100
5
6 #include "qlib.h"
7
8
9 class typedefine{
10    char *name[100] ;
11    dfix types[MAXT] ;
12    int numt;
13 public:
14    typedefine();
15    void load(char *file);
16    void list();
17    dfix &find(char *name);
18    dfix &find(char *name, dfix& v);
19 };
20
21 extern typedefine glbTypes;
22
23 #define LOADTYPES(a) glbTypes.load(#a) ;glbTypes.list()
24 #define T(a) glbTypes.find(#a)
25 #define TT(a,b) glbTypes.find(#a,b)
```

Part C: Generated VHDL code of the QAM system 6.13 vhdl/RX_TI.vhd

```
1---------------------------------------------------------------
2 --OCAPI - alpha release- generated Fri Jun 12 16:45:44 1998
3---------------------------------------------------------------
4
5 - System Link Cell for design RX_TI
6
7 library IEEE;
8 use IEEE.std_logic_1164.all;
9
10 entity RX_TI is
11   port(
12                     reset:  in std_logic;
13                       clk:  in std_logic;
14                  chan_out:  in std_logic_vector(11 downto 0);
15              rx_diff_mode:  in std_logic;
16            rx_constel_mode: in std_logic;
17               rx_byte_out:  out std_logic_vector(7 downto 0);
18               rx_sync_out:  out std_logic
19         ) ;
20 end RX_TI;
```

310

```
21
22  architecture structure of RX_TI is
23
24    component lmsff
25      port(
26                    reset:  in std_logic;
27                      clk:  in std_logic;
28                   h1wack:  in std_logic;
29               constel_mode: in std_logic;
30                in_sample: in std_logic_vector(11 downto 0);
31                   h1wreq: out std_logic;
32                    out_i: out std_logic_vector(11 downto 0);
33                    out_q: out std_logic_vector(11 downto 0);
34                  symtype: out std_logic
35      )  ;
36    endcomponent;
37
38    component demap
39      port(
40                    reset:  in std_logic;
41                      clk:  in std_logic;
42                   h2wack:  in std_logic;
43                   h1rack:  in std_logic;
44                diff_mode:  in std_logic;
45                     i_in:  in std_logic_vector(11 downto 0);
46                     q_in:  in std_logic_vector(11 downto 0);
47               symtype_in:  in std_logic;
48                   h2wreq: out std_logic;
```

311

```
49              h1rreq: out std_logic;
50              symbol_out: out std_logic_vector(3 downto 0);
51              symtype_out: out std_logic
52          ) ;
53      endcomponent;
54
55      component detuple
56          port(
57                  reset:   in std_logic;
58                  clk:     in std_logic;
59                  h3wack:  in std_logic;
60                  h2rack:  in std_logic;
61                  symbol:  in std_logic_vector(3 downto 0);
62                  symtype: in std_logic;
63                  h3wreq:  out std_logic;
64                  h2rreq:  out std_logic;
65                  byte:    out std_logic_vector(7 downto 0);
66                  syncro:  out std_logic
67          ) ;
68      endcomponent;
69
70      component derand
71          port(
72                  reset:   in std_logic;
73                  clk:     in std_logic;
74                  h3rack:  in std_logic;
75                  byte_in: in std_logic_vector(7 downto 0);
76                  syncro:  in std_logic;
```

312

```
77              h3rreq: out std_logic;
78              byte_out:out std_logic_vector(7 downto 0);
79              sync_out:out std_logic
80          ) ;
81      endcomponent;
82
83      signal          unused : std_logic;
84      signal          h1_ffshk:  std_logic;
85      signal              rx_lms_i: std_logic_vector(11 downto 0);
86      signal              rx_lms_q: std_logic_vector(11 downto 0);
87      signal          rx_symtype :  std_logic;
88      signal          h2_ffshk:  std_logic;
89      signal          h1_fbshk:  std_logic;
90      signal              rx_symbol : std_logic_vector(3 downto 0);
91      signal      rx_symtype_at:std_logic;
92      signal          h3_ffshk:  std_logic;
93      signal          h2_fbshk:  std_logic;
94      signal              rx_byte_rnd: std_logic_vector(7 downto 0);
95      signal          rx_syncro:  std_logic;
96      signal          h3_fbshk:  std_logic;
97
98  begin
99
100     lmsff_proc:lmsff
101         port map (
102                                                 reset=> reset,
```

313

```
     103                              clk=>
 clk,                 ,
     104                              h1wack=>
 h1_fbshk,
  5  105                              constel_mode=>
 rx_constel_mode,
     106                              in_sample=>
 chan_out,
     107                              h1wreq=>
 10  h1_ffshk,
     108                              out_i=>
 rx_lms,_i
     109                              out_q=>
 rx_lms,_q
 15  110                              symtype=>
 rx_symtype
     111       ) ;
     112
     113  demap_proc: demap
 20  114      port map (
     115                              reset=>
 reset,
     116                              clk=>
 clk,
 25  117                              h2wack=>
 h2_fbshk,
     118                              h1rack=>
 h1_ffshk,
     119                              diff_mode=>
 30  rx_diff_mode,
     120                              i_in=>
 rx_lms,_i
```

314

121                                                  q_in=>
    rx_lms,_q
    122                                                  symtype_in=>
    rx_symtype,
5   123                                                  h2wreq=>
    h2_ffshk,
    124                                                  h1rreq=>
    h1_fbshk,
    125                                                  symbol_out=>
10  rx_symbol,
    126                                                  symtype_out=>
    rx_symtype_at
    127    ) ;
    128
15  129   detuple_proc:detuple
    130      port map (
    131                                                  reset=>
    reset,
    132                                                  clk=>
20  clk,
    133                                                  h3wack=>
    h3_fbshk,
    134                                                  h2rack=>
    h2_ffshk,
25  135                                                  symbol=>
    rx_symbol,
    136                                                  symtype=>
    rx_symtype_at,
    137                                                  h3wreq=>
30  h3_ffshk,
    138                                                  h2rreq=>
    h2_fbshk,

315

```
    139                                      byte=> rx_byte_rnd,
    140                                      syncro=> rx_syncro
 5  141      ) ;
    142
    143    derand_proc:derand
    144       port map (
    145                                      reset=> reset,
10  146                                      clk=> clk,
    147                                      h3rack=> h3_ffshk,
15  148                                      byte_in=> rx_byte_rnd,
    149                                      syncro=> rx_syncro,
    150                                      h3rreq=> h3_fbshk,
20  151                                      byte_out=> rx_byte_out,
    152                                      sync_out=> rx_sync_out
25  153      ) ;
    154
    155 end structure;

6.14   vhdl/derand_proc_ENT.vhd
30
         1-----------------------------------------------------------------
```

316

```
2  --OCAPI - alpha release- generated Thu Jun 11 14:57:23 1998
3  -- -- includes sfg
4  -- derandrstphase10
5  -- derandphase1phase20
6  -- derandphase1phase11
7  -- derandphase2phase10
8  -- derandinireg_derandrst0
9----------------------------------------------------------
-
10
11 library IEEE;
12 use IEEE.std_logic_1164.all;
13 useIEEE.std_logic_arith.all;
14 library FXT_PNT_LIB;
15 use FXT_PNT_LIB.pck_fixed_point.all;
16
17 entity derand_proc is
18   port(
19     clk: in std_logic;
20     reset: in std_logic;
21     h3rack: in FX (0 downto 0);
22     syncro: in FX (0 downto 0);
23     byte_in:in FX (7 downto 0);
24     h3rreq: out FX (0 downto 0 );
25     h3rackreg_reg:outFX (0 downto 0);
26     byte_ouT_reg:outFX(7 downto 0);
27     sync_ouT_reg:outFX(0 downto 0)
28   ) ;
29 end derand_proc;
```

6.15    vhdl/derand_proc_RTL.vhd

```
1----------------------,-------------------------
-
2 --OCAPI - alpha release- generated Thu Jun 11 14:57:23
1998
3 -- -- includes sfg
4 -- derandrstphase10
5 -- derandphase1phase20
6 -- derandphase1phase11
7 -- derandphase2phase10
8 -- derandinireg_derandrst0
9-----------------------------------------------------
-
10
11 library IEEE;
12 use IEEE.std_logic_1164.all;
13 useIEEE. std_logic_arith.all;
14 library FXT_PNT_LIB;
15 use FXT_PNT_LIB.pck_fixed_point.all;
16
17 architecture RTL of derand_proc is
18
19  -- State Declaration
20   signal seed_at1: FX (15 downto 0);
21   signal seed : FX (15 downto 0);
22   signal shiftreg_at1:FX (15 downto 0);
23   signal shiftreg : FX (15downto 0);
24   signal bypass_at1: FX(0 downto 0);
25   signal bypass : FX (0 downto 0);
26   signal h3rackreg_at1:FX (0 downto 0);
27   signal h3rackreg : FX(0 downto 0);
28   signal byte_out_at1:FX(7 downto 0);
```

318

```
29    signal byte_out: FX (7 downto0);
30    signal sync_out_at1:FX(0 downto 0);
31    signal sync_out: FX (0 downto0);
32    type STATE_TYPE is (
33      rst,
34      phase1,
35      phase2,
36      inireg_derand);
37    signal current_state,next_state:STATE_TYPE;
38
39    begin
40
41      h3rackreg_reg<=h3rackreg_at1;
42
43      byte_out_reg<=byte_out_at1;
44
45      sync_out_reg<=sync_out_at1;
46
47      -- Register clocking
48      SYNC : process (clk)
49
50        begin
51          if(clk'event and clk= '1' )then
52            -- state update
53            current_state<= next_state;
54            -- tick all registers
55            seed_at1<= seed;
56            shiftreg_at1<= shiftreg;
57            bypass_at1<= bypass;
58            h3rackreg_at1<= h3rackreg;
59            byte_out_at1<=byte_out;
60            sync_out_at1<=sync_out;
```

319

```
61       end if;
62    end process;
63
64    -- SFG evaluation
65    COMB : process (
66        current_state,
67        reset,
68        h3rack,
69        syncro,
70        seed_at1,
71        shiftreg_at1,
72        bypass_at1,
73        byte_in,
74        h3rackreg_at1,
75        byte_out_at1,
76        sync_out_at1   )
77
78    -- intermediate variables
79        variable shifts_0 : FX(15 downto 0);
80        variable xbits_0: FX (0 downto 0);
81        variable masks_0 :FX (7 downto 0);
82        variable shifts_1 : FX(15 downto 0);
83        variable xbits_1:FX (0 downto 0);
84        variable masks_1 :FX (7 downto 0);
85        variable shifts_2 : FX(15 downto 0);
86        variable xbits_2:FX (0 downto 0);
87        variable masks_2 :FX (7 downto 0);
88        variable shifts_3 : FX(15 downto 0);
89        variable xbits_3:FX (0 downto 0);
90        variable masks_3 :FX (7 downto 0);
91        variable shifts_4 : FX(15 downto 0);
92        variable xbits_4:FX (0 downto 0);
```

320

```
 93         variable masks_4 :FX (7 downto 0);
 94         variable shifts_5 : FX(15 downto 0);
 95         variable xbits_5:FX (0 downto 0);
 96         variable masks_5 :FX (7 downto 0);
 97         variable shifts_6 : FX(15 downto 0);
 98         variable xbits_6:FX (0 downto 0);
 99         variable masks_6:FX (7 downto 0);
100         variable shifts_7 : FX(15 downto 0);
101         variable xbits_7:FX (0 downto 0);
102         variable masks_7 :FX (7 downto 0);
103         variable shifts_8 : FX(15 downto 0);
104         variable masks_8 :FX (7 downto 0);
105         variable mask : FX(7 downto 0);
106
107      begin
108
109         -- update all registers and outputs
110         h3rreq <= CAST ("0. " ) ;
111         seed <= seed_at1;
112          shiftreg<= shiftreg_at1;
113         bypass <= bypass_at1;
114         h3rackreg <= h3rackreg_at1;
115         byte_out<= byte_out_at1;
116         sync_out<= sync_out_at1;
117
118
119         -- default update state register
120          next_state<=current_state;
121
122      case current_state is
123
124         when rst=>
```

321

```
125
126            byte_out<= CAST("00000000. ") ;
127            seed    <= CAST ("0000000000111111. ") ;
128            sync_out<= CAST("0 . ") ;
129            bypass  <= CAST("0 . ") ;
130            shiftreg<= CAST("0000000000000000. ") ;
131            h3rackreg<= h3rack;
132            h3rreq  <= CAST("1 . ") ;
133            next_state<= phase1;
134
135
136        when phase1=>
137
138        if ((true) and( ToBool(h3rackreg_at1)))then
139            shifts_0:= cassign(syncro=CAST("1. ") ,
140                seed_at1,
141                shiftreg_at1);
142 masks_0 :=CAST ("00000000. ") ;
143 xbits_0:=
(CAST(0,0,SHR(shifts_0,4)))xor(CAST(0,0,SHR(shifts_0,5)));
144
shifts_1:=((CAST(15,0,xbits_0))and(CAST("0000000000000001."
)))
    or((SHL(shifts_0,1))and(CAST("0000000001111111. ") ) )
;
145 masks_1 :=(SHL(masks_0,1))or((CAST(7,0,xbits_0))and
    (CAST("00000001. ") ) ) ;
146 xbits_1:=
(CAST(0,0,SHR(shifts_1,4)))xor(CAST(0,0,SHR(shifts_1,5)));
```

322

```
    147
    shifts_2:=((CAST(15,0,xbits_1))and(CAST("0000000000000001."
    )))
        or((SHL(shifts_1,1))and(CAST("0000000001111111. " ) ) )
    ;
    148 masks_2 SHL(masks_1,1))or((CAST(7,0,xbits_1))and
        (CAST("00000001. " ) ) ) ;
    149                                                 xbits_2:=
    (CAST(0,0,SHR(shifts_2,4)))xor(CAST(0,0,SHR(shifts_2,5)));
10  150
    shifts_3:=((CAST(15,0,xbits_2))and(CAST("0000000000000001."
    )))
        or((SHL(shifts_2,1))and(CAST("0000000001111111. " ) ) )
    ;
15  151 masks_3 SHL(masks_2,1))or((CAST(7,0,xbits_2))and
        (CAST("00000001. " ) ) ) ;
    152                                                 xbits_3:=
    (CAST(0,0,SHR(shifts_3,4)))xor(CAST(0,0,SHR(shifts_3,5)));
    153
    shifts_4:=((CAST(15,0,xbits_3))and(CAST("0000000000000001."
    )))
        or((SHL(shifts_3,1))and(CAST("0000000001111111. " ) ) )
    ;
    154 masks_4 := SHL(masks_3,1))or((CAST(7,0,xbits_3))and
25      (CAST("00000001. " ) ) ) ;
    155                                                 xbits_4:=
    (CAST(0,0,SHR(shifts_4,4)))xor(CAST(0,0,SHR(shifts_4,5)));
    156
    shifts_5:=((CAST(15,0,xbits_4))and(CAST("0000000000000001."
30  )))
        or((SHL(shifts_4,1))and(CAST("0000000001111111. " ) ) )
    ;
```

323

```
157 masks_5 := SHL(masks_4,1))or((CAST(7,0,xbits_4))and
    (CAST("00000001. ") ) );
158                                              xbits_5:=
(CAST(0,0,SHR(shifts_5,4)))xor(CAST(0,0,SHR(shifts_5,5)));
159
shifts_6:=((CAST(15,0,xbits_5))and(CAST("0000000000000001."
)))
    or((SHL(shifts_5,1))and(CAST("0000000001111111. ") ) )
;
160 masks_6 := SHL(masks_5,1))or((CAST(7,0,xbits_5))and
    (CAST("00000001. ") ) );
161                                              xbits_6:=
(CAST(0,0,SHR(shifts_6,4)))xor(CAST(0,0,SHR(shifts_6,5)));
162
shifts_7:=((CAST(15,0,xbits_6))and(CAST("0000000000000001."
)))
    or((SHL(shifts_6,1))and(CAST("0000000001111111. ") ) )
;
163 masks_7 := SHL(masks_6,1))or((CAST(7,0,xbits_6))and
    (CAST("00000001. ") ) );
164                                              xbits_7:=
(CAST(0,0,SHR(shifts_7,4)))xor(CAST(0,0,SHR(shifts_7,5)));
165
shifts_8:=((CAST(15,0,xbits_7))and(CAST("0000000000000001."
)))
    or((SHL(shifts_7,1))and(CAST("0000000001111111. ") ) )
;
166 masks_8 := SHL(masks_7,1))or((CAST(7,0,xbits_7))and
    (CAST("00000001. ") ) );
167         shiftreg<= shifts_8;
168         mask := masks_8;
169         byte_out<= cassign(bypass_at1=CAST("1. ") ,
```

324

```
170            byte_in,
171            (byte_in)xor(mask));
172        sync_out<=CAST ("1. " ) ;
173        h3rackreg<= h3rack;
174        h3rreq<= CAST("0 . " ) ;
175        next_state<= phase2;
176      end if;
177
178      if (not (ToBool(h3rackreg_at1)))then
179        h3rreq<= CAST("1 . " ) ;
180        h3rackreg<= h3rack;
181        next_state<= phase1;
182      end if;
183
184
185    when phase2=>
186
187      h3rackreg<= h3rack;
188      sync_out<= CAST("0 . " ) ;
189      h3rreq <= CAST("1 . " ) ;
190      next_state<= phase1;
191
192
193    when inireg_derand=>
194
195      seed <= CAST ("0000000000000000. " ) ;
196      shiftreg<= CAST("0000000000000000. " ) ;
197      bypass <= CAST("0 . " ) ;
198      byte_out<= CAST("00000000. " ) ;
199      sync_out<= CAST("0 . " ) ;
200      next_state<= rst;
201
```

```
202
203         when others=>
204            next_state<= current_state;
205      end case;
206
207      if(reset = '1' )then
208        next_state<= inireg_derand;
209        seed <= CAST ("0000000000000000. " ) ;
210        shiftreg <= CAST(" 0000000000000000. " ) ;
211        bypass <= CAST ("0. " ) ;
212        h3rackreg<= CAST("0 . " ) ;
213        byte_out<= CAST(" 00000000. " ) ;
214        sync_out<= CAST("0 . " ) ;
215      end if;
216
217
218   end process;
219
220  end RTL;
```

6.16   vhdl/derand_proc_STD.vhd

```
1-------------------------------------------------------
2 --OCAPI - alpha release- generatedThu Jun 11 14:57:23 1998
3 - includes sfg
4 -- derandrstphase10
5 -- derandphase1phase20
6 -- derandphase1phase11
7 -- derandphase2phase10
8 -- derandinireg_derandrst0
```

326

```
 9------------------------------------------------
 -                             '
10
11 library IEEE;
12 use IEEE.std_logic_1164.all;
13 use IEEE.std_logic.arith.all;
14 library FXT_PNT_LIB;
15 use FXT_PNT_LIB.pck_fixed_point.all;
16
17 entity derand is
18   port(
19                    clk : in std_logic;
20                    reset: in std_logic;
21                    h3rack : in std_logic;
22                    syncro: in std_logic;
23                        byte_in: in std_logic_vector(7 downto 0);
24                    h3rreq: out std_logic;
25                    h3rackreg: out std_logic;
26                        byte_out:out std_logic_vector(7 downto 0);
27                    sync_out:out std_logic
28   ) ;
29 end derand;
30
31 architecture structure of derand is
32
33    component derand_proc
34      port(
35        clk : in std_logic;
36        reset: in std_logic;
37        h3rack : in FX (0 downto 0);
```

```
38      syncro  : in FX (0 downto 0);
39      byte_in : in FX (7 downto 0);
40      h3rreq  : out FX (0 downto 0);
41      h3rackreg_reg:outFX (0 downto 0);
42      byte_out_reg:outFX(7 downto 0);
43      sync_out_reg:outFX(0 downto 0)
44    ) ;
45  endcomponent;
46
47  signal FX_h3rack  : FX( 0 downto 0);
48  signal FX_syncro  : FX( 0 downto 0);
49  signal FX_byte_in : FX(7 downto 0);
50  signal FX_h3rreq  : FX( 0 downto 0);
51  signal FX_h3rackreg :FX (0 downto 0);
52  signal FX_byte_out :FX (7 downto 0);
53  signal FX_sync_out :FX (0 downto 0);
54
55  begin
56
57    FX_h3rack(0) <=h3rack;
58    FX_syncro(0) <=syncro;
59    FX_byte_in<= FX(SIGNED(byte_in));
60    h3rreq<= FX_h3rreq(0);
61    h3rackreg<= FX_h3rackreg(0);
62    byte_out<=CONV_STD_LOGIC_VECTOR
            (ToSigned(FX_byte_out),byte_out'length);
63    sync_out<=FX_sync_out(0);
64
65    derand: derand_proc
66      port map (
67        clk   => clk,
68        reset => reset,
```

```
69        h3rack => FX_h3rack,
70        syncro => FX_syncro,
71        byte_in=> FX_byte_in,
72        h3rreq => FX_h3rreq,
73        h3rackreg_reg=> FX_h3rackreg,
74        byte_out_reg=>FX_byte_out,
75        sync_out_reg=>FX_sync_out
76   ) ;
77
78
79   end structure;
```

6.17   vhdl/derand_tb.vhd

```
1-------------------------------------------------------------
2 --OCAPI-alpha release-generated Fri Jun 12 16:45:45 1998
3-------------------------------------------------------------
4
5 -- TestBench for design derand
6
7 library IEEE;
8 use IEEE.std_logic_1164.all;
9
10 use IEEE.std_logic_textio.all;
11 use std.textio.all;
12
13 library clock;
14 use clock.clock.all;
15
16 entity derand_tb is
```

```
17  end derand_tb;
18                                          '
19  architecture rtl of derand_tb is
20
21      signal              reset : std_logic;
22      signal              clk : std_logic;
23      signal              h3rack : std_logic;
24      signal                  byte_in : std_logic_vector(7 downto 0);
25      signal              syncro : std_logic;
26      signal              h3rreq : std_logic;
27      signal              h3rackreg : std_logic;
28      signal                  byte_out : std_logic_vector(7 downto 0);
29      signal              sync_out: std_logic;
30
31      component derand
32          port (
33                              reset: in std_logic;
34                              clk: in std_logic;
35                              h3rack: in std_logic;
36                              byte_in: in std_logic_vector(7 downto 0);
37                              syncro: in std_logic;
38                              h3rreq: out std_logic;
39                              byte_out: out std_logic_vector(7 downto 0);
40                              sync_out: out std_logic
41          ) ;
42      end component;
43
44
```

```
45  begin
46
47      crystal(clk,50 ns);
48
49      derand_dut: derand
50          port map (
51                                                              reset=> reset,
52                                                              clk=> clk,
53                                                              h3rack=> h3rack,
54                                                              byte_in=> byte_in,
55                                                              syncro=> syncro,
56                                                              h3rreq=> h3rreq,
57                                                              byte_out=> byte_out,
58                                                              sync_out=> sync_out ) ;
59      ini:process
60          begin
61              reset<= '1' ;
62              wait until clk'event and clk = '1' ;
63              reset<= '0' ;
64              wait;
65          end process;
66
67      input:process
68          file stimuli: text is in "derand_tb.dat";
```

```
69      variable aline : line;
70
71      file stimulo: text is out "derand_tb.sim_out";
72      variable oline : line;
73
74      variable        v_h3rack: std_logic;
75        variable          v_byte_in: std_logic_vector(7 downto 0);
76      variable        v_syncro: std_logic;
77      variable        v_h3rreq: std_logic;
78        variable          v_byte_out: std_logic_vector(7 downto 0);
79      variable        v_sync_out: std_logic;
80      variable        v_h3rack_hx: std_logic;
81        variable          v_byte_in_hx: std_logic_vector(7 downto 0);
82      variable        v_syncro_hx: std_logic;
83      variable        v_h3rreq_hx: std_logic;
84        variable          v_byte_out_hx: std_logic_vector(7 downto 0);
85      variable        v_sync_out_hx: std_logic;
86
87      begin
88        wait until reset'event and reset = '0' ;
89        loop
90          if (not(endfile(stimuli))) then
91            readline(stimuli, aline);
92            read(aline,                     v_h3rack);
93            read(aline,                     v_byte_in);
94            read(aline,                     v_syncro);
95          else
96            assert false
```

332

```
 97         report "End of inputfile reached"
 98         severity warning;
 99       end if;
100
101       h3rack <= v_h3rack;
102       byte_in<= v_byte_in;
103       syncro <= v_syncro;
104
105       wait for 50 ns;
106
107       v_h3rreq:= h3rreq;
108       v_byte_out:=byte_out;
109       v_sync_out:=sync_out;
110
111       v_h3rack_hx:=v_h3rack;
112       v_byte_in_hx:=v_byte;_in
113       v_syncro_hx:=v_syncro;
114       v_h3rreq_hx:=v_h3rreq;
115       v_byte_out_hx:=v_byte_out;
116       v_sync_out_hx:=v_sync_out;
117
118       write(oline, v_h3rack_hx);
119       write(oline,   ' ' );
120       hwrite(oline, v_byte_in)_hx;
121       write(oline,   ' ' );
122       write(oline, v_syncro_hx);
123       write(oline,   ' ' );
124       write(oline, v_h3rreq_hx);
125       write(oline,   ' ' );
126       hwrite(oline, v_byte_out)_hx;
127       write(oline,   ' ' );
128       write(oline, v_sync_out)_hx;
```

333

```
129        write(oline, ' ') ;
130                              '
131        writeline(stimulo, oline);
132
133        wait until clk'event and clk = '1' ;
134
135      end loop;
136    end process;
137  end rtl;
138
139 configuration tbc_rtl of derand_tb is
140   for rtl
141     for all : derand
142       use entity work.derand(structure);
143     end for;
144   end for;
145 end tbc_rtl;
```

What is claimed is:

1. A design apparatus compiled on a computer environment for generating from a behavioral description of a system comprising at least one digital system part, an implementable description for said system, said behavioral description being represented on said computer environment as a first set of objects with a first set of relations therebetween, said implementable description being represented on said computer environment as a second set of objects with a second set of relations therebetween, said first and second set of objects being part of a design environment, and wherein said first and second set of objects are part of a single design environment.

2. The design apparatus of claim 1 wherein said first and second set of objects are part of a single design environment.

3. The design apparatus of claim 1, wherein said design environment comprises an Object Oriented Programming Language.

4. The design apparatus of claim 3, wherein said Object Oriented Programming Language is C++.

5. The design apparatus of claim 1, wherein said design environment is an open environment wherein new objects can be created.

6. The design apparatus of claim 1, wherein at least part of the input signals and output signals of said first set of objects are at least part of the input signals and output signals of said second set of objects.

7. The design apparatus of claim 1, wherein at least part of the input signals and output signals of said behavioral description are at least part of the input signals and output signals of said implementable description.

8. The design apparatus of claim 1, wherein said first set of objects has first semantics and said second set of objects has second semantics.

9. The design apparatus of claim 8, wherein said first semantics is a data-vector model and/or a data-flow model.

10. The design apparatus of claim 1, wherein the behavioral description includes a structure-free description.

11. A hardware circuit or a software simulation of a hardware circuit designed with the design apparatus of claim 1.

12. A design apparatus compiled on a computer environment for generating from a behavioral description of a system comprising at least one digital system part, an implementable description for said system, said behavioral description being represented on said computer environment as a first set of objects with a first set of relations therebetween, said implementable description being represented on said computer environment as a second set of objects with a second set of relations therebetween, said first and second set of objects being part of a design environment, wherein said first and second set of objects are part of a single design environment, wherein said first set of objects has first semantics and said second set of objects has second semantics, and wherein said second semantics is a signal flow graph (SFG) data structure.

13. The design apparatus of claim 12, wherein the impact in said implementable description of at least a part of the objects of said second set of objects is essentially the same as the impact in said behavioral description of at least a part of the objects of said first set of objects.

14. The design apparatus of claim 12, further comprising means for simulating the behavior of said system, said means simulating the behavior of said behavioral description, said implementable description or any intermediate description therebetween.

15. The design apparatus of claim 12, wherein at least part of said second set of objects is derived from objects belonging to said first set of objects.

16. The design apparatus of claim 12, wherein said implementable description is at least partly obtained by refining said behavioral description.

17. The design apparatus of claim 12, wherein said implementable description is an architecture description of said system.

18. The design apparatus of claim 17, further comprising means for translating said architecture description into a synthesizable description of said system, said synthesizable description being directly implementable in hardware.

19. The design apparatus of claim 18, wherein said hardware is a semiconductor chip.

20. The design apparatus of claim 12, further comprising means to derive said first set of objects from a vector description describing said system as a set of operations on data vectors.

21. The design apparatus of claim 20, wherein said vector description is a MATLAB description.

22. The design apparatus of claim 12, further comprising means for simulating statically or demand-driven scheduled dataflow on said dataflow description.

23. The design apparatus of claim 12, further comprising means for clock-cycle true simulating said digital system using said dataflow description and/or one or more of said SFG data structures using an expectation-based simulation.

24. The design apparatus of claim 12, wherein the behavioral description includes a structure-free description.

25. A method of designing a system comprising at least one digital part, comprising refining, wherein a behavioral description of said system is transformed into an implementable description of said system, said behavioral description being represented as a first set of objects with a first set of relations therebetween and said implementable description being represented as a second set of objects with a second set of relations therebetween, and wherein said refining comprises translating behavioral characteristics at least partly into structural characteristics.

26. The method of claim 25, wherein the behavioral description includes a structure-free description.

27. The method of claim 25, further comprising simulating in which the behavior of said behavioral description, said implementable description and/or any intermediate description therebetween is simulated.

28. The method of claim 25, wherein said refining comprises the addition of new objects, permitting interaction with existing objects, and adjustments to said existing objects allowing said interaction.

29. The method of claim 25, wherein said refining is performed in an open environment and comprises expansion of existing objects.

30. The method of claim 25, wherein said refining comprises first refining, said first refining comprising:

determining the input vector lengths of input, output and intermediate signals;

determining the amount of parallelism of operations that process input signals to output signals;

determining actors, edges and tokens of said data-flow model; and determining the wordlength of said tokens.

31. The method of claim 25, wherein said second set of objects with said second set of relations therebetween are at least partly derived from said first set of objects with said first set of relations therebetween.

32. The method of claim 25, wherein objects belonging to said second set of objects are new objects, identical with and/or derived by inheritance from objects from said first set of objects, or a combination thereof.

33. The method of claim 25, further comprising combining several SFG models with a finite state machine description resulting in an implementable description.

34. The method of claim 33, further comprising transforming said implementable description to synthesizable code.

35. The method of claim 34, wherein said synthesizable code is VHDL code.

36. A hardware circuit or a software simulation of a hardware circuit designed with the method of claim 25.

37. A method of simulating a system, wherein a description of a system is transformed into compilable C++ code, wherein said description is an SFG data structure and said compilable C++ code is used to perform clock cycle true simulations.

38. A method of simulating a system, wherein a description of a system is transformed into compilable C++ code, wherein the description includes a structure-free description.

39. A design apparatus compiled on a computer environment for generating from a behavioral description of a system comprising at least one digital system part, an implementable description for said system, said behavioral description being represented on said computer environment as a first set of objects with a first set of relations therebetween, said implementable description being represented on said computer environment as a second set of objects with a second set of relations therebetween, said first and second set of objects being part of a design environment, wherein said first set of objects has first semantics and said second set of objects has second semantics, and wherein said first semantics is a data-vector model and/or a data-flow model, wherein means for clock-cycle true simulating said digital system using said dataflow description and/or one or more of said SFG data structures using an expectation-based simulation.

40. A method of designing a system comprising at least one digital part, comprising refining, wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises first refining wherein said behavioral description is a data-vector model and is at least partly transformed into a data-flow model, and wherein said data-flow model is an untimed floating point data-flow model.

41. The method of claim 40, wherein said refining further comprises second refining wherein said data-flow model is at least partly transformed into an SFG model.

42. The method of claim 40, wherein said second set of objects with said second set of relations therebetween are at least partly derived from said first set of objects with said first set of relations therebetween.

43. The method of claim 40, wherein objects belonging to said second set of objects are new objects, identical with and/or derived by inheritance from objects from said first set of objects, or a combination thereof.

44. A method of designing a system comprising at least one digital part, comprising refining wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises:

determining the input vector lengths of input, output and intermediate signals;

determining the amount of parallelism of operations that process input signals to output signals;

determining actors, edges and tokens of said data-flow model; and determining the wordlength of said tokens.

45. A method of designing a system comprising at least one digital part, comprising:

refining, wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises first refining, wherein said behavioral description is a data-vector model and is at least partly transformed into a data-flow model, wherein said refining further comprises second refining, wherein said data-flow model is at least partly transformed into an SFG model, and wherein said SFG model is a timed fixed point SFG model.

46. The method of claim 45, wherein said second set of objects with said second set of relations therebetween are at least partly derived from said first set of objects with said first set of relations therebetween.

47. The method of claim 45, wherein objects belonging to said second set of objects are new objects, identical with and/or derived by inheritance from objects from said first set of objects, or a combination thereof.

48. A method of designing a system comprising at least one digital part, comprising:

refining, wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises first refining wherein said behavioral description is a data-vector model and is at least partly transformed into a data-flow model, wherein said refining further comprises second refining wherein said data-flow model is at least partly transformed into an SFG model, and combining several of said SFG models with a finite state machine description resulting in an implementable description.

49. The method of claim 48, further comprising the step of transforming said implementable description to synthesizable code.

50. The method of claim 48, wherein said synthesizable code is VHDL code.

51. A method of simulating a system, wherein a description of a system is transformed into compilable C++ code, wherein said description comprises the combination of several SFG data structures with a finite state machine description resulting in an implementable description, said implementable description being said compilable C++ code suitable for simulating said system as software.

52. A method of simulating a system, wherein a description of a system is transformed into compilable C++ code, wherein said simulating comprises a clock-cycle true simulation of said system being an expectation-based simulation using one or more SFG data structures, said expectation-based simulation comprising:
   annotating a token age to every token;
   annotating a queue age to every queue;
   increasing token age according to the token aging rules and with the travel delay for every queue that has transported the token;
   increasing queue age with the iteration time of the actor steering the queue; and
   checking whether token age is never smaller than queue age throughout the simulation.

* * * * *